(12) United States Patent
Shishido et al.

(10) Patent No.: US 9,482,919 B2
(45) Date of Patent: Nov. 1, 2016

(54) DISPLAY DEVICE AND ELECTRONIC DEVICE WITH IMPROVED DRIVER CIRCUIT

(71) Applicant: Semiconductor Energy Laboratory Co., Ltd., Atsugi-shi, Kanagawa-ken (JP)

(72) Inventors: Hideaki Shishido, Atsugi (JP); Hiroyuki Miyake, Atsugi (JP); Seiko Inoue, Isehara (JP); Kouhei Toyotaka, Atsugi (JP); Koji Kusunoki, Kawasaki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/184,996

(22) Filed: Feb. 20, 2014

(65) Prior Publication Data

US 2014/0240631 A1 Aug. 28, 2014

(30) Foreign Application Priority Data

Feb. 25, 2013 (JP) ................................. 2013-034877
Jul. 25, 2013 (JP) ................................. 2013-154400

(51) Int. Cl.
*G02F 1/1362* (2006.01)
*H01L 29/66* (2006.01)
*H01L 27/12* (2006.01)

(52) U.S. Cl.
CPC ... *G02F 1/136286* (2013.01); *G02F 1/136204* (2013.01); *H01L 27/124* (2013.01); *H01L 27/1225* (2013.01); *H01L 29/66* (2013.01)

(58) Field of Classification Search
CPC ............................................. G02F 1/136286
USPC ........................................................ 349/50, 43
See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

CN  001908788 A  2/2007
CN  102097059 A  6/2011
(Continued)

OTHER PUBLICATIONS

International Search Report (Application No. PCT/JP2014/054785) Dated Jun. 10, 2014.
(Continued)

*Primary Examiner* — John P Dulka
*Assistant Examiner* — Charles R Peters
(74) *Attorney, Agent, or Firm* — Robinson Intellectual Property Law Office; Eric J. Robinson

(57) ABSTRACT

Transistors each include a gate electrode, a gate insulating layer over the gate electrode, an oxide semiconductor layer over the gate insulating layer, and a source electrode and a drain electrode over the oxide semiconductor layer. A driver circuit portion includes first to third wirings formed in the same step as the gate electrode, fourth to sixth wirings formed in the same step as the source electrode and the drain electrode, a seventh wiring formed in the same step as a pixel electrode, a first region where the second wiring intersects with the fifth wiring, and a second region where the third wiring intersects with the sixth wiring. The first wiring is connected to the fourth wiring through the seventh wiring. A distance between the wirings in the second region is longer than that in the first region.

24 Claims, 35 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,067,845 B2 | 6/2006 | Murakami et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,314,774 B2 | 1/2008 | Murakami et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,079 B2 | 9/2010 | Murakami et al. |
| 8,143,627 B2 | 3/2012 | Murakami et al. |
| 8,228,585 B2 | 7/2012 | Sato |
| 8,334,540 B2 | 12/2012 | Yamazaki et al. |
| 8,334,959 B2 | 12/2012 | Hirabayashi et al. |
| 8,344,374 B2 | 1/2013 | Yamazaki et al. |
| 8,368,066 B2 | 2/2013 | Yamazaki et al. |
| 8,384,080 B2 | 2/2013 | Taniguchi et al. |
| 8,389,988 B2 | 3/2013 | Yamazaki et al. |
| 8,421,068 B2 | 4/2013 | Yamazaki et al. |
| 8,421,069 B2 | 4/2013 | Yamazaki et al. |
| 8,471,256 B2 | 6/2013 | Yamazaki et al. |
| 8,536,571 B2 | 9/2013 | Yamazaki |
| 8,536,581 B2 | 9/2013 | Murakami et al. |
| 8,711,464 B2 | 4/2014 | Ishida |
| 8,728,883 B2 | 5/2014 | Yamazaki et al. |
| 8,963,161 B2 | 2/2015 | Murakami et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1* | 3/2003 | Kawasaki et al. ............ 257/350 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0030434 A1 | 2/2007 | Hirabayashi et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197348 A1* | 8/2008 | Matsubara et al. ............ 257/40 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072470 A1 | 3/2010 | Yamazaki et al. |
| 2010/0072471 A1 | 3/2010 | Yamazaki et al. |
| 2010/0092800 A1 | 4/2010 | Itagaki et al. |
| 2010/0109002 A1 | 5/2010 | Itagaki et al. |
| 2011/0084268 A1 | 4/2011 | Yamazaki et al. |
| 2011/0127524 A1* | 6/2011 | Yamazaki et al. ............ 257/43 |
| 2011/0141550 A1 | 6/2011 | Ishida |
| 2011/0151618 A1* | 6/2011 | Yamazaki et al. ........... 438/104 |
| 2011/0188111 A1 | 8/2011 | Sato |
| 2011/0240991 A1 | 10/2011 | Yamazaki |
| 2012/0061663 A1 | 3/2012 | Yamazaki et al. |
| 2012/0064664 A1 | 3/2012 | Yamazaki et al. |
| 2012/0064665 A1 | 3/2012 | Yamazaki |
| 2012/0119205 A1 | 5/2012 | Taniguchi et al. |
| 2012/0175610 A1 | 7/2012 | Yamazaki |
| 2012/0181556 A1 | 7/2012 | Tajima |
| 2013/0113044 A1 | 5/2013 | Yamazaki et al. |
| 2013/0299820 A1 | 11/2013 | Miyamoto et al. |
| 2014/0080253 A1 | 3/2014 | Yamazaki |
| 2014/0235015 A1 | 8/2014 | Yamazaki et al. |
| 2014/0239298 A1 | 8/2014 | Yamazaki et al. |

FOREIGN PATENT DOCUMENTS

| | | |
|---|---|---|
| CN | 102163608 A | 8/2011 |
| CN | 102593186 A | 7/2012 |
| CN | 102598278 A | 7/2012 |
| EP | 1737044 A | 12/2006 |
| EP | 2226847 A | 9/2010 |
| EP | 2477171 A | 7/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| | | |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-065615 A | 3/2007 |
| JP | 2010-049149 A | 3/2010 |
| JP | 2010-092036 A | 4/2010 |
| JP | 2010-092037 A | 4/2010 |
| JP | 2010-097203 A | 4/2010 |
| JP | 2010-097204 A | 4/2010 |
| JP | 2010-107976 A | 5/2010 |
| JP | 2010-107977 A | 5/2010 |
| JP | 2010-113346 A | 5/2010 |
| JP | 2011-100995 A | 5/2011 |
| JP | 2011-123283 A | 6/2011 |
| JP | 2011-164139 A | 8/2011 |
| JP | 2012-160719 A | 8/2012 |
| JP | 2013-009003 A | 1/2013 |
| JP | 5192080 | 5/2013 |
| KR | 2012-0090784 A | 8/2012 |
| KR | 2012-0093864 A | 8/2012 |
| TW | I361945 | 4/2012 |
| TW | 201234483 | 8/2012 |
| WO | WO-2004/114391 | 12/2004 |
| WO | WO-2011/030584 | 3/2011 |
| WO | WO-2011/043195 | 4/2011 |

OTHER PUBLICATIONS

Written Opinion (Application No. PCT/JP2014/054785) Dated Jun. 10, 2014.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al,, "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07: SID International Sympsoium Digest of Technical Papers, 2007, vol. 38, pp. 1830-1833.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09: SID Interntaional Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID Interntaional Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and

(56) References Cited

OTHER PUBLICATIONS its Bending Properties", SID Digest '09 : SID Interntaional Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):A Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp, 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

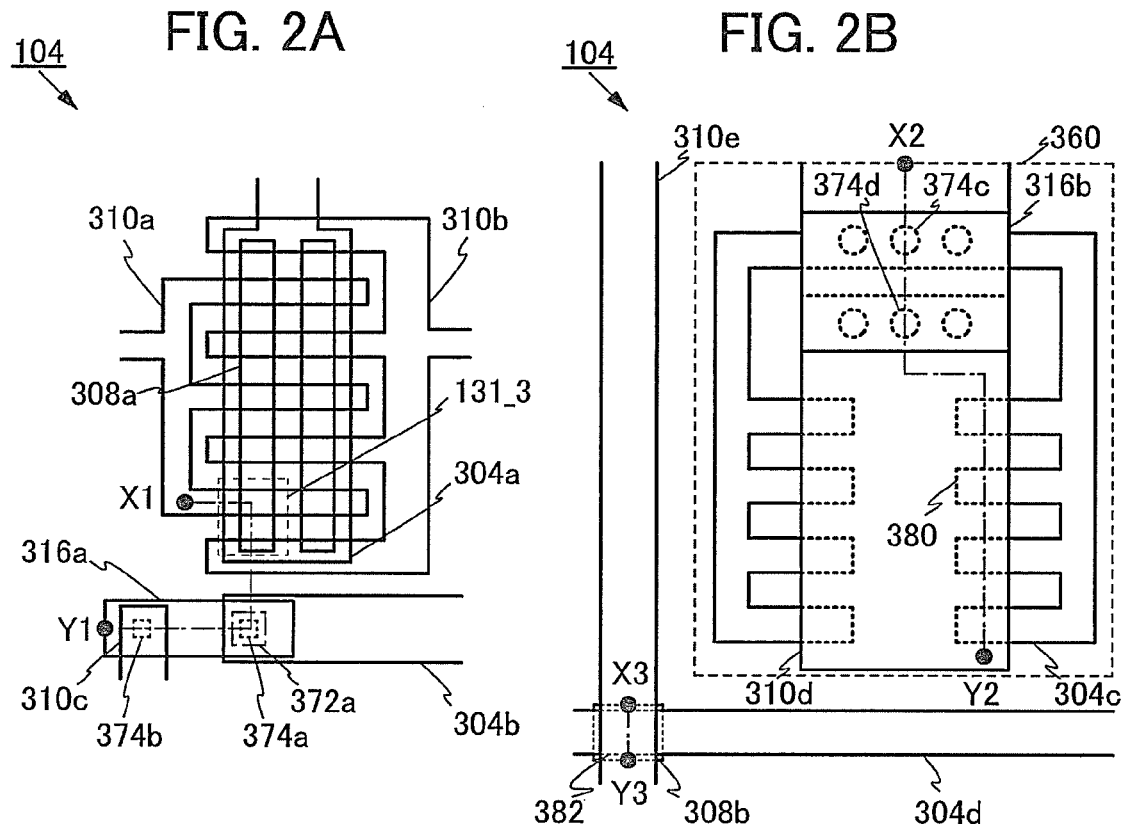
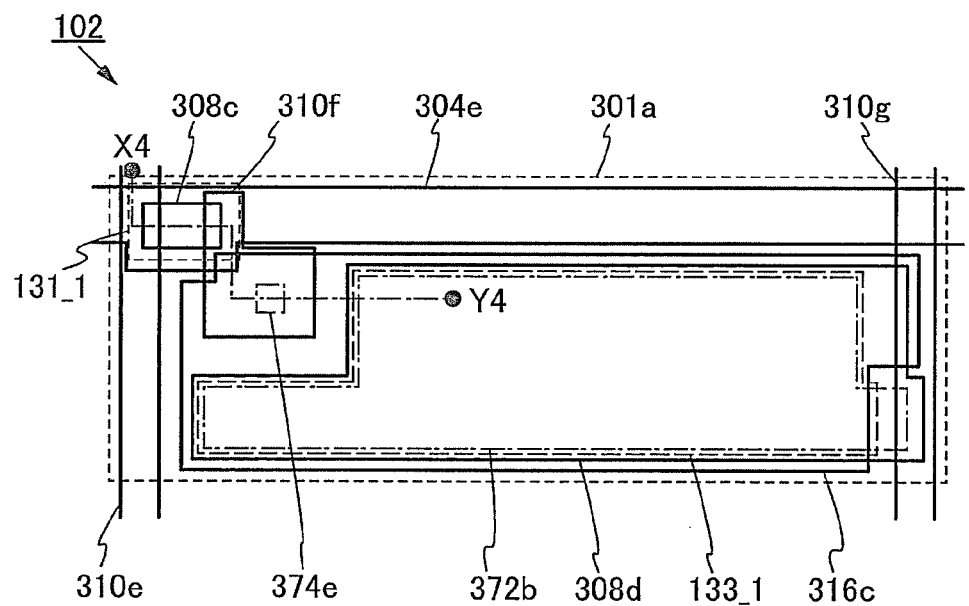

X1　　　308a　　　Y1

X2　　　　　　　　　Y2 X3　308b　Y3

X4　　308c　　　　308d　　　Y4

X1  315  Y1

X2  315  Y2 X3  Y3

X4  315  Y4

X1 — Y1
316a

X2  316b  Y2 X3  Y3

X4 — Y4
316c

CAAC nc

DISPLAY DEVICE AND ELECTRONIC DEVICE WITH IMPROVED DRIVER CIRCUIT

TECHNICAL FIELD

The present invention relates to an object, a method, a method for producing an object, a process, a machine, manufacture, or a composition of matter. In particular, the present invention relates to a semiconductor device, a display device, a light-emitting device, an electronic device, a driving method thereof, or a manufacturing method thereof. In particular, the present invention relates to a semiconductor device, a display device, an electronic device or a light-emitting device each including an oxide semiconductor.

Note that the term "display device" means a device having a display element. Note that the display device can also include, for example, a driver circuit for driving the plurality of pixels in some cases. The display device also includes a control circuit, a power supply circuit, a signal generation circuit, and the like which are arranged on another substrate, in some cases.

BACKGROUND ART

For display devices typified by liquid crystal display devices, elements and wirings have been downsized with recent technological innovation and mass production technology has also been improved greatly. Improvement in manufacturing yield is required to achieve lower cost in the future.

If a surge voltage due to static electricity or the like is applied to a display device, an element is broken to produce abnormal display. Thus, manufacturing yield might be decreased. To overcome that, a protection circuit for releasing a surge voltage to another wiring is provided in a display device (see, Patent Documents 1 to 7, for example).

REFERENCES

Patent Documents

[Patent Document 1] Japanese Published Patent Application No. 2010-92036
[Patent Document 2] Japanese Published Patent Application No. 2010-92037
[Patent Document 3] Japanese Published Patent Application No. 2010-97203
[Patent Document 4] Japanese Published Patent Application No. 2010-97204
[Patent Document 5] Japanese Published Patent Application No. 2010-107976
[Patent Document 6] Japanese Published Patent Application No. 2010-107977
[Patent Document 7] Japanese Published Patent Application No. 2010-113346

DISCLOSURE OF INVENTION

A structure aiming at improvement in reliability is important for display devices, like a protection circuit.

The protection circuit is formed in a manufacturing process of a display device, i.e., in a manufacturing process of a transistor used for the display device. Hence, the transistor during the manufacturing process is not connected to the protection circuit. That is, the transistor during the manufacturing process and a wiring and the like connected to the transistor are highly likely to be broken by static electricity or overcurrent which can be generated in the manufacturing process of the transistor.

Thus, there is a problem in that the manufacturing yield of display devices is very low when the display devices are manufactured in the state in which transistors and wirings and the like connected to the transistors are highly likely to be broken by static electricity or overcurrent which can be generated in a manufacturing process of the transistors.

It is an object of one embodiment of the present invention to provide a display device having a novel structure that can reduce electrostatic breakdowns. It is another object of one embodiment of the present invention to provide a display device having a novel structure that can improve reliability. It is another object of one embodiment of the present invention to provide a display device having a novel structure that can reduce adverse effects of static electricity. It is another object of one embodiment of the present invention to provide a display device having a novel structure that can reduce adverse effects of a trouble when a touch sensor is used. It is another object of one embodiment of the present invention to provide a display device having a novel structure that can reduce fluctuation or deterioration of transistor characteristics. It is another object of one embodiment of the present invention to provide a display device having a novel structure that can reduce fluctuation in a threshold voltage or deterioration of a transistor. It is another object of one embodiment of the present invention to provide a display device having a novel structure that can inhibit normally-on of a transistor. It is another object of one embodiment of the present invention to provide a display device having a novel structure that can increase manufacturing yield of transistors. It is another object of one embodiment of the present invention to provide a display device having a novel structure that can discharge electric charges accumulated in a pixel electrode. It is another object of one embodiment of the present invention to provide a display device having a novel structure that can discharge electric charges accumulated in a wiring. It is another object of one embodiment of the present invention to provide a display device having a novel structure that enables normal display.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

Means for Solving the Problems

One embodiment of the present invention is a display device including a pixel portion and a driver circuit portion provided outside the pixel portion. In the display device, the pixel portion includes pixel electrodes arranged in a matrix and transistors electrically connected to the pixel electrodes, and the transistors each include a gate electrode, a gate insulating layer over the gate electrode, an oxide semiconductor layer over the gate insulating layer, and a source electrode and a drain electrode over the oxide semiconductor layer. In the display device, the driver circuit portion includes first to third wirings formed in the same step as the gate electrode, fourth to sixth wirings formed in the same step as the source electrode and the drain electrode, a seventh wiring formed in the same step as the pixel electrode, a first region in which the second wiring intersects with the fifth wiring, and a second region in which the third wiring intersects with the sixth wiring. The first wiring and the fourth wiring are connected to each other through the seventh wiring. A distance between the wirings in the second region is longer than a distance between the wirings in the first region.

In one embodiment of the present invention, a display device having a novel structure that can reduce electrostatic breakdowns can be provided.

BRIEF DESCRIPTION OF DRAWINGS

FIGS. 2A to 2C are schematic top views of the display device.

BEST MODE FOR CARRYING OUT THE INVENTION

Figure 1A:
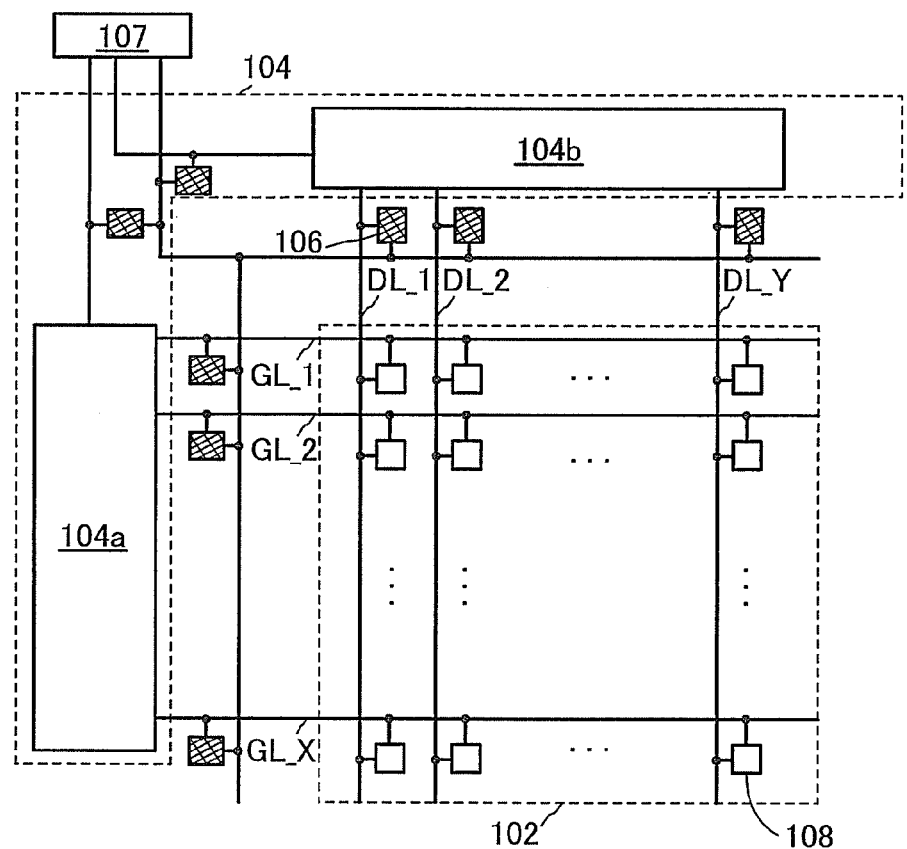
FIGS. 1A to 1C are a schematic top view of a display device and circuit diagrams of a protection circuit.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and the terms do not limit the components numerically.

Note that in this specification, the phrase "A and B are connected" or "A is connected to B" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

Note that the layout of circuit blocks in a block diagram in a drawing specifies the positional relation for description. Thus, even when a drawing shows that different functions are achieved in different circuit blocks, an actual circuit or region may be configured so that the different functions are achieved in the same circuit or region. The functions of circuit blocks in block diagrams are specified for description, and even in the case where one circuit block is illustrated, blocks might be provided in an actual circuit or an actual region so that processing performed by one circuit block is performed by a plurality of circuit blocks.

Note that a pixel corresponds to a display unit that can control the luminance of one color component (e.g., any one of R (red), G (green), and B (blue)). Therefore, in a color display device, the minimum display unit of a color image is composed of three pixels of an R pixel, a G pixel, and a B pixel. Note that the color of the color elements is not necessarily of three varieties and may be of three or more varieties or may include a color other than RGB.

In this specification, embodiments of the present invention will be described with reference to the drawings. Embodiments are described in the following order:
1. Embodiment 1 (Basic structure of display device);
2. Embodiment 2 (Method for manufacturing display device);
3. Embodiment 3 (Modification example of display device);
4. Embodiment 4 (Modification example of electrostatic breakdown region);
5. Embodiment 5 (Structures of pixel portion);
6. Embodiment 6 (Structures of transistor);
7. Embodiment 7 (Touch sensor and display module);
8. Embodiment 8 (Electronic devices);
9. Embodiment 9 (Radiation image detecting device); and
10. Example (breakdown voltage).
(Embodiment 1)

In this embodiment, a display device of one embodiment of the present invention will be described with reference to FIGS. 1A to 1C, FIGS. 2A to 2C, and FIGS. 3A to 3C.

The display device illustrated in FIG. 1A includes a region including pixels of display elements (hereinafter the region is referred to as pixel portion 102), a circuit portion being provided outside the pixel portion 102 and including a circuit for driving the pixels (hereinafter the portion is referred to as driver circuit portion 104), circuits each having a function of protecting an element (hereinafter the circuits are referred to as protection circuits 106), and a terminal portion 107. Note that the protection circuits 106 are not necessarily provided.

A part or the whole of the driver circuit portion 104 is preferably formed over a substrate over which the pixel portion 102 is formed, in which case the number of components and the number of terminals can be reduced. When a part or the whole of the driver circuit portion 104 is not formed over the substrate over which the pixel portion 102 is formed, the part or the whole of the driver circuit portion 104 is often mounted by COG or TAB.

The pixel portion 102 includes circuits for driving a plurality of display elements in X (X is a natural number of 2 or more) rows and Y columns (Y is a natural number of 2 or more) (hereinafter, such circuits are referred to as protection circuit portions 108). The driver circuit portion 104 includes a driver circuit such as a circuit for supplying a signal (scan signal) to select a pixel (hereinafter the circuit is referred to as gate driver 104a) and a circuit for supplying a signal (data signal) to drive a display element in a pixel (hereinafter, the circuit is referred to as source driver 104b).

The gate driver 104a includes a shift register or the like. The gate driver 104a receives a signal for driving the shift register and outputs a signal through the terminal portion 107. For example, the gate driver 104a receives a start pulse signal, a clock signal, or the like and outputs a pulse signal. The gate driver 104a has a function of controlling potentials of wirings supplied with scan signals (hereinafter such wirings are referred to as scan lines GL_1 to GL_X). Note that a plurality of gate drivers 104a may be provided to control the scan lines GL_1 to GL_X separately. Alternatively, the gate driver 104a has, but is not limited to, a function of supplying an initialization signal. The gate driver 104a can supply another signal.

The source driver 104b includes a shift register or the like. The source driver 104b receives a signal (video signal) from which a data signal is derived, as well as a signal for driving the shift register, through the terminal portion 107. The source driver 104b has a function of generating a data signal to be written in the pixel circuit portions 108 based on the video signal. In addition, the source driver 104b has a function of controlling output of a data signal in response to a pulse signal produced by input of a start pulse, a clock signal, or the like. Further, the source driver 104b has a function of controlling potentials of wirings supplied with data signals (hereinafter such wirings are referred to as data lines DL_1 to DL_Y). Alternatively, the source driver 104b has, but is not limited to, a function of supplying an initialization signal. The source driver 104b can supply another signal.

The source driver 104b includes a plurality of analog switches or the like, for example. The source driver 104b can output, as the data signals, signals obtained by time-dividing the video signal by sequentially turning on the plurality of analog switches. The source driver 104b may include a shift register or the like.

A pulse signal and a data signal are input to each of the plurality of the pixel circuit portions 108 through one of the plurality of scan lines GL supplied with scan signals and one of the plurality of data lines DL supplied with data signals, respectively. Writing and holding of the data signal in each of the plurality of pixel circuit portions 108 are performed by the gate driver 104a. For example, to the pixel circuit portion 108 in m-th row and n-th column (m is a natural number of less than or equal to X, and n is a natural number of less than or equal to Y), a pulse signal is input from the gate driver 104a through the scan line GL_m, and a data signal is input from the source driver 104b through the data line DL_n depending on the potential of the scan line GL_m.

The protection circuit 106 shown in FIG. 1A is connected to the scan line GL between the gate driver 104a and the pixel circuit portion 108. Alternatively, the protection circuit 106 is connected to the data line DL between the source driver 104b and the pixel circuit portion 108. Alternatively, the protection circuit 106 can be connected to a wiring between the gate driver 104a and the terminal portion 107. Alternatively, the protection circuit 106 can be connected to a wiring between the source driver 104b and the terminal portion 107. Note that the terminal portion 107 means a portion having terminals for inputting power, control signals, and video signals to the display device from external circuits.

The protection circuit 106 is a circuit which electrically connects a wiring connected to the protection circuit to another wiring when a potential out of a certain range is applied to the wiring connected to the protection circuit.

As illustrated in FIG. 1A, the protection circuit 106 is provided for each of the pixel portion 102 and the driver circuit portion 104, so that resistance of the display device to overcurrent generated by electrostatic discharge (ESD) or the like can be improved. Note that the configuration of the protection circuits 106 is not limited to that; for example, a configuration in which the protection circuits 106 are connected to the gate driver 104*a* and are not connected to the source driver 104*b* or a configuration in which the protection circuits 106 are connected to the source driver 104*b* and are not connected to the gate driver 104*a* may be employed. Alternatively, the protection circuit 106 may be configured to be connected to the terminal portion 107.

In the non-limiting example illustrated in FIG. 1A, the driver circuit portion 104 includes the gate driver 104*a* and the source driver 104*b*. For example, only the gate driver 104*a* may be formed and a separately prepared substrate where a source driver circuit is formed (e.g., a driver circuit substrate formed with a single crystal semiconductor film or a polycrystalline semiconductor film) may be mounted.

Thus, it is preferable that the protection circuit 106 be electrically connected to one of or both the pixel portion 102 and the driver circuit portion 104.

Figure 1B:
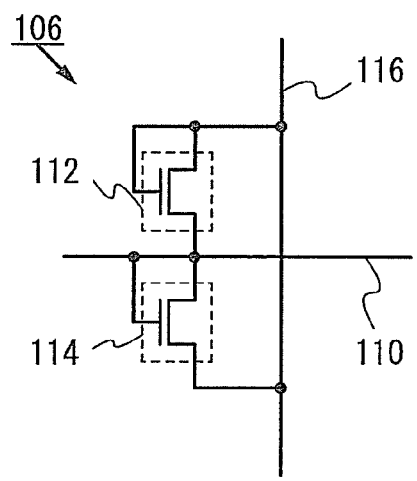
Figure 1C:
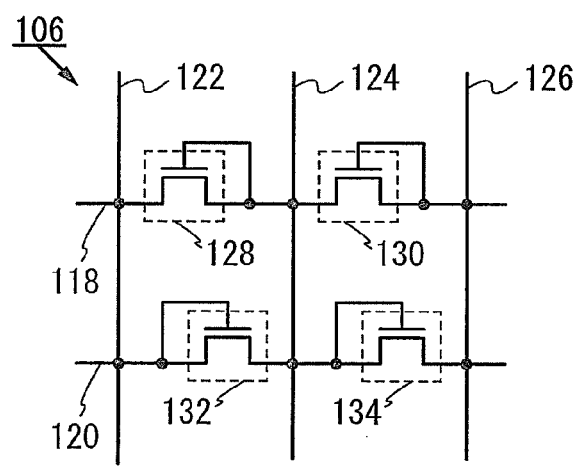

The protection circuit 106 can include a diode-connected transistor or the like, for example. FIGS. 1B and 1C illustrate specific examples of the protection circuit 106.

The protection circuit 106 illustrated in FIG. 1B includes diode-connected transistors 112 and 114 between a wiring 110 and a wiring 116. The wiring 110 is, for example, a lead wiring led out from the scan line GL, the data line DL, or the terminal portion 107 to the driver circuit portion 104 in FIG. 1A. It is particularly preferable that the protection circuit 106 illustrated in FIG. 1B be provided between the pixel portion 102 and the gate driver 104*a*.

The wiring 116 is, for example, a wiring that is supplied with the potential (VDD, VSS, or GND) of a power supply line for supplying power to the gate driver 104*a* illustrated in FIG. 1A. Alternatively, the wiring 116 is a wiring supplied with a common potential (common line). For example, the wiring 116 is preferably connected to the power supply line for supplying power to the gate driver 104*a*, in particular, to a wiring for supplying a low potential. This is because the scan line GL has a low potential in most periods, and thus, when the wiring 116 also has a low potential, current leaked from the scan line GL to the wiring 116 can be reduced in a normal operation.

In the protection circuit 106 illustrated in FIG. 1C, diode-connected transistors 128, 130, 132, and 134 are connected to a wiring 118, a wiring 120, a wiring 122, a wiring 124, and a wiring 126. Each of the wirings 118 and 120 is, for example, a wiring that is supplied with the potential (VDD, VSS, or GND) of a power supply line for supplying power to the source driver 104*b* illustrated in FIG. 1A; a sampling pulse; or the like. The wirings 122, 124, and 126 are, for example, the data lines DL illustrated in FIG. 1A. The protection circuit 106 illustrated in FIG. 1C is preferably provided between the pixel portion 102 and the source driver 104*b*.

By the protection circuit 106 provided in the display device illustrated in FIG. 1A in this manner, the pixel portion 102 and the driver circuit portion 104 can have an enhanced resistance to overcurrent generated by ESD or the like.

Semiconductor layers of the transistors 112, 114, 128, 130, 132, and 134 in the protection circuits 106 illustrated in FIGS. 1B and 1C are preferably formed using an oxide semiconductor. The transistors including an oxide semiconductor hardly cause avalanche breakdown and have higher resistance to an electric field than that of transistors including semiconductor layers formed using silicon or the like. Examples of the structure of the transistors 112, 114, 128, 130, 132, and 134 include a planar structure and an inverted staggered structure. Here, a current flow and an electron flow in the protection circuit are described using a modification example of the protection circuit 106 illustrated in FIG. 1B.

Figure 35A:
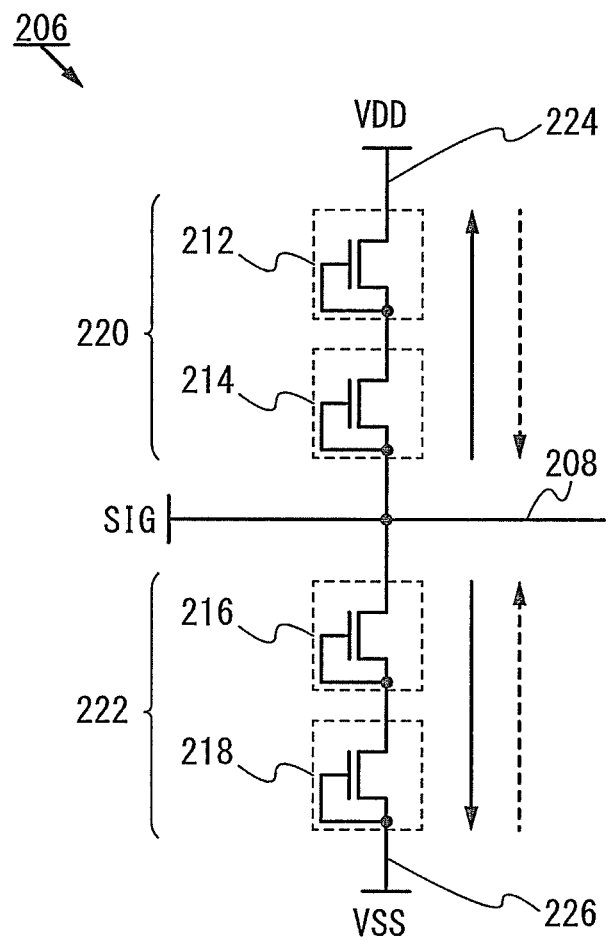
FIG. 35A is a circuit diagram illustrating a protection circuit.

FIG. 35A illustrates the modification example of the protection circuit 106 of FIG. 1B.

A protection circuit 206 illustrated in FIG. 35A includes transistors 212, 214, 216, and 218 and wirings 208, 224, and 226.

One of a source and a drain of the transistor 212 is connected to the wiring 224. The other of the source and the drain of the transistor 212 is connected to one of a source and a drain of the transistor 214. The other of the source and the drain of the transistor 214 is connected to the wiring 208. One of a source and a drain of the transistor 216 is connected to the other of the source and the drain of the transistor 214 and the wiring 208. The other of the source and the drain of the transistor 216 is connected to one of a source and a drain of the transistor 218. The other of the source and the drain of the transistor 218 is connected to the wiring 226.

Each of the transistors 212, 214, 216, and 218 is a transistor whose gate and source (or drain) are connected to each other, i.e., a diode-connected transistor.

The wiring 224 is connected to a wiring supplied with a high power supply potential VDD. The wiring 226 is connected to a wiring supplied with a low power supply potential VSS. The wiring 208 is connected to a wiring supplied with a signal potential SIG.

Further, in FIG. 35A, the transistor 212 and the transistor 214 are collectively referred to as a transistor group 220, and the transistor 216 and the transistor 218 are collectively referred to as a transistor group 222. Note that in FIG. 35A, each of the transistor groups 220 and 222 includes two transistors; however, one embodiment of the present invention is not limited thereto. The number of transistors in each of the transistor groups 220 and 222 may be one or may be three or more.

In the protection circuit 206 illustrated in FIG. 35A, current of the signal potential SIG supplied to the wiring 208 flows toward the high power supply potential VDD or the low power supply potential VSS via the transistor group 220 or the transistor group 222 in the case where given conditions are satisfied. Note that in FIG. 35A, solid arrows each indicate the flow of current toward the high power supply potential VDD and the low power supply potential VSS, and dashed arrows each indicate the flow of electrons toward the high power supply potential VDD and the low power supply potential VSS.

Here, a current flow and an electron flow in the transistor group 220 and the transistor group 222 are described with reference to FIG. 35B.

Figure 35B:
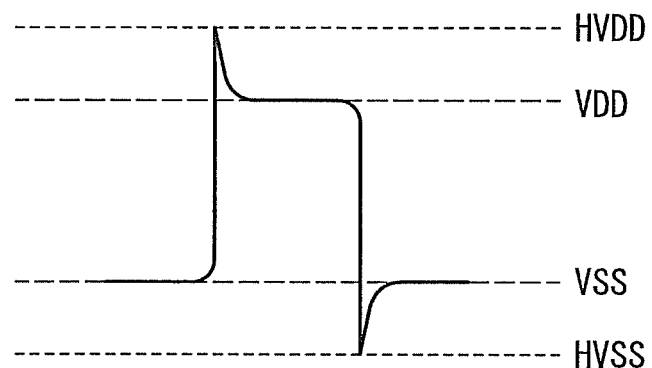
FIG. 35B is a schematic view illustrating a waveform of a signal.

The waveform in FIG. 35B schematically represents the signal potential SIG supplied to the wiring 208. In the signal potential SIG, a ripple may occur at the time when the signal potential SIG rises or falls. There are two kinds of ripples: a ripple on the high power supply potential side and a ripple on the low power supply potential side. In FIG. 35B, the potential of the ripple on the high power supply potential side is represented by HVDD, and the potential of the ripple on the low power supply potential side is represented by HVSS. When the ripple is generated at the time when the signal potential SIG rises, i.e., when the signal potential SIG is higher than the high power supply potential VDD, current flows in the transistor group 220. At this time, electrons flow from the high power supply potential VDD side to the wiring 208 side. Further, when the ripple is generated at the time when the signal potential SIG falls, i.e., when the signal potential SIG is lower than the low power supply potential VSS, current flows in the transistor group 222. At this time, electrons flow from the low power supply potential VSS side to the wiring 208 side.

As described above, by providing the protection circuit 206, overcurrent can be released.

The protection circuits 106 and 206 are formed in a manufacturing process of a transistor included in the display device. Hence, the protection circuits 106 and 206 cannot perform their functions sufficiently in the manufacturing process of a transistor. That is, during the manufacturing process of a transistor, the transistor or a wiring or the like connected to the transistor does not have a resistance high enough to withstand overcurrent due to ESD or the like.

In the process of manufacturing a transistor, overcurrent is likely to occur when a large potential difference is generated between different wirings and the like. For example, when a potential difference is increased between a gate electrode of a transistor or a wiring formed in the same step as the gate electrode and a source and a drain electrodes or a wiring formed in the same step as the source and the drain electrodes, electrostatic breakdown might occur between the gate electrode of the transistor or the wiring formed in the same step as the gate electrode and the source and the drain electrodes or the wiring formed in the same step as the source and the drain electrodes. Electrostatic breakdown is highly likely to occur particularly in a region where the wiring formed in the same step as the gate electrode intersects with the wiring formed in the same step as the source and the drain electrodes or in its adjacent region.

In order to prevent the electrostatic breakdown of a transistor or a wiring or the like connected to the transistor in a manufacturing process of the transistor, a region which is allowed to be broken by static electricity (hereinafter the region is referred to as induced electrostatic breakdown region) is formed in one embodiment of the present invention. Thus, overcurrent which can occur in the manufacturing process of the transistor is released to the induced electrostatic breakdown region. With such a structure, highly reliable display devices can be provided with a high manufacturing yield.

Here, as one example of the display device of FIG. 1A, more specific structures thereof are illustrated in FIGS. 2A to 2C.

FIGS. 2A to 2C each are a top view of an example of the pixel portion 102 or the driver circuit portion 104 of the display device illustrated in FIG. 1A. In this embodiment, a structure of a display device using a liquid crystal element (such a device is also referred to as a liquid crystal display device) is described with reference to FIGS. 2A to 2C.

FIG. 2A is a top view of a part of the driver circuit portion 104. FIG. 2B is a top view of another part of the driver circuit portion 104. FIG. 2C is a top view of the pixel portion 102. In FIGS. 2A to 2C, components such as a gate insulating layer are partly omitted to avoid complexity.

In FIG. 2A, a transistor 131_3 includes a conductive layer 304a serving as a gate electrode, a gate insulating layer (not illustrated in FIG. 2A), a semiconductor layer 308a where a channel region is formed, and conductive layers 310a and 310b serving as a source electrode and a drain electrode. The semiconductor layer 308a is formed over the gate insulating layer. Further, a conductive layer 304b (also referred to as first wiring) formed in the same step as the conductive layer 304a serving as a gate electrode, a conductive layer 310c (also referred to as fourth wiring) formed in the same step as the conductive layers 310a and 310b serving as a source electrode and a drain electrode, and a light-transmitting conductive layer 316a (also referred to as seventh wiring) which connects the conductive layer 304b to the conductive layer 310c are provided. The light-transmitting conductive layer 316a is connected to the conductive layer 304b in opening portions 372a and 374a and is connected to the conductive layer 310c in an opening portion 374b.

In FIG. 2B, an induced electrostatic breakdown region 360 includes a conductive layer 304c (also referred to as second wiring) formed in the same step as the conductive layer 304a serving as a gate electrode, the gate insulating layer (not illustrated in FIG. 2B), a conductive layer 310d (also referred to as fifth wiring) formed in the same step as the conductive layers 310a and 310b serving as a source electrode and a drain electrode, and a conductive layer 316b formed in the same step as the light-transmitting conductive layer 316a. Further, the conductive layer 304c and the conductive layer 310d are connected to each other in opening portions 374c and 374d through the conductive layer 316b. Note that a region where the conductive layer 304c that is the second wiring intersects with the conductive layer 310d that is the fifth wiring is referred to as a first region 380. In the first region 380, an insulating layer serving as a gate insulating layer is provided between the conductive layer 304c and the conductive layer 310d.

Further, in FIG. 2B, a second region 382 is provided in a region adjacent to the induced electrostatic breakdown region 360. In the second region 382, a conductive layer 304d (also referred to as third wiring) formed in the same step as the conductive layer 304a serving as a gate electrode intersects with a conductive layer 310e (also referred to as sixth wiring) formed in the same step as the conductive layers 310a and 310b serving as a source electrode and a drain electrode. The second region 382 includes the gate insulating layer (not illustrated in FIG. 2B) and a semiconductor layer 308b between the conductive layer 304d and the conductive layer 310e. The semiconductor layer 308b formed in the second region 382 can increase the distance between the conductive layer 304d and the conductive layer 310e; thus, a parasitic capacitance between the conductive layer 304d and the conductive layer 310e can be reduced. Further, because the distance between the conductive layer 304d and the conductive layer 310e is increased, it is possible to inhibit occurrence of a short-circuit between the conductive layer 304d and the conductive layer 310e due to electrostatic breakdown in the case where a large potential difference is generated between the conductive layer 304d and the conductive layer 310e.

As described above, the distance between the conductive layers in the first region 380 is different from the distance between the conductive layers in the second region 382. Since the semiconductor layer 308b is formed in the second region 382, the distance between the conductive layers in the second region 382 is longer than the distance between the conductive layers in the first region 380.

In FIG. 2C, a conductive layer 304e serving as a scan line extends substantially perpendicularly to the signal line (in the horizontal direction in the drawing). The conductive layer 310e serving as a signal line extends substantially perpendicularly to the scan line (in the vertical direction in the drawing). A conductive layer 310g serving as a capacitor line extends in parallel to the signal line. Note that the conductive layer 304e serving as a scan line is electrically connected to the gate driver 104a (see FIG. 1A), and the conductive layer 310e serving as a signal line and the conductive layer 310g serving as a capacitor line are electrically connected to the source driver 104b (see FIG. 1A).

In FIG. 2C, a transistor 131_1 is provided at a region where the scan line and the signal line intersect with each other. The transistor 131_1 includes the conductive layer 304e serving as a gate electrode; the gate insulating layer (not illustrated in FIG. 2C); a semiconductor layer 308c where a channel region is formed, over the gate insulating layer; and the conductive layers 310e and 310f serving as a source electrode and a drain electrode. The conductive layer 304e also serves as a scan line, and a region of the conductive layer 304e that overlaps with the semiconductor layer 308c serves as the gate electrode of the transistor 131_1. In addition, the conductive layer 310e also serves as a signal line, and a region of the conductive layer 310e that overlaps with the semiconductor layer 308c serves as the source electrode or drain electrode of the transistor 131_1.

In FIG. 2C, an edge of the scan line is on the outer side than an edge of the semiconductor layer 308c when seen from above. Thus, the scan line functions as a light-blocking film for blocking light from a light source such as a backlight. For this reason, the semiconductor layer 308c included in the transistor is not subjected to light, so that a variation in the electrical characteristics of the transistor can be suppressed.

In FIG. 2C, the conductive layer 310f is electrically connected to the conductive layer 316c having a light-transmitting property that serves as a pixel electrode, in the opening portion 374e.

In FIG. 2C, in a capacitor 133_1, the conductive layer 310g serving as a capacitor line is in contact with a semiconductor layer 308d. The capacitor 133_1 includes the semiconductor layer 308d having a light-transmitting property, formed over the gate insulating layer, the conductive layer 316c having a light-transmitting property that serves as a pixel electrode, and a dielectric film formed of an insulating film containing hydrogen formed over the transistor 131_1. That is, the capacitor 133_1 transmits light.

Since the capacitor 133_1 has a light-transmitting property, the large capacitor 133_1 can be formed (covers a large area) in the pixel portion 102. Thus, a display device having an increased charge capacity as well as the aperture ratio increased to typically 55% or more, preferably 60% or more can be provided. For example, in a high-resolution display device such as a liquid crystal display device, the area of a pixel is small and accordingly the area of a capacitor is also small. For this reason, the charge capacity of the capacitor is small in the high-resolution display device. However, since the capacitor 133_1 in this embodiment transmits light, when it is provided in a pixel, a sufficient charge capacity can be obtained in the pixel and the aperture ratio can be improved. Typically, the capacitor 133_1 can be favorably used for a high-resolution display device with a pixel density of 200 pixels per inch (ppi) or more, or furthermore, 300 ppi or more.

In addition, the pixel portion 102 in FIG. 2C has a shape in which a side parallel to the conductive layer 304e serving as a scan line is longer than a side parallel to the conductive layer 310e serving as a signal line, and the conductive layer 310g serving as a capacitor line extends in parallel to the conductive layer 310e serving as a signal line. This can decrease the area where the conductive layer 310g occupies the pixel portion 102, thereby increasing the aperture ratio.

In addition, the conductive layer 310g serving as a capacitor line is in direct contact with the semiconductor layer 308d having a light-transmitting property and serving as a conductive layer, instead of using a connection electrode and thereby the aperture ratio can be further increased. Note that in this embodiment, a shape in which a side parallel to the conductive layer 304e is longer than a side parallel to the conductive layer 310e is described; however, one embodiment of the present invention is not limited thereto. For example, a shape in which a side parallel to the conductive layer 304e may be shorter than a side parallel to the conductive layer 310e. This shape can decrease the area where the conductive layer 304e occupies the pixel, thereby increasing the aperture ratio.

Further, according to an embodiment of the present invention, the aperture ratio can be increased even in a display device with a high resolution, which makes it possible to use light from a light source such as a backlight efficiently, so that power consumption of the display device can be reduced.

Next, cross-sectional structures of the display device illustrated in FIGS. 2A to 2C are described with reference to FIGS. 3A to 3C.

Figure 3A:
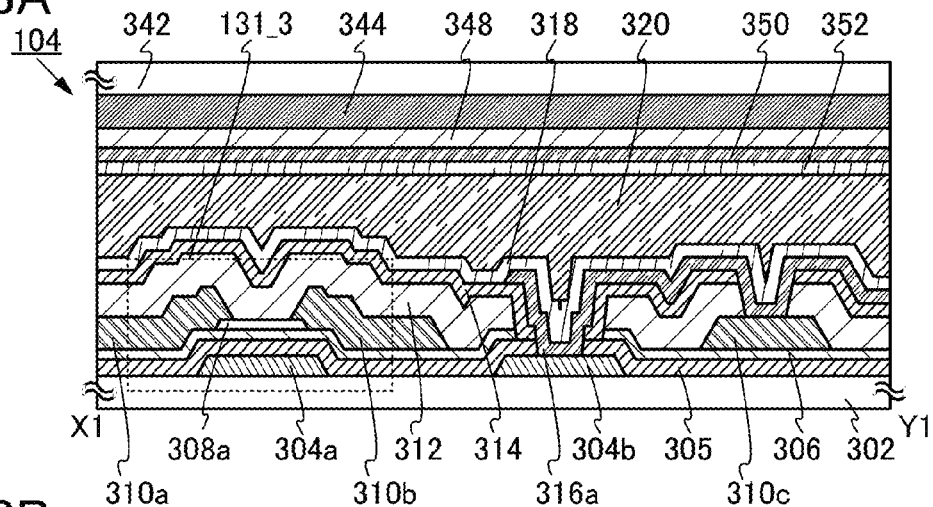
FIGS. 3A to 3C illustrate cross sections of the display device.

FIG. 3A is a cross-sectional view corresponding to a section plane taken along dashed-dotted line X1-Y1 in FIG. 2A. FIG. 3B is a cross-sectional view corresponding to section planes taken along dashed-dotted lines X2-Y2 and X3-Y3 in FIG. 2B. FIG. 3C is a cross-sectional view corresponding to a section plane taken along dashed-dotted line X4-Y4 in FIG. 2C.

Figure 3B:
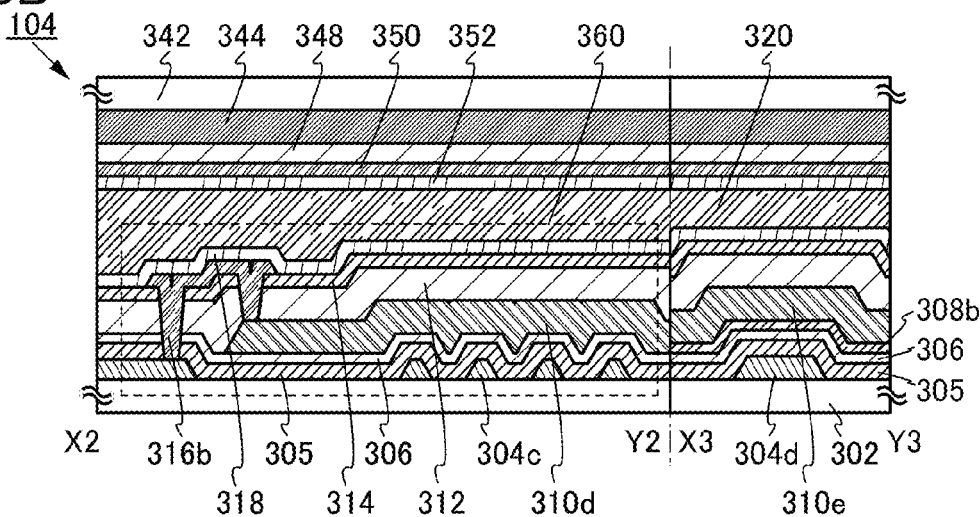
Figure 3C:
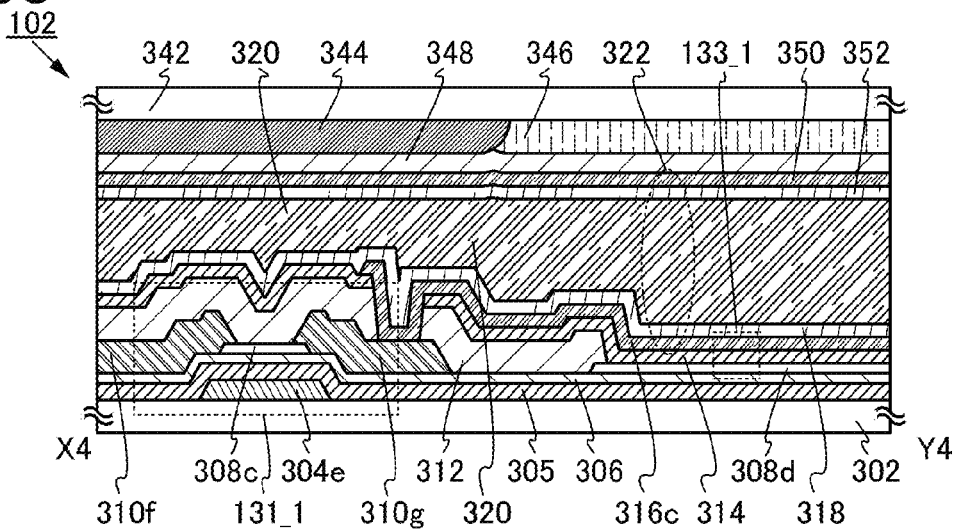

The display device illustrated in FIGS. 3A to 3C includes a liquid crystal element 322 between a pair of substrates (a substrate 302 and a substrate 342) (see FIG. 3C).

The liquid crystal element 322 includes a conductive layer 316c over the substrate 302, a layer having an alignment property (hereinafter referred to as alignment films 318 and 352), a liquid crystal layer 320, and a conductive layer 350. The conductive layer 316c functions as one electrode of the liquid crystal element 322, and the conductive layer 350 functions as the other electrode of the liquid crystal element 322. In FIGS. 3A to 3C, the liquid crystal element 322 is a vertical electric field mode liquid crystal element.

The driver circuit portion 104 illustrated in FIG. 3A includes the substrate 302; the conductive layers 304a and 304b formed over the substrate 302; an insulating layer 305 formed over the substrate 302 and the conductive layers 304a and 304b; an insulating layer 306 formed over the insulating layer 305; the semiconductor layer 308a formed over the insulating layer 306 and overlapping with the conductive layer 304a; the conductive layers 310a and 310b formed over the insulating layer 306 and the semiconductor layer 308a; the conductive layer 310c formed over the insulating layer 306; the insulating layer 312 formed so as to cover the semiconductor layer 308a and the conductive layers 310a, 310b, and 310c; the insulating layer 314 formed over the insulating layer 312; and the conductive layer 316a formed over the insulating layer 314.

Note that in the driver circuit portion 104 illustrated in FIG. 3A, the conductive layer 316a serves as a wiring that connects the conductive layer 304b to the conductive layer 310c. The conductive layer 304b is connected to the conductive layer 316a in an opening portion formed in the insulating layers 305, 306, 312, and 314, and the conductive layer 310c is connected to the conductive layer 316a in an opening portion formed in the insulating layers 312 and 314. Note that in FIG. 3A, when the conductive layer 304b is connected to the conductive layer 316a, an opening portion is formed in the insulating layers 314 and 305 at the same time after an opening portion is formed in the insulating layers 306 and 312. Hence, the number of steps of forming an opening portion is increased as compared to the case where an opening portion is formed in the insulating layers 305, 306, 312, and 314 at the same time. Consequently, in each step, an opening portion having a shallow depth is formed (the etched amount of the insulating layers is small); thus, etching treatment is performed easily. However, one embodiment of the present invention is not limited thereto. An opening portion can be formed in the insulating layers 305, 306, 312, and 314 at the same time as shown in a connection portion between the conductive layer 304c and the conductive layer 316b in FIG. 3B. In the case where an opening portion is formed in the insulating layers 305, 306, 312, and 314 at the same time, the area of an opening region can be reduced.

The driver circuit portion 104 illustrated in FIG. 3B includes the substrate 302, the conductive layers 304c and 304d formed over the substrate 302, the insulating layer 305 formed over the substrate 302 and the conductive layers 304c and 304d, the insulating layer 306 formed over the insulating layer 305, the semiconductor layer 308b formed over the insulating layer 306 and overlapping with the conductive layer 304d, the conductive layer 310d formed over the insulating layer 306, the conductive layer 310e formed over the semiconductor layer 308b, the insulating layer 312 formed to cover the insulating layer 306 and the conductive layers 310d and 310e, and the insulating layer 314 formed over the insulating layer 312. Further, the conductive layer 316b is formed over the insulating layer 314.

Note that in the driver circuit portion 104 illustrated in FIG. 3B, the conductive layer 316b serves as a wiring that connects the conductive layer 304c to the conductive layer 310d. The conductive layer 316b is connected to the conductive layer 310d in the opening portion formed in the insulating layers 305, 306, 312, and 314 and the opening portion formed in the insulating layers 312 and 314. Note that in FIG. 3B, when the conductive layer 304c is connected to the conductive layer 316b, an opening portion is formed in the insulating layers 305, 306, 312, and 314 at the same time. Thus, the area of an opening region can be reduced. However, one embodiment of the present invention is not limited thereto. In a manner similar to that of the connection portion between the conductive layer 304b and the conductive layer 316a in FIG. 3A, an opening portion may be formed in the insulating layers 314 and 305 at the same time after an opening portion is formed in the insulating layers 306 and 312. Hence, the number of steps of forming an opening portion is increased as compared to the case where an opening portion is formed in the insulating layers 305, 306, 312, and 314 at the same time. Consequently, in each step, an opening portion having a shallow depth is formed (the etched amount of the insulating layers is small); thus, etching treatment is performed easily.

Further, the induced electrostatic breakdown region 360 is formed in the driver circuit portion 104 illustrated in FIG. 3B. The induced electrostatic breakdown region 360 includes the conductive layer 304c, the insulating layers 305 and 306, the conductive layer 310d, the insulating layers 312 and 314, and the conductive layer 316b. Note that the insulating layers 305 and 306 are not necessarily provided in the induced electrostatic breakdown region 360.

As illustrated in the top view in FIG. 2B, a part of the conductive layer 304c in the induced electrostatic breakdown region 360 has a comb-like shape. Further, as illustrated in the cross-sectional view in FIG. 3B, the conductive layer 304c has a plurality of projections so as to be short-circuited to the conductive layer 310d easily.

In the induced electrostatic breakdown region 360, when a large potential difference is generated between the conductive layer 304c and the conductive layer 310d, the insulating layers 305 and 306 formed between the conductive layer 304c and the conductive layer 310d are broken, and thus, a short-circuit occurs.

Note that the induced electrostatic breakdown region 360 shows its effect especially at the time of forming an opening portion for connecting the conductive layer 316b to another conductive layer. For example, when the opening portion is formed by using a dry etching apparatus, a potential difference between the conductive layer 304c and the conductive layer 310d is increased by an electric field of plasma or the like generated in the dry etching apparatus. In the case where the induced electrostatic breakdown region 360 is not formed, an electrostatic breakdown due to ESD occurs in an unspecified pattern such as a wiring pattern included in the display device. In contrast, the display device of one embodiment of the present invention includes the induced electrostatic breakdown region 360; thus, overcurrent due to ESD can be released to the induced electrostatic breakdown region 360.

Note that the conductive layer 304c is connected to the conductive layer 310d through the conductive layer 316b after the opening portion is formed in the insulating layers. Hence, even when a short-circuit occurs between the conductive layer 304c and the conductive layer 310d by electrostatic breakdown, there is little or no adverse effect on the display device.

In this manner, the induced electrostatic breakdown region 360 can inhibit breakdowns of conductive layers (e.g., the conductive layers 304a and 304b) formed in the same step as the conductive layer 304c or conductive layers (e.g., the conductive layers 310a, 310b, and 310c) formed in the same step as the conductive layer 310d.

In addition, the driver circuit portion 104 illustrated in FIGS. 3A and 3B includes the substrate 342, a layer having a light-shielding property (hereinafter referred to as light-shielding layer 344) formed over the substrate 342, an insulating layer 348 formed over the light-shielding layer 344, and the conductive layer 350 formed over the insulating layer 348.

Further, in the driver circuit portion 104 illustrated in FIGS. 3A and 3B, the liquid crystal layer 320 is interposed between the substrate 302 and the substrate 342, and the alignment films 318 and 352 are provided for the substrate 302 and the substrate 342, respectively, so as to be in contact with the liquid crystal layer 320. The liquid crystal layer 320 can be sealed in between the substrate 302 and the substrate 342 with a sealant (not illustrated). The sealant is preferably in contact with an inorganic material to prevent entry of moisture and the like from the outside. In addition, the thickness (also referred to as a cell gap) of the liquid crystal layer 320 can be maintained with use of a spacer (not illustrated).

The pixel portion 102 illustrated in FIG. 3C includes the substrate 302; the conductive layer 304e formed over the substrate 302; the insulating layer 305 formed over the substrate 302 and the conductive layer 304e; the insulating layer 306 formed over the insulating layer 305; the semiconductor layer 308c formed over the insulating layer 306 and overlapping with the conductive layer 304e; the semiconductor layer 308d formed over the insulating layer 306; the conductive layers 310f and 310g formed over the insulating layer 306 and the semiconductor layer 308c; the insulating layer 312 formed so as to cover the semiconductor layer 308c, the conductive layers 310f and 310g and a part of the semiconductor layer 308d; the insulating layer 314 formed over the insulating layer 312 and the semiconductor layer 308d; and the conductive layer 316c formed over the insulating layer 314 and connected to the conductive layer 310g.

The conductive layer 316c is connected to the conductive layer 310g in the opening portion formed in the insulating layers 312 and 314.

The pixel portion 102 illustrated in FIG. 3C includes the substrate 342, the light-shielding layer 344 formed over the substrate 342, a layer having a coloring property (hereinafter referred to as coloring layer 346) formed over the substrate 342, the light-shielding layer 344, the insulating layer 348 formed over the coloring layer 346, and the conductive layer 350 formed over the insulating layer 348.

In the pixel portion 102 illustrated in FIG. 3C, the liquid crystal layer 320 is interposed between the substrate 302 and the substrate 342, and the alignment films 318 and 352 are provided for the substrate 302 and the substrate 342, respectively, so as to be in contact with the liquid crystal layer 320.

Details of other components are described later in description of a manufacturing method of the display device below.

As described above, in a display device of this embodiment, an induced electrostatic breakdown region is provided in a driver circuit portion. The induced electrostatic breakdown region has an insulating film between a wiring formed in the same step as a gate electrode and a wiring formed in the same step as a source electrode and a drain electrode. The thickness of the insulating film is made small, i.e., the distance between the wirings is shortened, whereby the electrostatic breakdown can be inhibited from occurring in an insulating film between other wiring patterns. Further, in the induced electrostatic breakdown region, the wiring formed in the same step as the gate electrode has a comb-like shape, and thus, overcurrent which can occur by ESD flows easily in the wiring.

Thus, in one embodiment of the present invention, the display device including the induced electrostatic breakdown region in the driver circuit portion is provided, so that a novel display device having high reliability can be provided.

The structure described in this embodiment can be used in appropriate combination with the structure described in any of the other embodiments.

(Embodiment 2)

In this embodiment, a method for manufacturing the display device of FIGS. 3A to 3C in Embodiment 1 is described with reference to FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, and FIGS. 17A to 17C.

The driver circuit portion 104 and the pixel portion 102 in the display device illustrated in FIGS. 3A to 3C of Embodiment 1 can be manufactured concurrently. Therefore, in this embodiment, methods for forming the driver circuit portion 104 and the pixel portion 102 are described. Note that the method for manufacturing the driver circuit portion 104 is shown in FIGS. 4A and 4B, FIGS. 5A and 5B, FIGS. 6A and 6B, FIGS. 7A and 7B, FIGS. 8A and 8B, FIGS. 9A and 9B, FIGS. 10A and 10B, FIGS. 11A and 11B, FIGS. 12A and 12B, FIGS. 13A and 13B, FIGS. 14A and 14B, FIGS. 15A and 15B, FIGS. 16A and 16B, and FIGS. 17A and 17B. The method for manufacturing the pixel portion 102 is shown in FIG. 4C, FIG. 5C, FIG. 6C, FIG. 7C, FIG. 8C, FIG. 9C, FIG. 10C, FIG. 11C, FIG. 12C, FIG. 13C, FIG. 14C, FIG. 15C, FIG. 16C, and FIG. 17C.

First, the substrate 302 is prepared. As the substrate 302, a substrate of a glass material such as aluminosilicate glass, aluminoborosilicate glass, barium borosilicate glass, or the like is used. In terms of mass production, a mother glass with the following size is preferably used for the substrate 302: the 8th generation (2160 mm×2460 mm); the 9th generation (2400 mm×2800 mm, or 2450 mm×3050 mm); the 10th generation (2950 mm×3400 mm); or the like. High process temperature and a long period of process time drastically shrink the mother glass. Thus, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

Then, a conductive film is formed over the substrate 302 and processed into desired regions, so that the conductive layers 304a, 304b, 304c, 304d, and 304e are formed. The conductive layers 304a, 304b, 304c, 304d, and 304e can be formed in such a manner that a mask is formed in a desired region by first patterning and regions not covered with the mask are etched.

For the conductive layers 304a, 304b, 304c, 304d, and 304e, a metal element selected from aluminum, chromium, copper, tantalum, titanium, molybdenum, and tungsten, an alloy containing any of these metal elements as a component, an alloy containing these metal elements in combination, or the like can be used. In addition, the conductive layers 304a, 304b, 304c, 304d, and 304e may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used. The conductive layers 304a, 304b, 304c, 304d, and 304e can be formed by a sputtering method, for example.

Figure 4A:
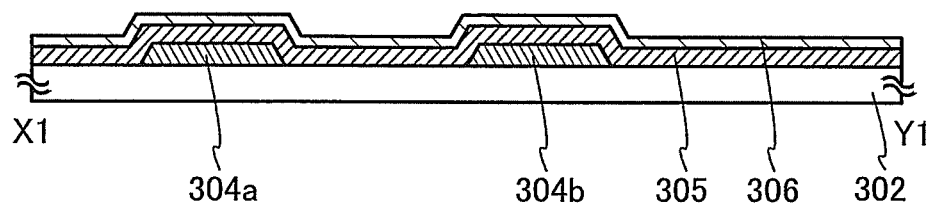
FIGS. 4A to 4C are cross-sectional views illustrating a method for manufacturing the display device.
Figure 4B:
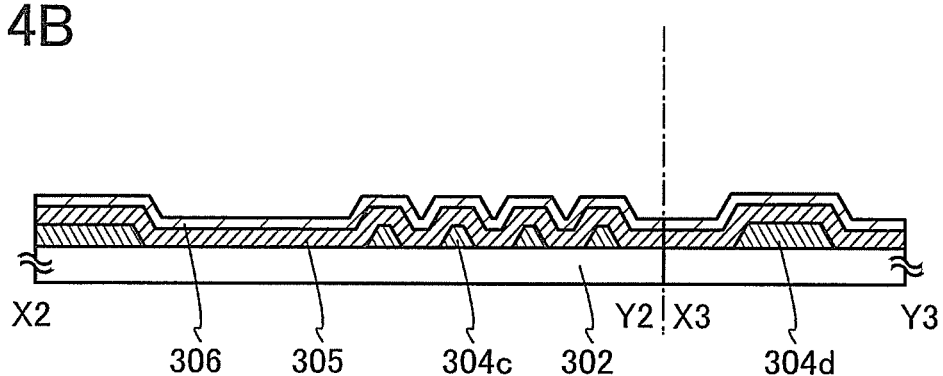
Figure 4C:
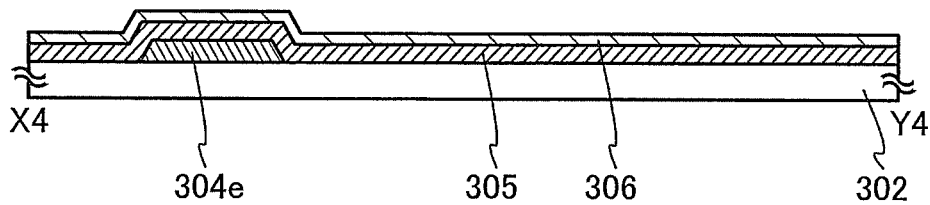

Next, the insulating layers 305 and 306 are formed over the substrate 302 and the conductive layers 304a, 304b, 304c, 304d, and 304e (see FIGS. 4A to 4C).

The insulating layer 305 is formed with a single-layer structure or a layered structure using, for example, any of a silicon nitride oxide film, a silicon nitride film, an aluminum oxide film, and the like with a PE-CVD apparatus. In the case where the insulating layer 305 has a layered structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating layer 305 can be prevented from moving or diffusing into the semiconductor layers 308a, 308b, and 308c to be formed later.

The insulating layer 306 is formed with a single-layer structure or a layered structure using any of a silicon oxide film, a silicon oxynitride film, and the like with a PE-CVD apparatus.

As for the insulating layers 305 and 306, for example, a 300-nm-thick silicon nitride film can be formed as the insulating layer 305, and then a 50-nm-thick silicon oxynitride film can be formed as the insulating layer 306. The silicon nitride film and the silicon oxynitride film are preferably formed in succession in a vacuum, in which case entry of impurities is suppressed. In addition, portions of the insulating layers 305 and 306 overlapping with the conductive layers 304a and 304e can serve as gate insulating layers of transistors.

Note that silicon nitride oxide refers to an insulating material that contains more nitrogen than oxygen, whereas silicon oxynitride refers to an insulating material that contains more oxygen than nitrogen.

When the gate insulating layer has the above structure, the following effects can be obtained, for example. The silicon nitride film has a higher relative permittivity than a silicon oxide film and needs a larger thickness for an equivalent capacitance. Thus, the physical thickness of the gate insulating layer can be increased. This makes it possible to reduce a decrease in withstand voltage of a transistor and furthermore increase the withstand voltage, thereby reducing electrostatic breakdowns of the transistor.

Figure 5A:
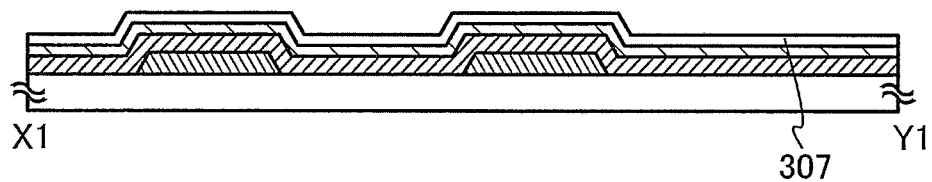
FIGS. 5A to 5C are cross-sectional views illustrating a method for manufacturing the display device.
Figure 5B:
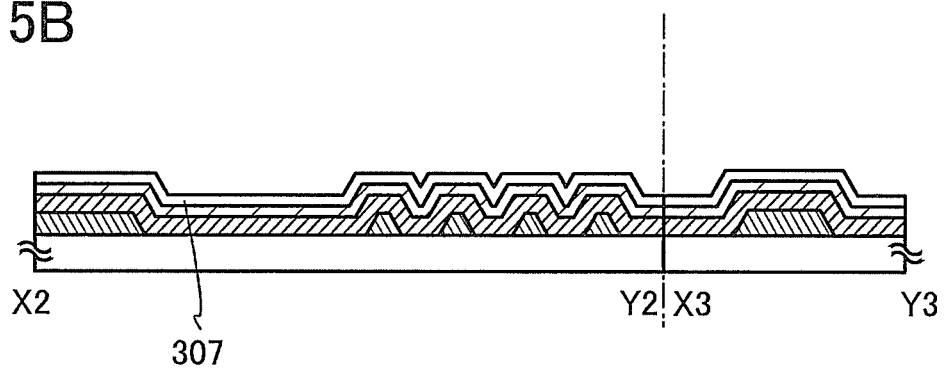
Figure 5C:
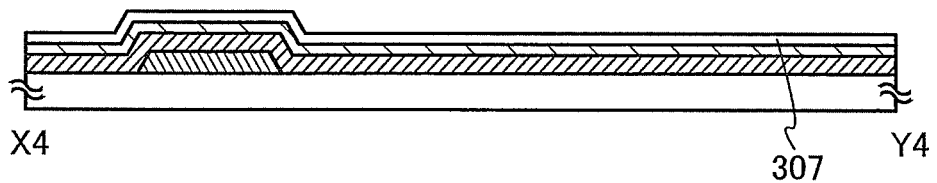
Figure 6A:
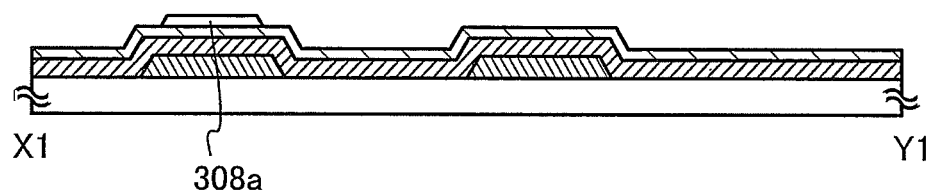
FIGS. 6A to 6C are cross-sectional views illustrating a method for manufacturing the display device.
Figure 6B:
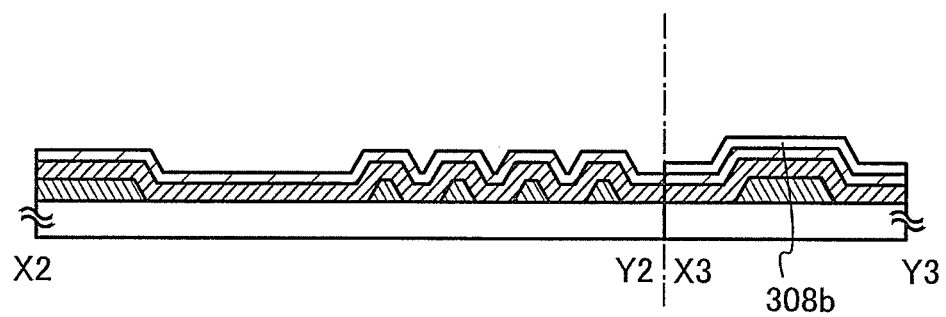
Figure 6C:
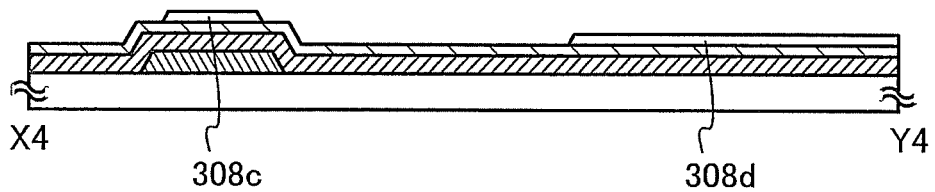

Next, a semiconductor layer 307 is formed over the insulating layer 306 (see FIGS. 5A to 5C).

For the semiconductor layer 307, for example, an oxide semiconductor can be used. An oxide semiconductor that can be used for the semiconductor layer 307 preferably includes a layer represented by an In—M—Zn oxide (M is an element such as Al, Ga, Ge, Y, Zr, Sn, La, Ce, or Hf) containing at least indium (In), zinc (Zn), and M. Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that here, an In—Ga—Zn oxide means an oxide containing In, Ga, and Zn as its main components and there is no particular limitation on the ratio of In, Ga, and Zn. The In—Ga—Zn oxide may contain another metal element in addition to In, Ga, and Zn. Further, in this specification and the like, a film formed using an In—Ga—Zn oxide is also referred to as an IGZO film in some cases.

Alternatively, a material represented by $InMO_3(ZnO)_m$ (m>0 is satisfied, and m is an integer) may be used. Note that M represents one or more metal elements selected from Ga, Fe, Mn, and Co in some cases. Alternatively, a material represented by $In_2SnO_5(ZnO)_n$ (n>0, n is an integer) may be used.

The oxide semiconductor film may be in a non-single-crystal state. The non-single-crystal state is, for example, structured by at least one of c-axis aligned crystal (CAAC), polycrystal, microcrystal, and an amorphous part.

An oxide semiconductor may include CAAC. Note that an oxide semiconductor including CAAC is referred to as a CAAC-OS (c-axis aligned crystalline oxide semiconductor).

In an image obtained with a transmission electron microscope (TEM), crystal parts can be found in the CAAC-OS in some cases. In most cases, crystal parts in the CAAC-OS each fit inside a cube whose one side is less than 100 nm. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, segregation of an impurity is unlikely to occur. In the CAAC-OS, since a clear boundary does not exist, high density of defect states is unlikely to occur. In the CAAC-OS, since a clear grain boundary does not exist, a reduction in electron mobility is unlikely to occur.

The CAAC-OS includes a plurality of crystal parts in some cases. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, spots (luminescent spots) are shown in an electron diffraction pattern of the CAAC-OS in some cases. An electron diffraction pattern obtained with an electron beam having a diameter of 10 nmϕ or smaller, or 5 nmϕ or smaller, is called a nanobeam electron diffraction pattern. In the CAAC-OS, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

Figure 30A:
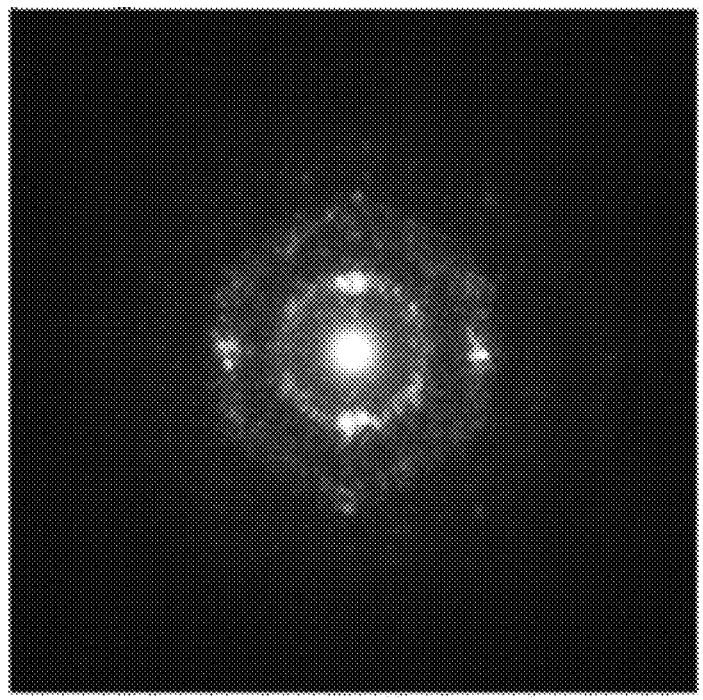
FIGS. 30A and 30B each show a nanobeam electron diffraction pattern of an oxide semiconductor.

FIG. 30A is an example of a nanobeam electron diffraction pattern of a sample including a CAAC-OS. Here, the sample is cut in the direction perpendicular to a surface where the CAAC-OS is formed and the thickness thereof is reduced to about 40 nm. Further, an electron beam with a diameter of 1 nmϕ enters from the direction perpendicular to the cut surface of the sample. FIG. 30A shows that spots are observed in the nanobeam electron diffraction pattern of the CAAC-OS.

In each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that the film deposition is accompanied with the formation of the crystal parts or followed by the formation of the crystal parts through crystallization treatment such as heat treatment. Hence, the c-axes of the crystal portions are aligned in the direction parallel to a normal vector of the surface where the CAAC-OS is formed or a normal vector of the surface of the CAAC-OS.

The CAAC-OS can be obtained by reducing the impurity concentration. The impurity means here an element other than the main components of the oxide semiconductor, such as hydrogen, carbon, silicon, or a transition metal element. In particular, an element such as silicon has a higher strength to bond with oxygen than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor is higher than that in the vicinity of the surface where the oxide semiconductor is formed in some cases. Further, when an impurity is mixed into the CAAC-OS, the crystallinity of the crystal part in a region into which the impurity is mixed is lowered in some cases.

Further, the CAAC-OS can be formed by reducing the density of defect states. In an oxide semiconductor, oxygen vacancies are defect states. The oxygen vacancies serve as trap levels or serve as carrier generation sources when hydrogen is trapped therein. In order to form the CAAC-OS, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

The CAAC-OS can be formed by a sputtering method using a DC power source, for example.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

In a TEM image of the polycrystalline oxide semiconductor, crystal grains can be found. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between crystal grains can be found in the polycrystalline oxide semiconductor in some cases. Also in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with use of an XRD apparatus, a peak at $2\theta$ of around 31 degrees which shows alignment or peaks showing plural kinds of alignment appear in some cases. Further, spots are observed in a nanobeam electron diffraction pattern of the polycrystalline oxide semiconductor in some cases.

The polycrystalline oxide semiconductor has high crystallinity and thus has high electron mobility in some cases. Accordingly, a transistor including the polycrystalline oxide semiconductor in a channel formation region has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor using the polycrystalline oxide semiconductor for a channel formation region has larger variation in electrical characteristics and lower reliability than a transistor using a CAAC-OS for a channel formation region in some cases.

The polycrystalline oxide semiconductor can be formed by high-temperature heat treatment or laser light treatment.

An oxide semiconductor may include microcrystal, for example. Note that an oxide semiconductor including microcrystal is referred to as a microcrystalline oxide semiconductor.

In an image obtained with a TEM, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc). An oxide semiconductor including nanocrystal is referred to as a nanocrystalline oxide semiconductor (nc-OS). In an image of the nc-OS obtained with a TEM, a boundary between crystal parts is not clearly detected in some cases. In an image of the nc-OS obtained with a TEM, for example, since a clear grain boundary does not exist, segregation of an impurity is unlikely to occur. In the nc-OS, since a clear grain boundary does not exist, high density of defect states is unlikely to occur. In the nc-OS, since a clear grain boundary does not exist, a reduction in electron mobility is unlikely to occur.

In the nc-OS, a microscopic region (for example, a region with a size greater than or equal to 1 nm and less than or equal to 10 nm) has a periodic atomic order occasionally. Further, in the nc-OS, crystal parts are not regularly-arranged. Thus, there is a case where periodic atomic order is not observed microscopically or a case where long-range order in atomic arrangement is not observed. Accordingly, in some cases, the nc-OS cannot be distinguished from an amorphous oxide semiconductor, depending on an analysis method. When the nc-OS is analyzed by an out-of-plane method with an XRD apparatus using an X-ray having a beam diameter larger than that of a crystal part, a peak which shows alignment does not appear in some cases. Further, a halo pattern is shown in some cases in an electron diffraction pattern of the nc-OS obtained by using an electron beam having a diameter larger than that of a crystal part (for example, a beam diameter of 20 nm$\phi$ or more, or 50 nm$\phi$ or more). Spots are shown in some cases in a nanobeam electron diffraction pattern of the nc-OS obtained by using an electron beam having a diameter smaller than or equal to that of a crystal part (for example, a beam diameter of 10 nm$\phi$ or less, or 5 nm$\phi$ or less). In a nanobeam electron diffraction pattern of the nc-OS, regions with high luminance in a circular pattern are shown in some cases. In a nanobeam electron diffraction pattern of the nc-OS, a plurality of spots are shown in the region in some cases.

Figure 30B:
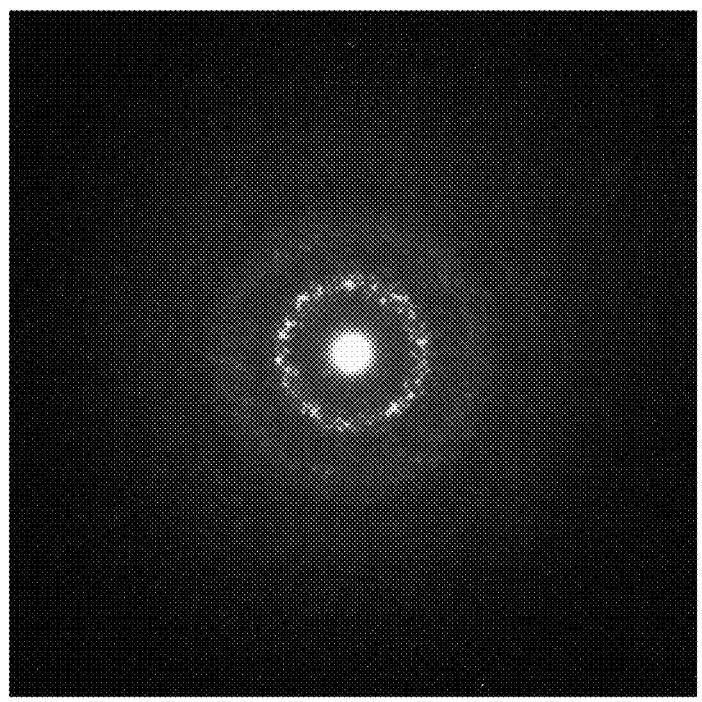

FIG. 30B is an example of a nanobeam electron diffraction pattern of a sample including an nc-OS. Here, the sample is cut in the direction perpendicular to a surface where the nc-OS is formed and the thickness thereof is reduced to about 40 nm. Further, an electron beam with a diameter of 1 nm$\phi$ enters from the direction perpendicular to the cut surface of the sample. FIG. 30B shows that, in the nanobeam electron diffraction pattern of the nc-OS, regions with high luminance in a circular pattern are shown and a plurality of spots is shown in the regions.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Thus, the nc-OS may have a higher carrier density than the CAAC-OS. An oxide semiconductor with a high carrier density tends to have a high electron mobility. Therefore, a transistor using the nc-OS for a channel formation region has a high field-effect mobility in some cases. Further, the nc-OS has higher density of defect states than the CAAC-OS and thus has higher density of trap states in some cases. Therefore, a transistor using the nc-OS for a channel formation region has larger variation in electrical characteristics and lower reliability than a transistor using the CAAC-OS for a channel formation region. Note that the nc-OS can be obtained even when the amount of impurity contained therein is relatively large; thus, the nc-OS is sometimes preferably used depending on the application. For example, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel formation region can be manufactured with high productivity.

The oxide semiconductor may include an amorphous part. Note that an oxide semiconductor including an amorphous part is referred to as an amorphous oxide semiconductor. An amorphous oxide semiconductor, for example, has disordered atomic arrangement and no crystal part. An amorphous oxide semiconductor, for example, does not have a specific shape as in quartz and regularity in atomic arrangement.

Further, a halo pattern is observed in an electron diffraction pattern of an amorphous oxide semiconductor film in some cases. In other cases, a halo pattern is observed instead of a spot in a nanobeam electron diffraction pattern of the amorphous oxide semiconductor film.

The amorphous oxide semiconductor can be formed in some cases, for example, by introducing a high-concentration impurity such as hydrogen. Thus, the amorphous oxide semiconductor contains impurities at a high concentration.

When an oxide semiconductor contains a high-concentration impurity, a defect state such as an oxygen vacancy is formed in the oxide semiconductor in some cases. This means that an amorphous oxide semiconductor with a high-concentration impurity has a high density of defect states. In addition, since the amorphous oxide semiconductor has low crystallinity, the density of defect states of the amorphous oxide semiconductor is higher than that of the CAAC-OS or the nc-OS.

Accordingly, the amorphous oxide semiconductor has much higher carrier density than the nc-OS. Therefore, a transistor using the amorphous oxide semiconductor for a channel formation region tends to be normally on. Thus, in some cases, such an amorphous oxide semiconductor can be applied to a transistor which needs to be normally on. The amorphous oxide semiconductor has a high density of defect states and thus has a high density of trap states in some cases. Consequently, a transistor including the amorphous oxide semiconductor for a channel formation region has larger variation in electric characteristics and lower reliability than a transistor including the CAAC-OS or the nc-OS for a channel formation region. Note that the amorphous oxide semiconductor can be formed by a deposition method in which a relatively large amount of impurity is contained, and thus can be easily obtained and preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel formation region can be manufactured with high productivity.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

An oxide semiconductor may include a single crystal. Note that an oxide semiconductor including a single crystal is referred to as a single crystal oxide semiconductor.

The single crystal oxide semiconductor has a low impurity concentration and a low density of defect states (few oxygen vacancies), and thus has a low carrier density. Accordingly, in some cases, a transistor including a single-crystal oxide semiconductor in a channel formation region is rarely normally-on. Further, the single crystal oxide semiconductor has a low density of defect states and thus has a low density of trap states in some cases. Accordingly, a transistor including a single-crystal oxide semiconductor in a channel formation region has a small variation in the electric characteristics, and thus the transistor can have high reliability.

The oxide semiconductor has a high density if including few defects, for example. The oxide semiconductor has a high density if having a high crystallinity, for example. The oxide semiconductor has a high density if including a low-concentration impurity such as hydrogen. For example, the density of a single crystal oxide semiconductor is higher than that of a CAAC-OS in some cases. For example, the density of a CAAC-OS is higher than that of a microcrystalline oxide semiconductor in some cases. For example, the density of a polycrystalline oxide semiconductor is higher than that of a microcrystalline oxide semiconductor in some cases. For example, the density of a microcrystalline oxide semiconductor is higher than that of an amorphous oxide semiconductor.

Then, the semiconductor layer 307 is processed into desired shapes to form the island-shaped semiconductor layers 308a, 308b, 308c, and 308d. The semiconductor layers 308a, 308b, 308c, and 308d can be formed in such a manner that a mask is formed in a desired region by second patterning and regions not covered with the mask are etched. For the etching, dry etching, wet etching, or a combination of both can be employed (see FIGS. 6A to 6C). When the island-shaped semiconductor layer 308d is formed by processing the semiconductor layer 307 into desired shapes as described above, an additional step is not needed, which can reduce the total number of steps and a manufacturing cost and improve the throughput.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor that is used for the semiconductor layers 308a, 308b, 308c, and 308d can be improved, and in addition, impurities such as hydrogen and water can be removed from the insulating layer 305 and 306 and the semiconductor layers 308a, 308b, 308c, and 308d. The first heat treatment may be performed before the oxide semiconductor is processed into island shapes.

Note that stable electrical characteristics can be effectively imparted to a transistor in which an oxide semiconductor serves as a channel by reducing the concentration of impurities in the oxide semiconductor to make the oxide semiconductor intrinsic or substantially intrinsic. The term "substantially intrinsic" refers to the state where an oxide semiconductor has a carrier density lower than $1 \times 10^{17}/cm^3$, preferably lower than $1 \times 10^{15}/cm^3$, further preferably lower than $1 \times 10^{13}/cm^3$.

In the oxide semiconductor, hydrogen, nitrogen, carbon, silicon, and metal elements except for main components are impurities. For example, hydrogen and nitrogen form donor levels to increase the carrier density. Silicon forms impurity levels in an oxide semiconductor. The impurity level becomes a trap, which might deteriorate the electric characteristics of the transistor.

Note that in order to make the oxide semiconductor intrinsic or substantially intrinsic, the concentration of silicon in the oxide semiconductor, which is measured by SIMS, is set to lower than $1 \times 10^{19}$ atoms/$cm^3$, preferably lower than $5 \times 10^{18}$ atoms/$cm^3$, further preferably lower than $1 \times 10^{18}$ atoms/$cm^3$. The concentration of hydrogen in the oxide semiconductor is set to be lower than or equal to $2 \times 10^{20}$ atoms/$cm^3$, preferably lower than or equal to $5 \times 10^{19}$ atoms/$cm^3$, further preferably lower than or equal to $1 \times 10^{19}$ atoms/$cm^3$, still further preferably lower than or equal to $5 \times 10^{18}$ atoms/$cm^3$. The concentration of nitrogen in the oxide semiconductor is set to be lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

In addition, in a case where the oxide semiconductor includes a crystal, the crystallinity of the oxide semiconductor might be decreased if silicon or carbon is included at high concentration. In order not to lower the crystallinity of the oxide semiconductor, the concentration of silicon in the oxide semiconductor can be set to lower than $1 \times 10^{19}$ atoms/$cm^3$, preferably lower than $5 \times 10^{18}$ atoms/$cm^3$, more preferably lower than $1 \times 10^{18}$ atoms/$cm^3$. Moreover, the concentration of carbon can be set to be lower than $1 \times 10^{19}$ atoms/$cm^3$, preferably lower than $5 \times 10^{18}$ atoms/$cm^3$, more preferably lower than $1 \times 10^{18}$ atoms/$cm^3$.

A transistor in which a highly purified oxide semiconductor film is used for a channel formation region as described above has extremely low off-state current, and the off-state current standardized on the channel width of the transistor can be as low as several yoctoamperes per micrometer to several zeptoamperes per micrometer.

Figure 7A:
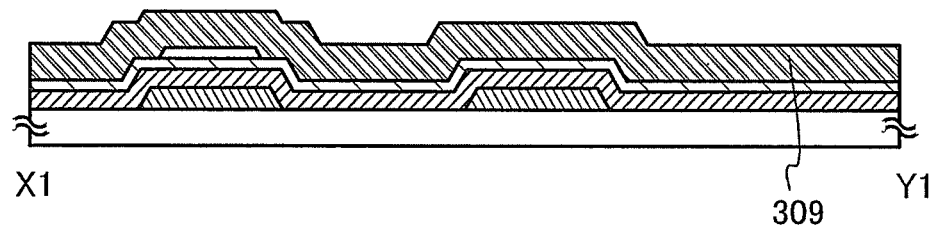
FIGS. 7A to 7C are cross-sectional views illustrating a method for manufacturing the display device.
Figure 7B:
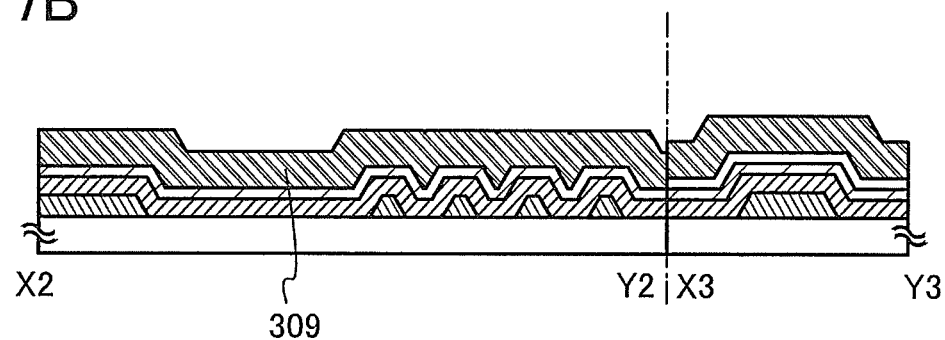
Figure 7C:
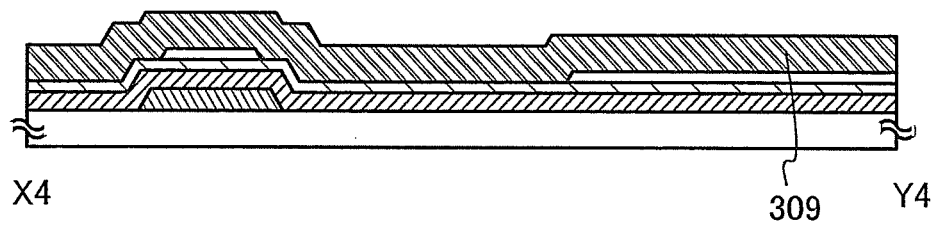
Figure 8A:
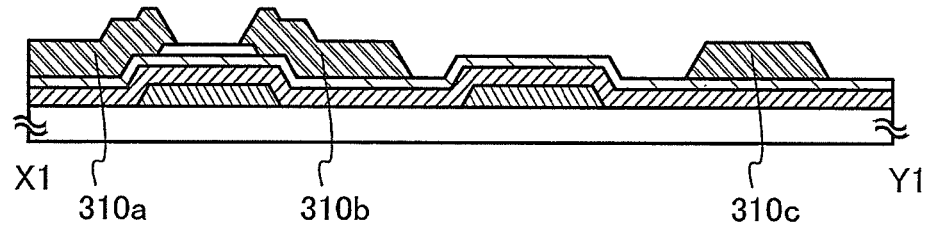
FIGS. 8A to 8C are cross-sectional views illustrating a method for manufacturing the display device.
Figure 8B:
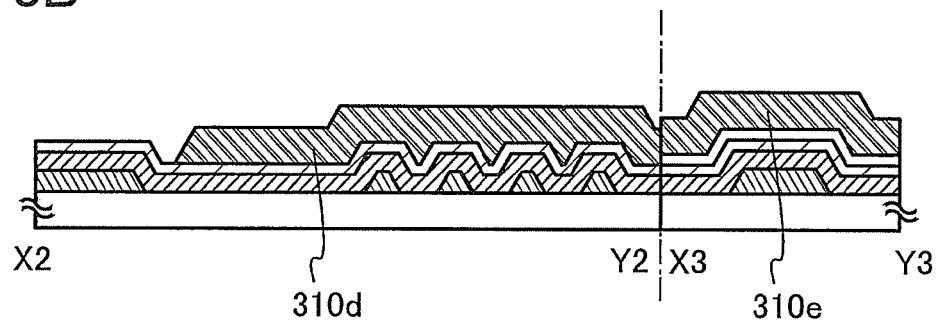
Figure 8C:
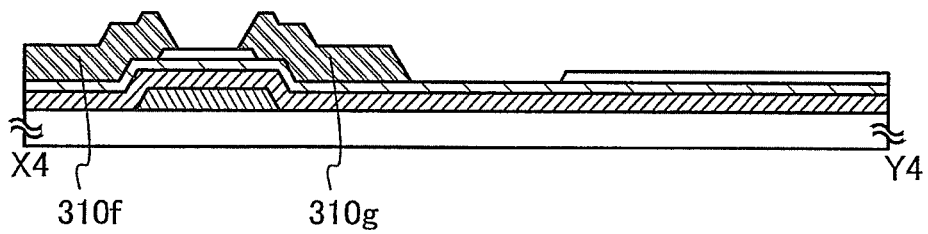

Next, a conductive layer 309 is formed over the insulating layer 306 and the semiconductor layers 308a, 308b, 308c, and 308d (see FIGS. 7A to 7C).

The conductive layer 309 is formed with a single-layer structure or a stacked-layer structure including any of metals such as aluminum, titanium, chromium, nickel, copper, yttrium, zirconium, molybdenum, silver, tantalum, and tungsten or an alloy containing any of these metals as its main component as a conductive material. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. In addition, the conductive layer 309 can be formed by a sputtering method, for example.

Next, the conductive layer 309 is processed into desired shapes so that the conductive layers 310a, 310b, 310c, 310d, 310e, 310f, and 310g are formed. Note that the conductive layers 310a, 310b, 310c, 310d, 310e, 310f, and 310g can be formed in such a manner that a mask is formed in a desired region by third patterning and regions not covered with the mask are etched (see FIGS. 8A to 8C).

In this embodiment, the conductive layers 310a, 310b, 310f, and 310g are formed over the semiconductor layers 308a and 308c, but can be formed between the insulating layer 306 and the semiconductor layers 308a and 308c.

Figure 9A:
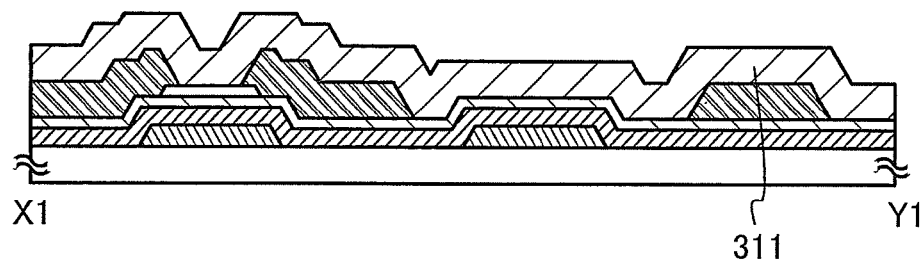
FIGS. 9A to 9C are cross-sectional views illustrating a method for manufacturing the display device.
Figure 9B:
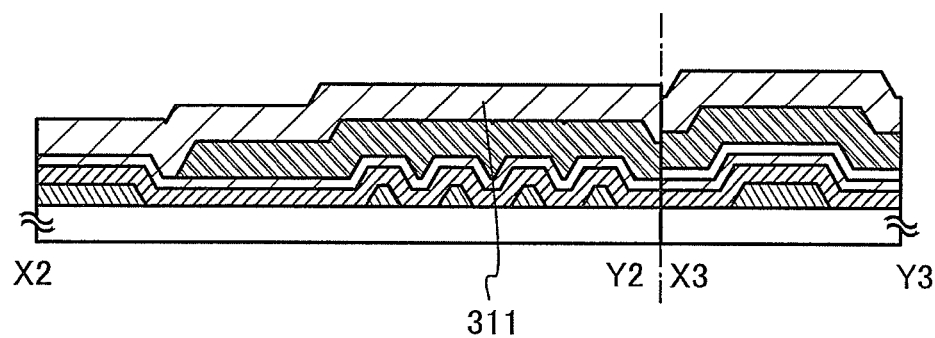
Figure 9C:
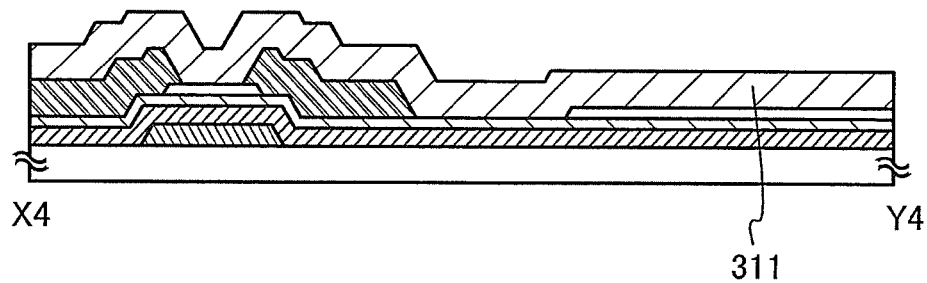
Figure 10A:
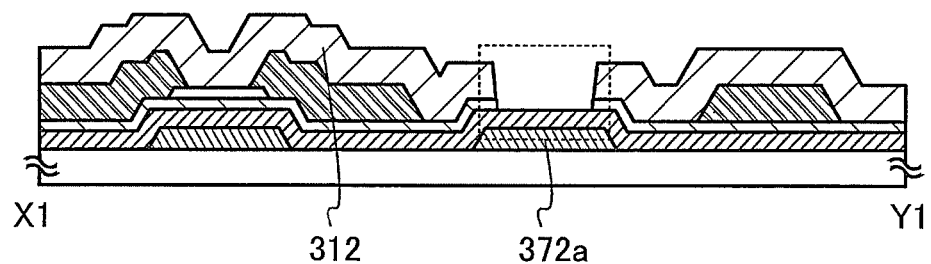
FIGS. 10A to 10C are cross-sectional views illustrating a method for manufacturing the display device.
Figure 10B:
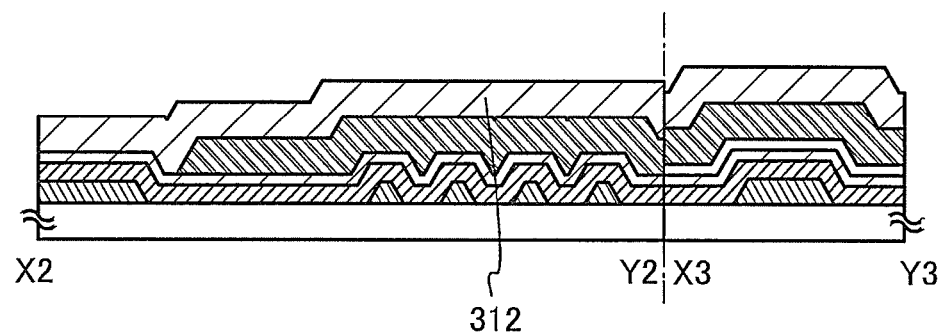
Figure 10C:
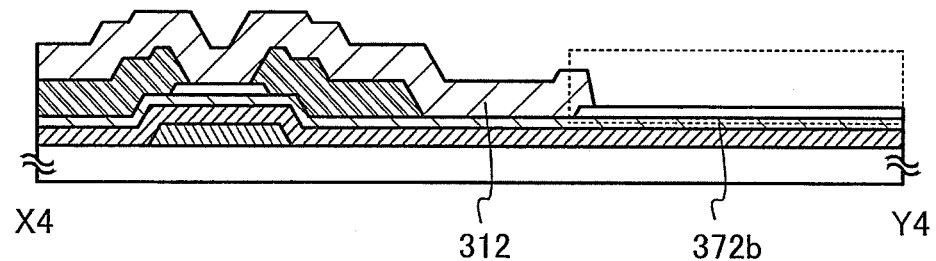

Next, an insulating layer 311 is formed to cover the insulating layer 306, the semiconductor layers 308a and 308c, and the conductive layers 310a, 310b, 310c, 310d, 310e, 310f, and 310g (see FIGS. 9A to 9C).

For the insulating layer 311, an inorganic insulating material containing oxygen can be used in order to improve the characteristics of the interface with the oxide semiconductor used for the semiconductor layers 308a, 308b, 308c, and 308d. The insulating layer 311 can be formed by a PE-CVD method, for example.

As an example of the insulating layer 311, a silicon oxide film, a silicon oxynitride film, an aluminum oxide film, or the like having a thickness of from 150 nm to 400 nm can be used. In this embodiment, a 300-nm-thick silicon oxynitride film is used as the insulating layer 311.

Then, the insulating layer 311 is processed into desired shapes so that the opening portions 372a and 372b are formed. In addition, the insulating layer 311 serves as the insulating layer 312 where the opening portions 372a and 372b are formed. The insulating layer 312 and the opening portions 372a and 372b can be formed in such a manner that a mask is formed in a desired region by fourth patterning and regions not covered by the mask are etched (see FIGS. 10A to 10C).

The opening portion 372a is formed to expose the insulating layer 305. Further, the opening portion 372b is formed to expose the semiconductor layer 308d. An example of a formation method of the opening portions 372a and 372b includes, but not limited to, a dry etching method. Alternatively, a wet etching method or a combination of dry etching and wet etching can be employed for formation of the opening portions 372a and 372b. Note that there is a case where the island-shaped semiconductor layer 308d is formed not by processing the semiconductor layer 307 in a desired region but by processing a semiconductor layer (e.g. ITO) which is not the semiconductor layer 307. In that case, the opening portion 372b can be omitted. Further, in the case where the island-shaped semiconductor layer 308d is not in contact with an insulating layer 313, the opening portion 372b can be omitted. Furthermore, in the case where there is no need to provide the island-shaped semiconductor layer 308d, the opening portion 372b can be omitted.

Figure 11A:
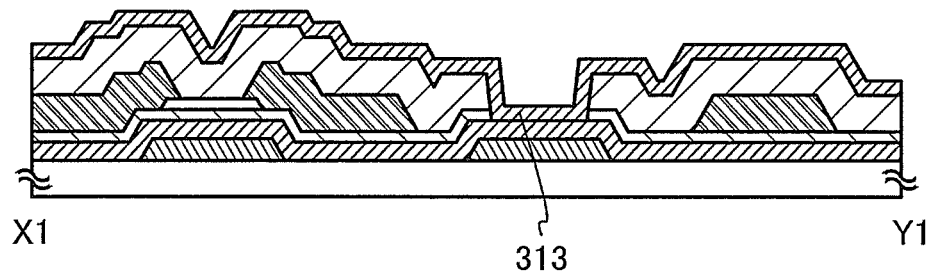
FIGS. 11A to 11C are cross-sectional views illustrating a method for manufacturing the display device.
Figure 11B:
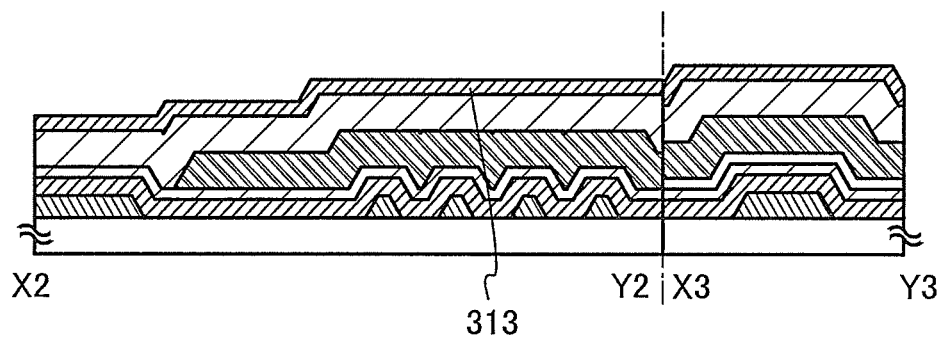
Figure 11C:
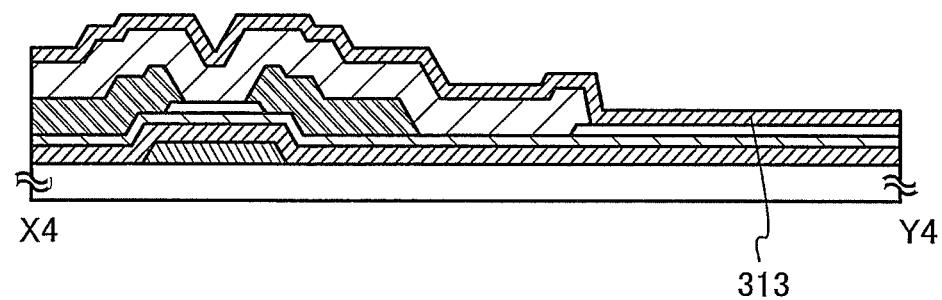
Figure 12A:
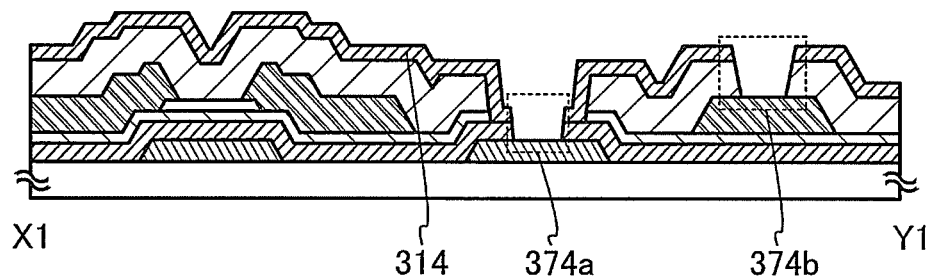
FIGS. 12A to 12C are cross-sectional views illustrating a method for manufacturing the display device.
Figure 12B:
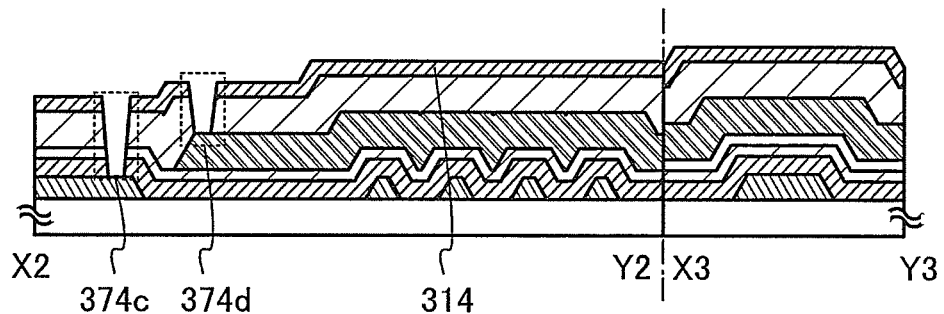
Figure 12C:
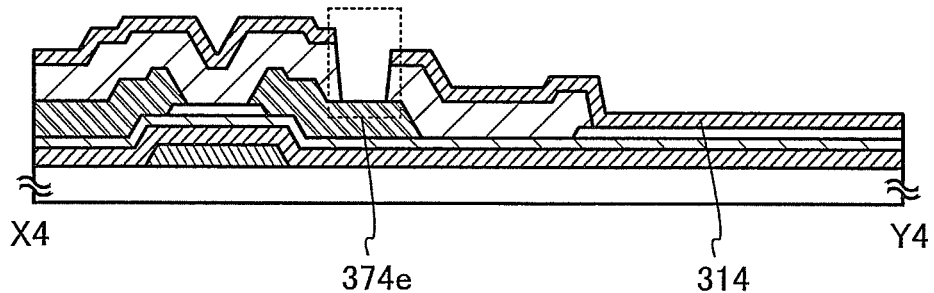

Next, the insulating layer 313 is formed over the insulating layers 305 and 312 and the semiconductor layer 308d (see FIGS. 11A to 11C).

The insulating layer 313 is a film formed using a material that can prevent an external impurity such as moisture, alkali metal, or alkaline earth metal, from diffusing into the oxide semiconductor layer, and further that contains hydrogen. Thus, when hydrogen contained in the insulating layer 313 diffuses into the semiconductor layer 308d, hydrogen is bonded to oxygen in the semiconductor layer 308d, thereby producing an electron serving as a carrier. As a result, the conductivity of the semiconductor layer 308d is increased, so that the semiconductor layer 308d becomes a conductive layer having a light-transmitting property.

In this embodiment, the process in which hydrogen is supplied from the insulating layer 313 in contact with the semiconductor layer 308d is described, but the present invention is not limited to this process. For example, a mask is formed in a region to serve as a channel formation region of a transistor, and a region not covered with the mask can be supplied with hydrogen. For example, an ion doping apparatus or the like can be used to introduce hydrogen into the semiconductor layer 308d. In addition, a conductive film having a light-transmitting property, for example, an ITO or the like, can be formed in advance over the semiconductor layer 308d. In that case, the conductive film having a light-transmitting property may be provided over part of the insulating layer 312 in which the opening portion 372b is not provided (i.e., between the insulating layer 312 and the insulating layer 313).

The insulating layer 313 can be formed of an insulating film containing hydrogen and having a thickness of from 150 nm to 400 nm, and for example, a silicon nitride film, a silicon nitride oxide film, or the like can be used. In this embodiment, a silicon nitride film having a thickness of 150 nm is used as the insulating layer 313.

The silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the semiconductor layers 308a, 308b, and 308c and the carrier density is increased is caused in some cases; therefore, the upper limit of the temperature is a temperature at which the phenomenon is not caused.

Then, the insulating layer 313 is processed into desired shapes so that the opening portions 374a, 374b, 374c, 374d, and 374e are formed. In addition, the insulating layer 313 serves as the insulating layer 314 where opening portions 374a, 374b, 374c, 374d, and 374e are formed. The insulating layer 314 and the opening portions 374a, 374b, 374c, 374d, and 374e can be formed in such a manner that a mask is formed in a desired region by fifth patterning and regions not covered by the mask are etched (see FIGS. 12A to 12C).

The opening portions 374a and 374c are formed so as to expose the conductive layers 304b and 304c. The opening portions 374b, 374d, and 374e are formed so as to expose the conductive layers 310c, 310d, and 310g. Note that in a region where the opening portion 374c is to be formed, an opening portion in which parts of the insulating layers 306 and 312 are removed may be formed in a manner similar to that of the opening portion 372a.

An example of a formation method of the opening portions 374a, 374b, 374c, 374d, and 374e includes, but not limited to, a dry etching method. Alternatively, a wet etching method or a combination of dry etching and wet etching can be employed for formation of the opening portions 374a, 374b, 374c, 374d, and 374e.

Figure 13A:
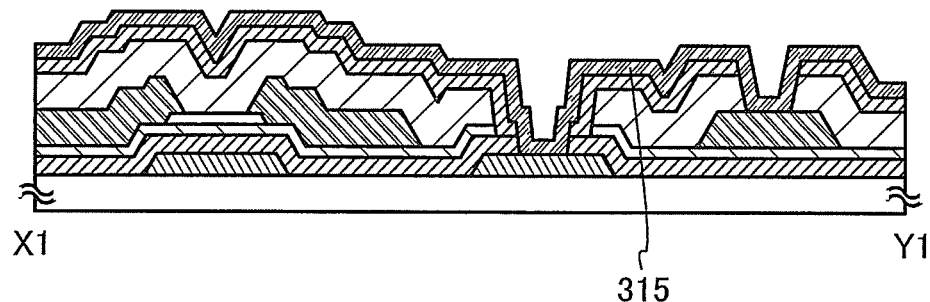
FIGS. 13A to 13C are cross-sectional views illustrating a method for manufacturing the display device.
Figure 13B:
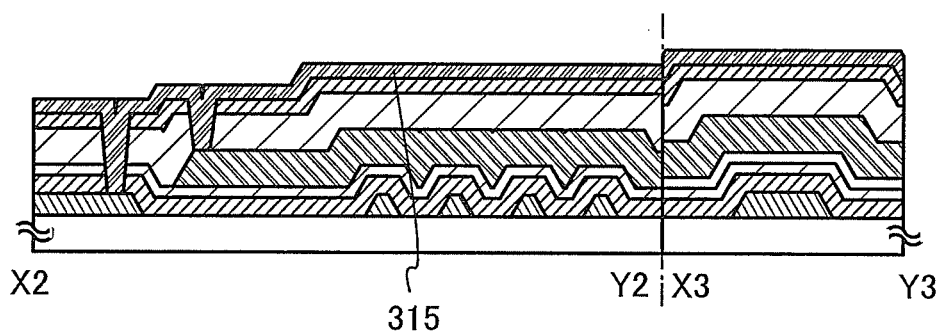
Figure 13C:
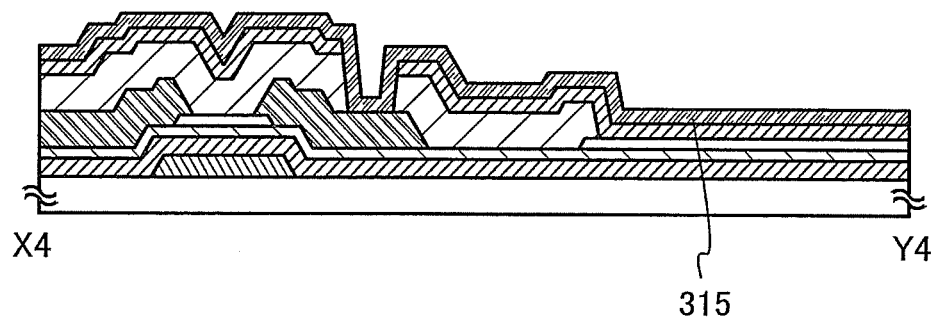
Figure 14A:
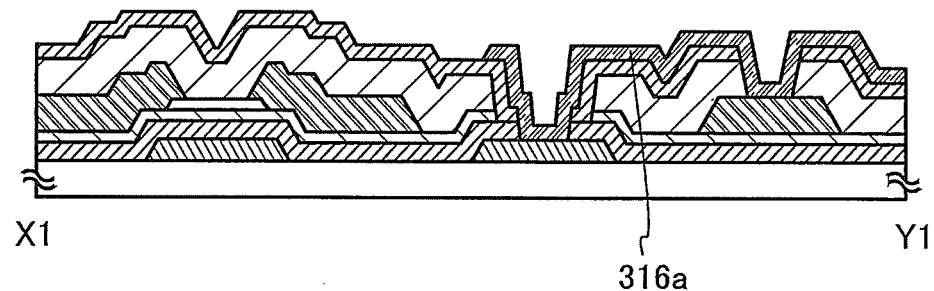
FIGS. 14A to 14C are cross-sectional views illustrating a method for manufacturing the display device.
Figure 14B:
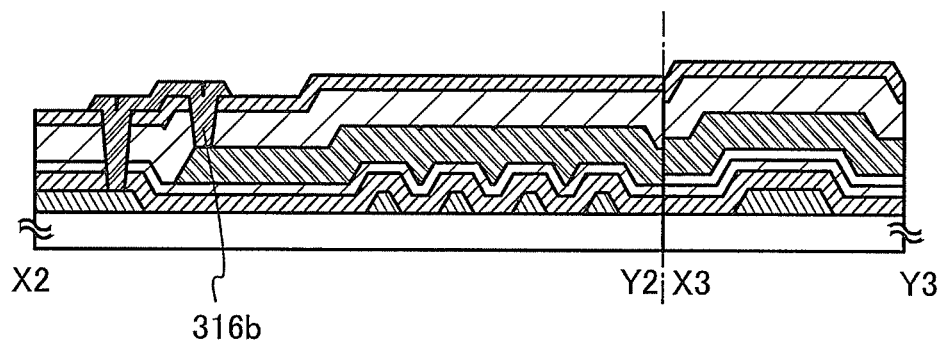
Figure 14C:
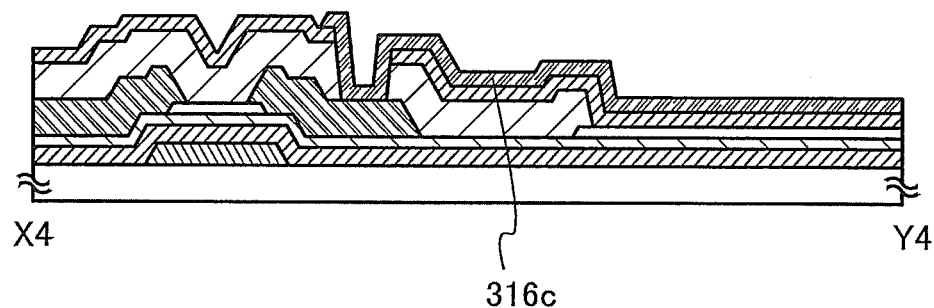
Figure 15A:
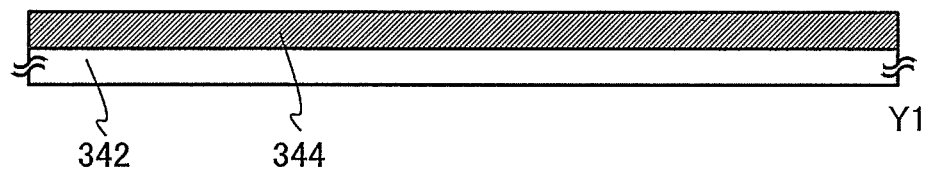
FIGS. 15A to 15C are cross-sectional views illustrating a method for manufacturing the display device.
Figure 15B:
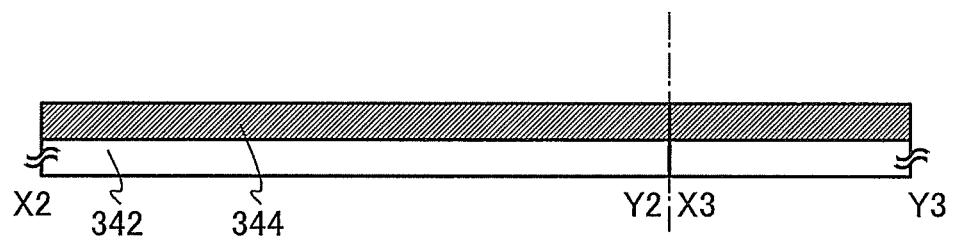
Figure 15C:
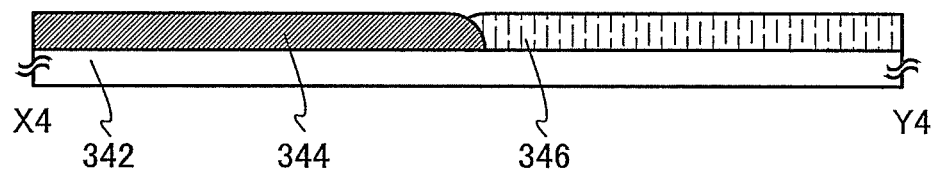

Then, a conductive layer 315 is formed over the insulating layer 314 so as to cover the insulating layer 314 and the opening portions 374a, 374b, 374c, 374d, and 374e (FIGS. 13A to 13C).

For the conductive layer 315, a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used. In addition, the conductive layer 315 can be formed by a sputtering method, for example.

Then, the conductive layer 315 is processed into desired shapes so that the conductive layers 316a, 316b, and 316c are formed. The conductive layers 316a, 316b, and 316c can be formed in such a manner that a mask is formed in a desired region by sixth patterning and regions not covered by the mask are etched (see FIGS. 14A to 14C).

Through the above process, the driver circuit portion 104 and the pixel portion 102 that include the transistors can be formed over one substrate, that is, the substrate 302. In the fabrication process described in this embodiment, the driver circuit portion, the transistors, the capacitor, and the like can be formed at the same time by the first to sixth patterning, that is, with the six masks.

Next, a structure that is formed over the substrate 342 provided to face the substrate 302 is described below.

First, the substrate 342 is prepared. For materials of the substrate 342, the materials that can be used for the substrate 302 can be referred to. Then, the light-shielding layer 344 and the coloring layer 346 are formed over the substrate 342 (see FIGS. 15A to 15C).

The light-shielding layer 344 preferably has a function of shielding light in a particular wavelength region, and can be a metal film or an organic insulating film including a black pigment.

The coloring layer 346 is a coloring layer having a function of transmitting light in a particular wavelength region. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with any of various materials by a printing method, an inkjet method, an etching method using a photolithography technique, or the like.

Figure 16A:
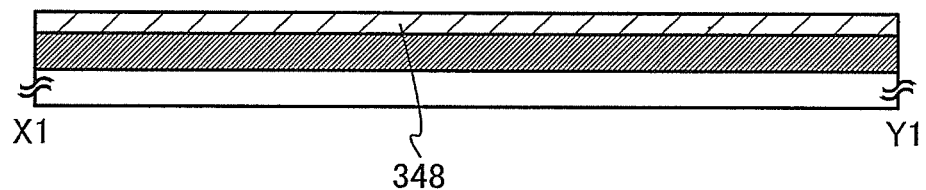
FIGS. 16A to 16C are cross-sectional views illustrating a method for manufacturing the display device.
Figure 16B:
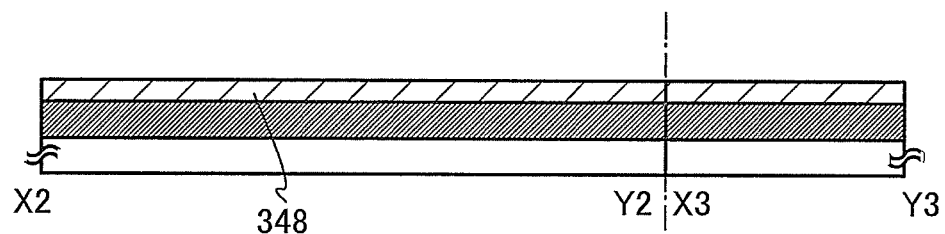
Figure 16C:
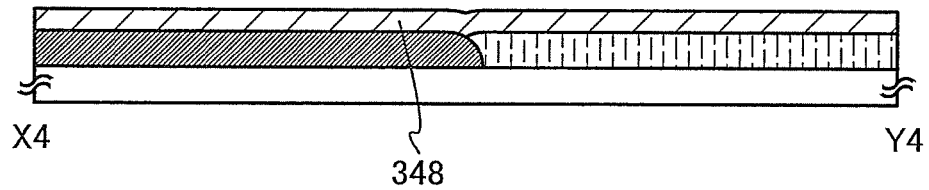

Then, the insulating layer 348 is formed over the light-shielding layer 344 and the coloring layer 346 (see FIGS. 16A to 16C).

For the insulating layer 348, an organic insulating film of an acrylic resin or the like can be used. With the insulating layer 348, an impurity or the like contained in the coloring layer 346 can be prevented from diffusing into the liquid crystal layer 320, for example. Note that the insulating layer 348 is not necessarily formed.

Figure 17A:
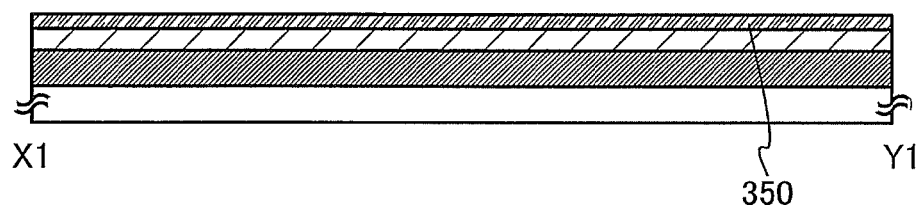
FIGS. 17A to 17C are cross-sectional views illustrating a method for manufacturing the display device.
Figure 17B:
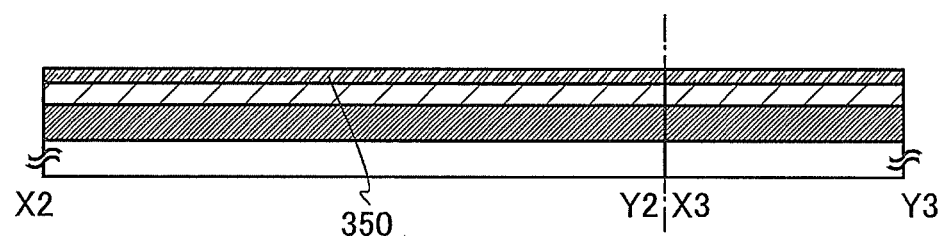
Figure 17C:
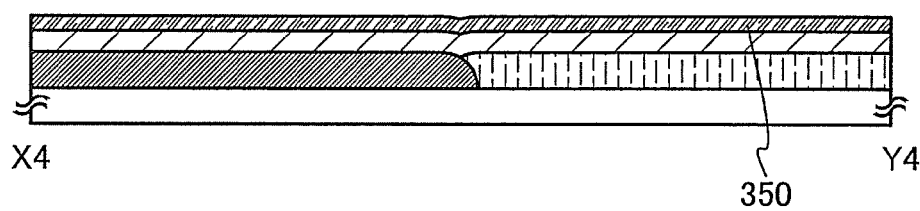

Then, the conductive layer 350 is formed over the insulating layer 348 (FIGS. 17A to 17C). As the conductive layer 350, a material that can be used for the conductive layer 315 can be used.

Through the above process, the structure formed over the substrate 342 can be formed.

Next, the alignment film 318 and the alignment film 352 are formed over the substrate 302 and the substrate 342 respectively, specifically, over the insulating layer 314 and the conductive layers 316a, 316b, and 316c formed over the substrate 302 and over the conductive layer 350 formed over the substrate 342. The alignment films 318 and 352 can be formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the display device illustrated in FIGS. 3A to 3C can be fabricated.

This embodiment can be combined with any of the other embodiments in this specification as appropriate.

(Embodiment 3)

In this embodiment, a modification example of the display device in Embodiment 1 is described with reference to FIGS. 18A to 18C, FIG. 19, and FIGS. 20A and 20B.

Figure 18A:
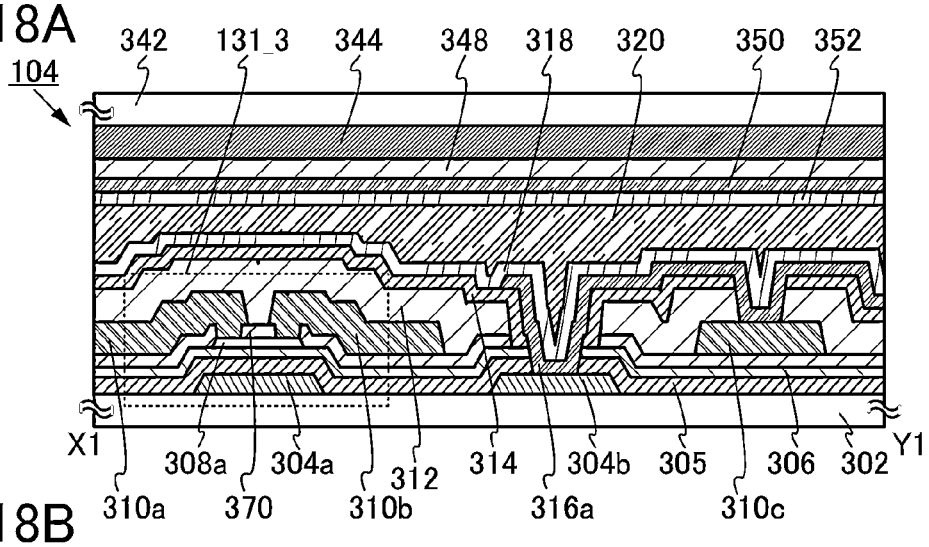
FIGS. 18A to 18C illustrate cross sections of a display device.
Figure 18B:
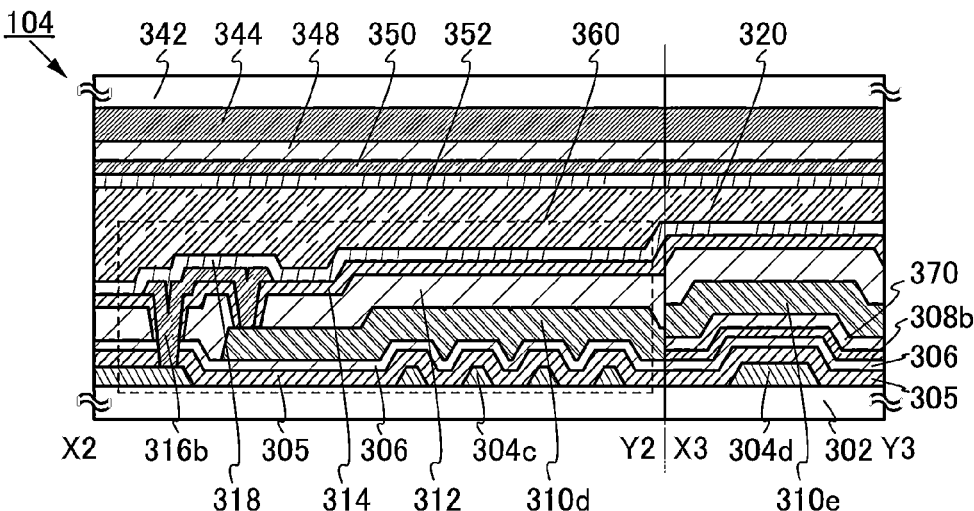
Figure 18C:
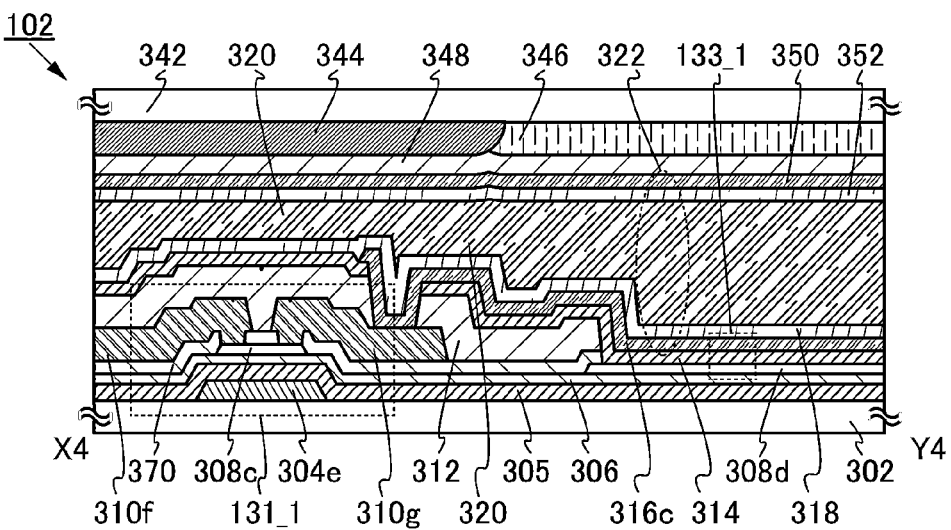

FIGS. 18A to 18C illustrate a modification example of the structure of FIGS. 3A to 3C in Embodiment 1. Note that portions similar to those in the above embodiments and portions having functions similar to those in the above embodiments are given the same reference numerals, and detailed description thereof is omitted.

FIG. 18A is a cross-sectional view corresponding to a section plane taken along dashed-dotted line X1-Y1 in FIG. 2A. FIG. 18B is a cross-sectional view corresponding to section planes taken along dashed-dotted lines X2-Y2 and X3-Y3 in FIG. 2B. FIG. 18C is a cross-sectional view corresponding to a section plane taken along dashed-dotted line X4-Y4 in FIG. 2C.

The driver circuit portion 104 shown in FIG. 18A includes the substrate 302; the conductive layers 304a and 304b formed over the substrate 302; the insulating layer 305 formed over the substrate 302 and the conductive layers 304a and 304b; the insulating layer 306 formed over the insulating layer 305; the semiconductor layer 308a formed over the insulating layer 306 and overlapping with the conductive layer 304a; an insulating layer 370 formed over the semiconductor layer 308a; the conductive layers 310a and 310b formed over the insulating layer 370 and the semiconductor layer 308a; the conductive layer 310c formed over the insulating layer 370; the insulating layer 312 formed so as to cover the semiconductor layer 308a and the conductive layer 310a, 310b, and 310c; the insulating layer 314 formed over the insulating layer 312; and the conductive layer 316a formed over the insulating layer 314.

Note that in the driver circuit portion 104 illustrated in FIG. 18A, the conductive layer 316a serves as a wiring that connects the conductive layer 304b to the conductive layer 310c. The conductive layer 304b is connected to the conductive layer 316a in an opening portion formed in the insulating layers 305, 306, 312, 314, and 370 and the conductive layer 310c is connected to the conductive layer 316a in the opening portion formed in the insulating layers 312 and 314.

Further, in the driver circuit portion 104 illustrated in FIG. 18A, the conductive layer 310a and the conductive layer 310b are connected to the semiconductor layer 308a through an opening portion formed in the insulating layer 370.

The driver circuit portion 104 illustrated in FIG. 18B includes the substrate 302, the conductive layers 304c and 304d formed over the substrate 302, the insulating layer 305 formed over the substrate 302 and the conductive layers 304c and 304d, the insulating layer 306 formed over the insulating layer 305 and overlapping with the conductive layer 304d, the semiconductor layer 308b formed over the insulating layer 306 and overlapping with the conductive layer 304d, the insulating layer 370 formed over the semiconductor layer 308b and overlapping with the conductive layer 304d, the conductive layer 310d formed over the insulating layer 306, the conductive layer 310e formed over the insulating layer 370, the insulating layer 312 formed to cover the insulating layer 306 and the conductive layers 310d and 310e, and the insulating layer 314 formed over the insulating layer 312. Further, the conductive layer 316b is formed over the insulating layer 314.

Note that in the driver circuit portion 104 illustrated in FIG. 18B, the conductive layer 316b serves as a wiring which connects the conductive layer 304c to the conductive layer 310d. The conductive layer 316b is connected to the conductive layer 310d in the opening portion formed in the insulating layers 305, 306, 312, 314, and 370 and the opening portion formed in the insulating layers 312 and 314.

In the driver circuit portion 104 illustrated in FIG. 18B, the induced electrostatic breakdown region 360 is formed in a manner similar to that of the driver circuit portion 104 illustrated in FIGS. 3A to 3C. The induced electrostatic breakdown region 360 has an effect similar to that described in Embodiment 1.

Further, in the driver circuit portion 104 illustrated in FIG. 18B, the insulating layer 305, the insulating layer 306, the semiconductor layer 308b, and the insulating layer 370 are provided between the conductive layer 304d and the conductive layer 310e. The semiconductor layer 308b and the insulating layer 370 are formed in addition to the insulating layer 305 and the insulating layer 306; thus, the distance between the conductive layer 304d and the conductive layer 310e can be increased. Hence, a parasitic capacitance which might be generated between the conductive layer 304d and the conductive layer 310e can be reduced. Further, by increasing the distance between the conductive layer 304d and the conductive layer 310e, the possibility that the conductive layer 304d and the conductive layer 310e are short-circuited can be reduced.

The pixel portion 102 illustrated in FIG. 18C includes the substrate 302, the conductive layer 304e formed over the substrate 302, the insulating layer 305 formed over the substrate 302 and the conductive layer 304e, the insulating layer 306 formed over the insulating layer 305, the semiconductor layer 308c formed over the insulating layer 306 and overlapping with the conductive layer 304e, the semiconductor layer 308d formed over the insulating layer 306, the insulating layer 370 formed over the semiconductor layer 308c, the conductive layers 310f and 310g formed over the insulating layer 370 and the semiconductor layer 308c, the insulating layer 312 formed to cover the insulating layer 370 and the conductive layers 310f and 310g, the insulating layer 314 formed over the insulating layer 312 and the semiconductor layer 308d, and the conductive layer 316c formed over the insulating layer 314 and connected to the conductive layer 310g.

The conductive layer 316c is connected to the conductive layer 310g in the opening portion formed in the insulating layers 312 and 314.

As described above, the display device illustrated in FIGS. 18A to 18C is different from the display device illustrated in FIGS. 3A to 3C in that the insulating layer 370 is formed. The insulating layer 370 can be formed in such a manner that, after the semiconductor layers 308a, 308b, 308c, and 308d are formed, an insulating layer is formed and processed. The insulating layer 370 can be formed using a material and a method which can be used for the insulating layer 312.

The insulating layer 370 can cover the semiconductor layers 308a and 308c. Further, the semiconductor layers 308a and 308c are connected to the conductive layers 310a, 310b, 310f, and 310g serving as source electrodes and drain electrodes, through an opening portion provided in the insulating layer 370. The semiconductor layers 308a and 308c are protected by the insulating layer 370 at the time of processing a conductive layer into the conductive layers serving as source electrodes and drain electrodes. Thus, the insulating layer 370 serves as a channel protection film.

Note that the display device illustrated in FIGS. 3A to 3C can be manufactured using six masks as described in Embodiment 2. On the other hand, the display device illustrated in FIGS. 18A to 18C can be manufactured using seven masks, i.e., the number of masks is increased by one.

Figure 19:
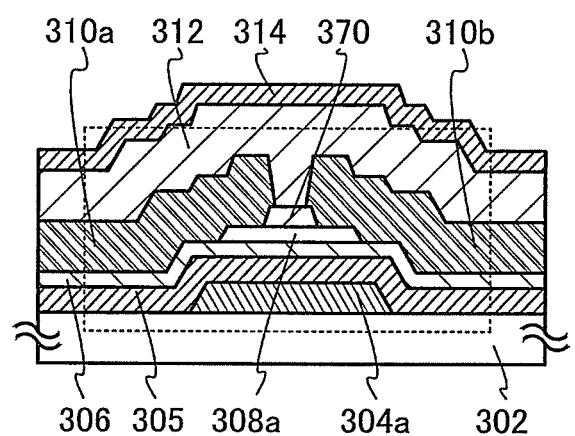
FIG. 19 illustrates a cross section of a transistor.

Although FIGS. 18A to 18C illustrate the case where the insulating layer 370 covers the semiconductor layer 308a and the semiconductor layer 308c in each of the transistors 131_3 and 131_1, one embodiment of the present invention is not limited thereto. For example, as illustrated in FIG. 19, the insulating layer 370 may be provided for only a channel formation region of a transistor. However, the structure illustrated in FIGS. 18A to 18C is preferable because of the following reason: the insulating layer 370 also covers a peripheral portion of each of the semiconductor layers 308a and 308c as shown in FIGS. 18A to 18C, and thus, the insulating layer 370 can protect the semiconductor layers 308a and 308c from an impurity or the like which can enter the semiconductor layers 308a and 308c.

Next, a display device illustrated in FIGS. 20A and 20B will be described below.

Figure 20A:
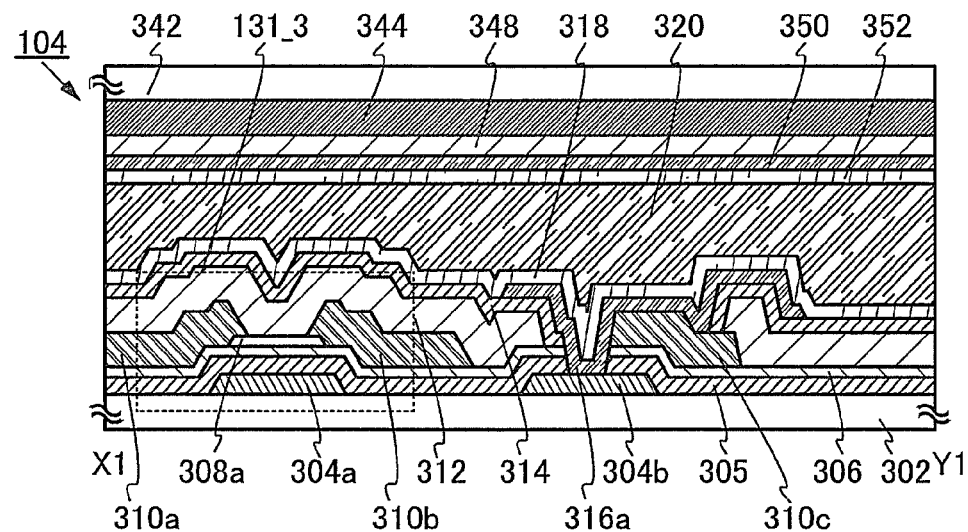
FIGS. 20A and 20B illustrate cross sections of a display device.
Figure 20B:
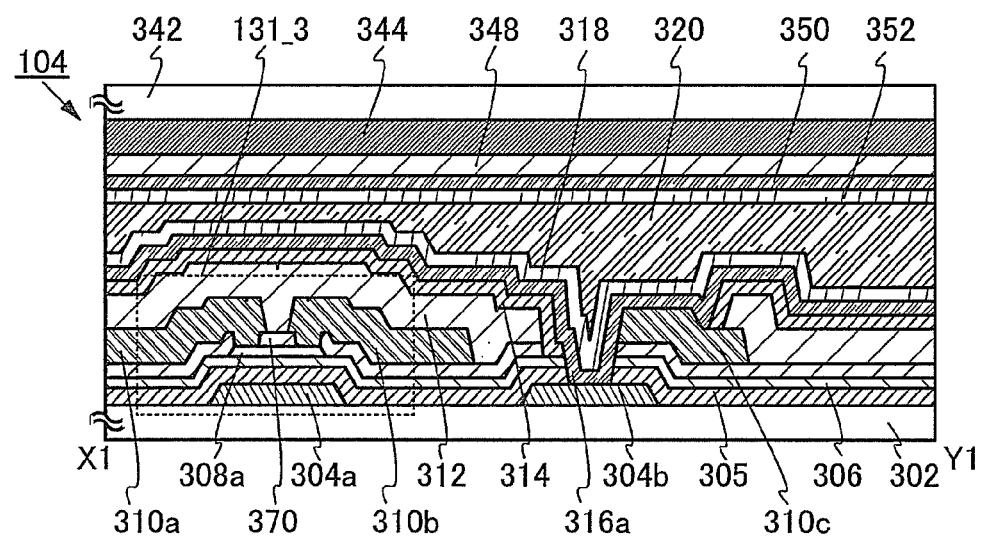

FIGS. 20A and 20B show modification examples of the structure illustrated in FIG. 3A of Embodiment 1. Note that portions similar to those in the above embodiments and portions having functions similar to those in above embodiments are given the same reference numerals, and detailed description thereof is omitted.

The driver circuit portion 104 illustrated in FIG. 20A is different from the driver circuit portion 104 illustrated in FIG. 3A in a method for connecting the conductive layer 304b to the conductive layer 310c. Specifically, in the driver circuit portion 104 illustrated in FIG. 20A, a part of the conductive layer 310c overlaps with a part of the conductive layer 304b. Further, the conductive layer 304b and the conductive layer 310c are connected to each other through the conductive layer 316a. When a part of the conductive layer 310c overlaps with a part of the conductive layer 304b in this manner, the area of the driver circuit portion can be reduced. For example, in the case where the driver circuit portion 104 illustrated in FIG. 20A is used for the gate driver 104a of FIG. 1A, the area of the gate driver 104a can be reduced.

The driver circuit portion 104 illustrated in FIG. 20B is different from the driver circuit portion 104 illustrated in FIG. 3A in having the insulating layer 370 and in a method for connecting the conductive layer 304b to the conductive layer 310c. The insulating layer 370 in FIG. 20B has a function and an effect which are similar to those of the insulating layer 370 illustrated in FIGS. 18A to 18C. The method for connecting the conductive layer 304b to the conductive layer 310c has a function and an effect which are similar to those of the connection method illustrated in FIG. 20A.

As described above, in a display device of this embodiment, an induced electrostatic breakdown region is provided in a driver circuit portion. The induced electrostatic breakdown region has an insulating film between a wiring formed in the same step as a gate electrode and a wiring formed in the same step as a source electrode and a drain electrode. The thickness of the insulating film is made small, i.e., the distance between the wirings is shortened, whereby the electrostatic breakdown can be inhibited from occurring in an insulating film between other wiring patterns. Further, in the induced electrostatic breakdown region, the wiring formed in the same step as the gate electrode has a comb-like shape, and thus, overcurrent which can occur by ESD flows easily in the wiring.

Thus, by one embodiment of the present invention, the display device including the induced electrostatic breakdown region in the driver circuit portion is provided; thus, a novel display device having high reliability can be provided.

The structure described in this embodiment can be used in appropriate combination with the structure described in any of the other embodiments.

(Embodiment 4)

In this embodiment, a modification example of the induced electrostatic breakdown region 360 in Embodiment 1 is described with reference to FIGS. 21A to 21C.

In Embodiment 1, a structure in which the induced electrostatic breakdown region 360 is formed in the driver circuit portion 104 is described. In this embodiment, a structure in which the induced electrostatic breakdown region is formed in a peripheral portion of the display device is described.

Figure 21A:
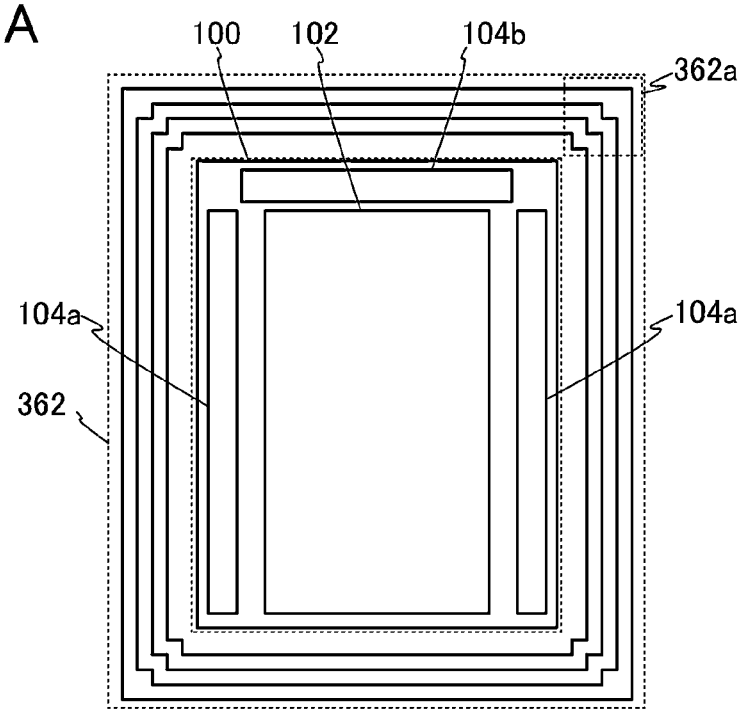
FIG. 21A is a top view of a display device.

FIG. 21A is a top view schematically showing the display device and a peripheral portion of the display device. FIG. 21B is an enlarged top view schematically showing an induced electrostatic breakdown region 362a in FIG. 21A. FIG. 21C corresponds to a cross-sectional view taken along line X5-Y5 in FIG. 21B.

In FIG. 21A, the pixel portion 102, the gate driver 104a, and the source driver 104b are formed in the display device 100. Further, a guard ring 362 including a plurality of wirings is formed in the peripheral portion of the display device 100. The guard ring 362 includes the induced electrostatic breakdown region 362a.

The guard ring 362 is formed in the peripheral portion of the display device 100 as illustrated in FIG. 21A. Thus, the display device 100 can be protected from overcurrent due to ESD or the like which might be generated in a manufacturing process of the display device 100. For example, when overcurrent is generated in a manufacturing process of the display device 100, the guard ring 362 serves as an antenna, and the overcurrent is possibly applied to the guard ring 362. Thus, with the guard ring 362, the display device 100 can be protected from overcurrent due to ESD or the like.

Figure 21B:
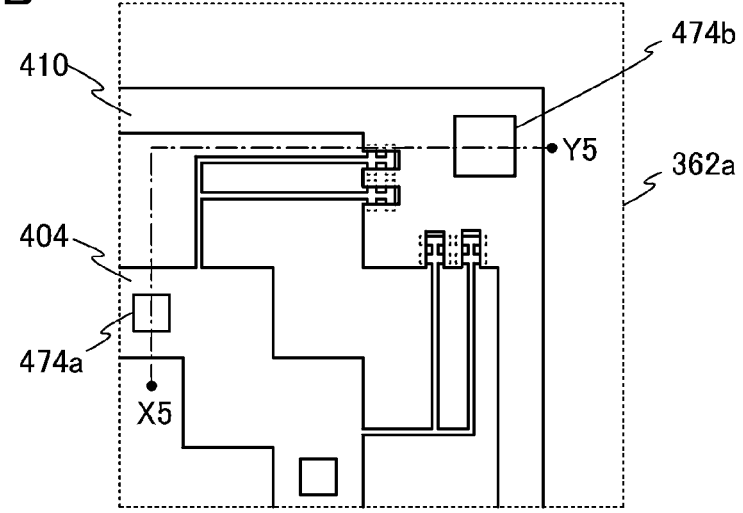
FIG. 21B is a top view of a peripheral portion of the display device.
Figure 21C:
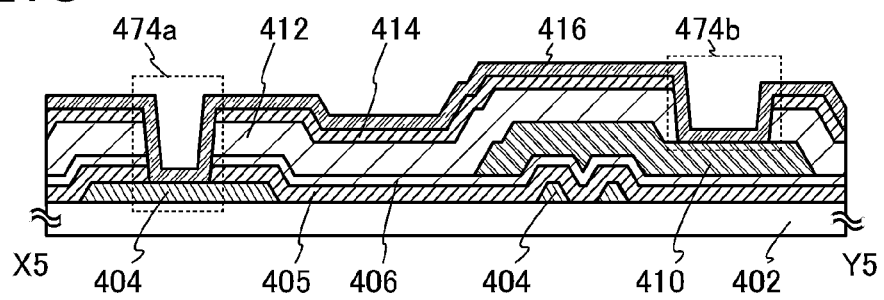
FIG. 21C illustrates a cross section of the peripheral portion of the display device.

FIG. 21B is an enlarged top view of the induced electrostatic breakdown region 362a formed in the guard ring 362. The induced electrostatic breakdown region 362a is described below with reference to FIGS. 21A to 21C.

The induced electrostatic breakdown region 362a includes a substrate 402, a conductive layer 404 formed over the substrate 402, an insulating layer 405 formed over the substrate 402 and the conductive layer 404, an insulating layer 406 formed over the insulating layer 405, a conductive layer 410 formed over the insulating layer 406, an insulating layer 412 formed over the insulating layer 406 and the conductive layer 410, an insulating layer 414 formed over the insulating layer 412, and a conductive layer 416 formed over the insulating layer 414.

A material that can be used for the substrate 302 described in any of the above embodiments can be used for the substrate 402. A material that can be used for the conductive layer 304a described in any of the above embodiments can be used for the substrate 404. A material that can be used for the insulating layer 305 described in any of the above embodiments can be used for the substrate 405. A material that can be used for the insulating layer 306 described in any of the above embodiments can be used for the insulating layer 406. A material that can be used for the conductive layer 310a described in any of the above embodiments can be used for the conductive layer 410. A material that can be used for the insulating layer 312 described in any of the above embodiments can be used for the insulating layer 412. A material that can be used for the insulating layer 314 described in any of the above embodiments can be used for the insulating layer 414. A material that can be used for the conductive layer 316a described in any of the above embodiments can be used for the conductive layer 416.

The induced electrostatic breakdown region 362a includes an opening portion 474a and an opening portion 474b. In the opening portion 474a, parts of the insulating layers 405, 406, 412, and 414 are removed and the conductive layer 404 is exposed. In the opening portion 474b, the conductive layer 410 is exposed by removal of parts of the insulating layers 412 and 414. Further, the conductive layer 404 and the conductive layer 410 are connected to each other through the conductive layer 416 formed over the opening portions 474a and 474b and the insulating layer 414.

Note that in this embodiment, the conductive layer 416 covers an entire top portion of the induced electrostatic breakdown region 362a. However, one embodiment of the present invention is not limited thereto. For example, the conductive layer 416 may be formed only over parts of the opening portions 474a and 474b, or it is possible not to provide the conductive layer 416. The guard ring 362 and the induced electrostatic breakdown region 362a included in the guard ring 362 are formed in the peripheral portion of the display device 100, and thus, there is no direct effect on the display device 100. Hence, a practitioner can select an optimum structure of a method for connecting the conductive layer 404 to the conductive layer 410, top surface shapes of the conductive layer 404 and the conductive layer 410, and the like, as appropriate.

Further, the induced electrostatic breakdown region 362a has an advantageous effect similar to that of the induced electrostatic breakdown region 360 described in Embodiment 1.

As described above, in this embodiment, the induced electrostatic breakdown region is formed in the peripheral portion of the display device. Thus, a novel display device capable of having high reliability can be provided.

The structure described in this embodiment can be used in appropriate combination with the structure described in any of the other embodiments.

(Embodiment 5)

In this embodiment, a circuit configuration that can be used for the pixel circuit portion 108 illustrated in FIG. 1A is described with reference to FIGS. 22A and 22B. Note that portions having functions similar to those in the above embodiments are given the same reference numerals, and detailed description thereof is omitted.

Figure 22A:
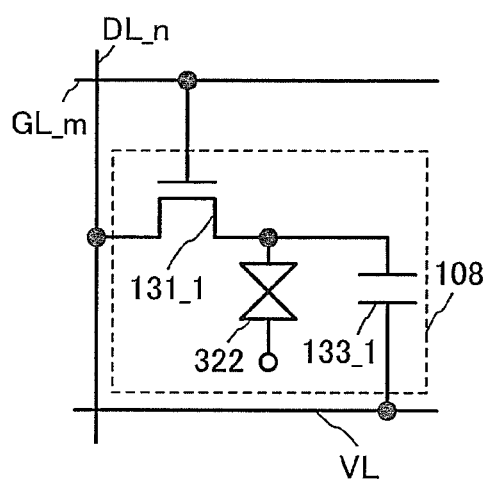
FIGS. 22A and 22B are circuit diagrams each illustrating a pixel circuit that can be used in a display device.

The pixel circuit portion 108 illustrated in FIG. 22A includes a liquid crystal element 322, a transistor 131_1, and a capacitor 133_1.

The potential of one of a pair of electrodes of the liquid crystal element 322 is set in accordance with the specifications of the pixel circuit portion 108 as appropriate. The alignment state of the liquid crystal element 322 depends on written data. A common potential may be supplied to one of the pair of electrodes of the liquid crystal element 322 included in each of a plurality of pixel circuit portions 108. Further, the potential supplied to one of a pair of electrodes of the liquid crystal element 322 in the pixel circuit portion 108 in one row may be different from the potential supplied to one of a pair of electrodes of the liquid crystal element 322 in the pixel circuit portion 108 in another row.

As examples of a driving method of the display device including the liquid crystal element 322, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA (multi-domain vertical alignment) mode, a PVA (patterned vertical alignment) mode, an IPS mode, an FFS mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel circuit portion 108 in the m-th row and the n-th column, one of a source and a drain of the transistor 131_1 is electrically connected to the data line DL_n, and the other is electrically connected to the other of a pair of electrodes of the liquid crystal element 322. A gate of the transistor 131_1 is electrically connected to the scan line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a potential supply line VL), and the other is electrically connected to the other of the pair of electrodes of the liquid crystal element 322. The potential of the potential supply line VL is set in accordance with the specifications of the pixel circuit 111 as appropriate. The capacitor 133_1 functions as a storage capacitor for storing written data.

For example, in the display device including the pixel circuit portion 108 in FIG. 22A, the pixel circuit portions 108 are sequentially selected row by row by the gate driver 104a, whereby the transistors 131_1 are turned on and a data signal is written.

When the transistors 131_1 are turned off, the pixel circuit portions 108 in which the data has been written are brought into a holding state. This operation is sequentially performed row by row; thus, an image is displayed.

Figure 22B:
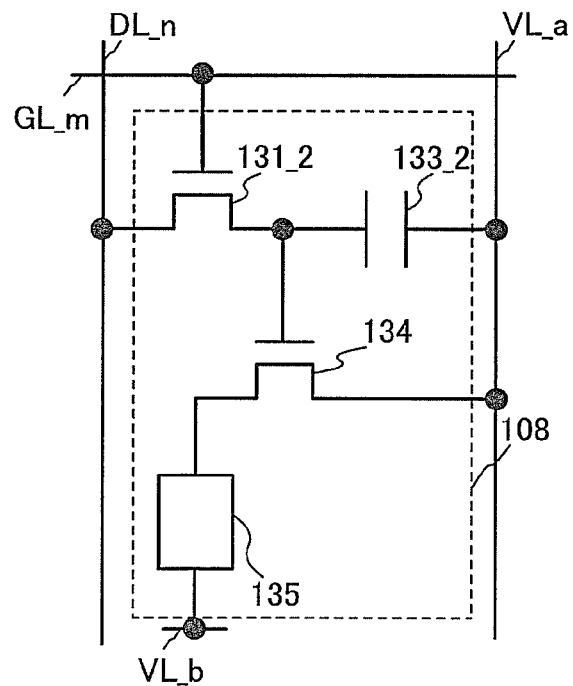

The pixel circuit portion 108 illustrated in FIG. 22B includes a transistor 131_2, a capacitor 133_2, a transistor 134, and a light-emitting element 135.

One of a source and a drain of the transistor 131_2 is electrically connected to a wiring to which a data signal is supplied (hereinafter referred to as a data line DL_n). A gate of the transistor 131_2 is electrically connected to a wiring to which a gate signal is supplied (hereinafter referred to as a scan line GL_m).

The transistor 131_2 has a function of controlling whether to write a data signal by being turned on or off.

One of a pair of electrodes of the capacitor 133_2 is electrically connected to a wiring to which power is supplied (power supply line VL_a), and the other is electrically connected to the other of the source and the drain of the transistor 131_2.

The capacitor 133_2 functions as a storage capacitor for storing written data.

One of a source and a drain of the transistor 134 is electrically connected to the power supply line VL_a. Further, a gate of the transistor 134 is electrically connected to the other of the source and the drain of the transistor 131_2.

One of an anode and a cathode of the light-emitting element 135 is electrically connected to a power supply line VL_b, and the other is electrically connected to the other of the source and the drain of the transistor 134.

As the light-emitting element 135, an organic electroluminescent element (also referred to as an organic EL element) or the like can be used, for example. Note that the light-emitting element 135 is not limited to organic EL elements; an inorganic EL element including an inorganic material can be used.

A high power supply potential VDD is supplied to one of the power supply line VL_a and the power supply line VL_b, and a low power supply potential VSS is supplied to the other.

In the display device including the pixel circuit portion 108 in FIG. 22B, the pixel circuit portions 108 are sequentially selected row by row by the gate driver 104a, whereby the transistors 131_2 are turned on and a data signal is written.

When the transistors 131_2 are turned off, the pixel circuit portions 108 in which the data has been written are brought into a holding state. Further, the amount of current flowing between the source and the drain of the transistor 134 is controlled in accordance with the potential of the written data signal. The light-emitting element 135 emits light with a luminance corresponding to the amount of flowing current. This operation is sequentially performed row by row; thus, an image is displayed.

Note that in this specification and the like, a display element, a display device which is a device including a display element, a light-emitting element, and a light-emitting device which is a device including a light-emitting element can employ various modes or can include various elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, an electrowetting element, a grating light valve (GLV), a plasma display panel (PDP), a micro electro mechanical system (MEMS), a digital micromirror device (DMD), a digital micro shutter (DMS), MIRASOL (registered trademark) an interferometric modulator display (IMOD), a piezoelectric ceramic display, or a carbon nanotube, which are display media whose contrast, luminance, reflectivity, transmittance, or the like is changed by electromagnetic action. Note that examples of a display device having an EL element include an EL display and the like. Examples of a display device having an electron emitter include a field emission display (FED), an SED-type flat panel display (SED: surface-conduction electron-emitter display), and the like. Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display) and the like. Examples of a display device having an electronic ink or an electrophoretic element include electronic paper.

Examples of an EL element are an element including an anode, a cathode, and an EL layer interposed between the anode and the cathode, and the like. Examples of an EL layer include, but are not limited to, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer including an organic material, a layer including an inorganic material, a layer including an organic material and an inorganic material, a layer including a high-molecular material, a layer including a low-molecular material, a layer including a high-molecular material and a low-molecular material, and the like. Further, various types of EL elements can be used as well as these examples.

An example of liquid crystal elements is an element where transmission and non-transmission of light is controlled by optical modulation action of liquid crystals. The element can be configured to include a pair of electrodes and a liquid crystal layer. The optical modulation action of liquid crystal is controlled by an electric field applied to the liquid crystal (including a lateral electric field, a vertical electric field and a diagonal electric field). Note that specifically, the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

For example, display of electronic paper can be performed using molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specifically, examples of a display method of electronic paper are microcapsule electrophoresis, horizontal electrophoresis, vertical electrophoresis, a spherical twisting ball, a magnetic twisting ball, a columnar twisting ball, a charged toner, an electron powder and granular material, magnetic electrophoresis, a magnetic thermosensitive type, electro wetting, light-scattering (transparent-opaque change), a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, flexible organic EL, and the like. Note that the present invention is not limited to these examples, and various electronic paper and display methods can be used as electronic paper and a display method thereof. Here, with the use of microcapsule electrophoresis, aggregation and precipitation of phoresis particles can be prevented. Electro liquid powder has advantages such as high-speed response, high reflectivity, wide viewing angle, low power consumption, and memory properties.

The structure described in this embodiment can be used in appropriate combination with the structure described in any of the other embodiments.

(Embodiment 6)

In this embodiment, the structure of a transistor that can be used in the pixel circuit portion 102 and the driver circuit portion 104 of the display device illustrated in FIG. 1A of Embodiment 1 will be described below with reference to FIGS. 23A to 23D.

Figure 23A:
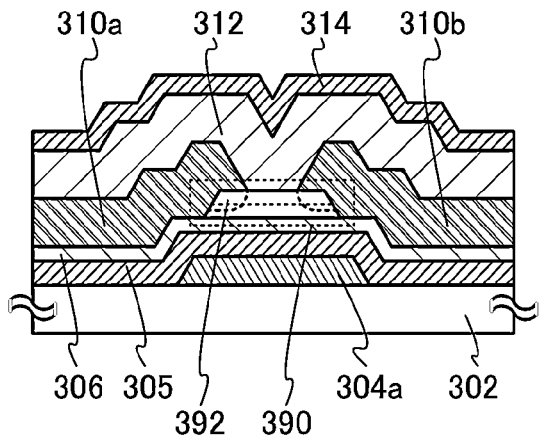
FIGS. 23A and 23B are cross-sectional views of a transistor.

The transistor illustrated in FIG. 23A includes the conductive layer 304a over the substrate 302, insulating layers 305 and 306 over the substrate 302 and the conductive layer 304a, an oxide stack 390 over the insulating layer 306, and conductive layers 310a and 310b over the insulating layer 306 and the oxide stack 390. The transistor illustrated in FIG. 23A may further be provided with the insulating layers 312 and 314 over the transistor, specifically, over the oxide stack 390 and the conductive layers 310a and 310b.

Note that depending on the kind of a conductive film used for the conductive layers 310a and 310b, oxygen is removed from part of the oxide stack 390 or a mixed layer is formed so that n-type regions 392 are formed in the oxide stack 390 in some cases. In FIG. 23A, the n-type regions 392 can be formed in regions of the oxide stack 390 which are in the vicinity of the interface with the conductive layers 310a and 310b. The n-type regions 392 can function as source and drain regions.

In the transistor illustrated in FIG. 23A, the conductive layer 304a functions as a gate electrode, the conductive layer 310a functions as one of a source electrode and a drain electrode, and the conductive layer 310b functions as the other of the source electrode and the drain electrode.

In the transistor illustrated in FIG. 23A, the distance in a region of the oxide stack 390 which overlaps with the conductive layer 304a and is between the conductive layer 310a and the conductive layer 310b is referred to as a channel length. A channel formation region refers to a region of the oxide stack 390 which overlaps with the conductive layer 304a and is sandwiched between the conductive layer 310a and the conductive layer 310b. Further, a channel refers to a region through which current mainly flows in the channel formation region.

Here, the oxide stack 390 will be described in detail with reference to FIG. 23B.

Figure 23B:
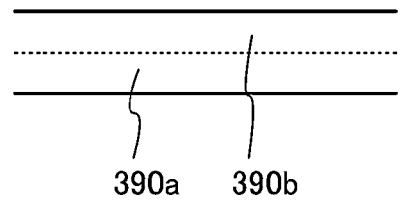

FIG. 23B is an enlarged view of a region of the oxide stack 390 which is surrounded by broken line in FIG. 23A. The oxide stack 390 includes an oxide semiconductor layer 390a and an oxide layer 390b.

The oxide semiconductor layer 390a preferably includes a layer represented by an In—M—Zn oxide (M is an element such as Al, Ga, Ge, Y, Zr, Sn, La, Ce, or Hf) that contains at least indium (In), zinc (Zn), and M. The oxide semiconductor materials, the formation method, and the like that can be used for the semiconductor layer 308a described in the above embodiment can be referred to for those of the oxide semiconductor layer 390a.

The oxide layer 390b contains one or more kinds of elements contained in the oxide semiconductor layer 390a. The energy at the bottom of the conduction band of the oxide layer 390b is located closer to the vacuum level than that of the oxide semiconductor layer 390a by 0.05 eV or more, 0.07 eV or more, 0.1 eV or more, or 0.15 eV or more and 2 eV or less, 1 eV or less, 0.5 eV or less, or 0.4 eV or less. In this case, when an electric field is applied to the conductive layer 304a functioning as a gate electrode, a channel is formed in the oxide semiconductor layer 390a in the oxide stack 390 of which energy at the bottom of the conduction band is lowest. In other words, the oxide layer 390b is placed between the oxide semiconductor layer 390a and the insulating layer 312, whereby the channel of the transistor can be formed in the oxide semiconductor layer 390a not in contact with the insulating layer 312. Since the oxide layer 390b contains one or more elements contained in the oxide semiconductor layer 390a, interface scattering is unlikely to occur at the interface between the oxide semiconductor layer 390a and the oxide layer 390b. Thus, transfer of carriers is not inhibited between the oxide semiconductor layer 390a and the oxide layer 390b, resulting in an increase in the field-effect mobility of the transistor. Moreover, an interface state is less likely to be formed between the oxide semiconductor layer 390a and the oxide layer 390b. When an interface state is formed between the oxide semiconductor layer 390a and the oxide layer 390b, a second transistor in which the interface between the oxide semiconductor layer 390a and the oxide layer 390b serves as a channel and which has different threshold voltage from the transistor is formed and the apparent threshold voltage of the transistor varies in some cases. Thus, with the oxide layer 390b, fluctuation in the electrical characteristics of the transistors, such as threshold voltage, can be reduced.

As the oxide layer 390b, an oxide layer that is represented by an In—M—Zn oxide (M is an element such as Al, Ti, Ga, Ge, Y, Zr, Sn, La, Ce, or Hf) and contains a larger amount of M in an atomic ratio than that in the oxide semiconductor layer 390a is used. Specifically, the amount of any of the above elements in the oxide layer 390b in an atomic ratio is one and a half times or more, preferably twice or more, more preferably three times or more as high as that in the oxide semiconductor layer 390a in an atomic ratio. Any of the above elements is more strongly bonded to oxygen than indium, and thus has a function of suppressing generation of oxygen vacancies in the oxide layer. In other words, the oxide layer 390b is an oxide layer in which oxygen vacancies are less likely to be generated than in the oxide semiconductor layer 390a.

That is to say, when each of the oxide semiconductor layer 390a and the oxide layer 390b is an In—M—Zn oxide containing at least indium, zinc, and m, the oxide semiconductor layer 390a has an atomic ratio of In to M and Zn which is $x_1:y_1:z_1$, and the oxide layer 390b has an atomic ratio of In to M and Zn which is $x_2:y_2:z_2$, $y_1/x_1$ is preferably larger than $y_2/x_2$. $y_1/x_1$ is one and a half times or more as large as $y_2/x_2$, preferably two times or more, more preferably three times or more as large as $y_2/x_2$. At this time, when $y_2$ is larger than $x_2$ in the oxide semiconductor layer 390a, the transistor can have stable electrical characteristics. However, when $y_2$ is three times or more as large as $x_2$, the field-effect mobility of the transistor is reduced; accordingly, $y_z$ is preferably smaller than three times $x_2$.

When the oxide semiconductor layer 390a is an In—M—Zn oxide, the atomic ratio of In to M when summation of In and M is assumed to be 100 atomic % is preferably as follows: the proportion of In is higher than or equal to 25 atomic % and the proportion of M is lower than 75 atomic %; more preferably, the proportion of In is higher than or equal to 34 atomic % and the proportion of M is lower than 66 atomic %. When an In—M—Zn oxide is used as the oxide layer 390b, the atomic ratio of In to M when summation of In and M is assumed to be 100 atomic % is preferably as follows: the proportion of In is lower than 50 atomic % and the proportion of M is higher than or equal to 50 atomic %; more preferably, the proportion of In is lower than 25 atomic % and the proportion of M is higher than or equal to 75 atomic %.

For the oxide semiconductor layer 390a and the oxide layer 390b, an oxide semiconductor containing indium, zinc, and gallium can be used. Specifically, the oxide semiconductor layer 390a can be formed using an In—Ga—Zn oxide whose atomic ratio of In to Ga and Zn is 1:1:1, an In—Ga—Zn oxide whose atomic ratio of In to Ga and Zn is 3:1:2, or an oxide having a composition in the neighborhood of any of the above atomic ratios. The oxide layer 390b can be formed using an In—Ga—Zn oxide whose atomic ratio of In to Ga and Zn is 1:3:2, an In—Ga—Zn oxide whose atomic ratio of In to Ga and Zn is 1:6:4, an In—Ga—Zn oxide whose atomic ratio of In to Ga and Zn is 1:9:6, or an oxide having a composition in the neighborhood of any of the above atomic ratios.

The thickness of the oxide semiconductor layer 390a is greater than or equal to 3 nm and less than or equal to 200 nm, preferably greater than or equal to 3 nm and less than or equal to 100 nm, more preferably greater than or equal to 3 nm and less than or equal to 50 nm. The thickness of the oxide layer 390b is greater than or equal to 3 nm and less than or equal to 100 nm, preferably greater than or equal to 3 nm and less than or equal to 50 nm.

Next, the band structure of the oxide stack 390 will be described with reference to FIGS. 23C and 23D.

For example, the oxide semiconductor layer 390a was formed using an In—Ga—Zn oxide having an energy gap of 3.15 eV, and the oxide layer 390b was formed using an In—Ga—Zn oxide having an energy gap of 3.5 eV. The energy gaps were measured using a spectroscopic ellipsometer (UT-300 manufactured by HORIBA JOBIN YVON S.A.S.).

The energy gap between the vacuum level and the top of the valence band (also called ionization potential) of the oxide semiconductor layer 390a and the energy gap therebetween of the oxide layer 390b were 8 eV and 8.2 eV, respectively. Note that the energy gap between the vacuum level and the top of the valence band was measured with an ultraviolet photoelectron spectrometer (UPS) (VersaProbe (registered trademark) manufactured by ULVAC-PHI, Inc.).

Thus, the energy gap between the vacuum level and the bottom of the conduction band (also called electron affinity) of the oxide semiconductor layer 390a and the energy gap therebetween of the oxide layer 390b were 4.85 eV and 4.7 eV, respectively.

Figure 23C:
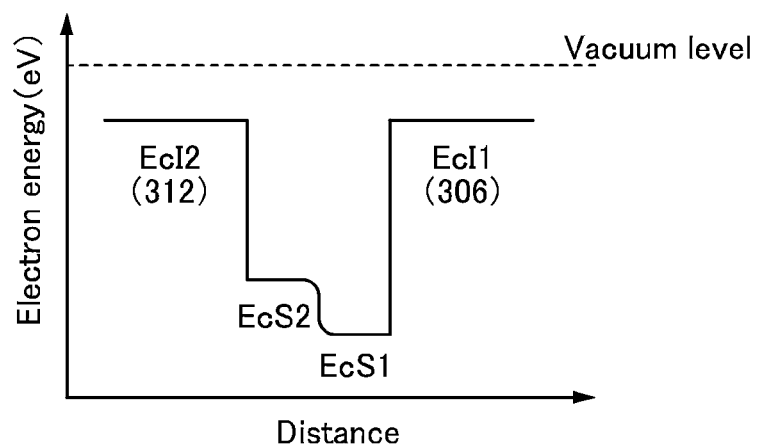
FIGS. 23C and 23D are diagrams illustrating oxide stacks.

FIG. 23C schematically illustrates a part of the band structure of the oxide stack 390. Here, the case where a silicon oxide film is provided in contact with the oxide stack 390 will be described. In FIG. 23C, EcI1 denotes the energy of the bottom of the conduction band in the silicon oxide film; EcS1 denotes the energy of the bottom of the conduction band in the oxide semiconductor layer 390a; EcS2 denotes the energy of the bottom of the conduction band in the oxide layer 390b; and EcI2 denotes the energy of the bottom of the conduction band in the silicon oxide film. Further, EcI1 corresponds to the insulating layer 306 in FIG. 23A, and EcI2 corresponds to the insulating layer 312 in FIG. 23B.

As shown in FIG. 23C, there is no energy barrier between the oxide semiconductor layer 390a and the oxide layer 390b, and the energy level of the bottom of the conduction band is changed smoothly, or continuously. This is because the oxide stack 390 contains an element contained in the oxide semiconductor layer 390a and oxygen is transferred between the oxide semiconductor layer 390a and the oxide layer 390b, so that a mixed layer is formed.

As shown in FIG. 23C, the oxide semiconductor layer 390a in the oxide stack 390 serves as a well and a channel region of the transistor including the oxide stack 390 is formed in the oxide semiconductor layer 390a. Note that since the energy of the bottom of the conduction band of the oxide stack 390 is continuously changed, it can be said that the oxide semiconductor layer 390a and the oxide layer 390b are continuous.

Although trap levels due to impurities or defects might be formed in the vicinity of the interface between the oxide layer 390b and the insulating layer 312 as shown in FIG. 23C, the oxide semiconductor layer 390a can be distanced from the trap levels owing to existence of the oxide layer 390b. However, when the energy gap between EcS1 and EcS2 is small, electrons in the oxide semiconductor layer 390a might reach the trap level over the energy gap. When the electrons are captured by the trap level, they become negative fixed charge, so that the threshold voltage of the transistor is shifted in the positive direction. Therefore, it is preferable that the energy difference between EcS1 and EcS2 be 0.1 eV or more, more preferably 0.15 eV or more because a change in the threshold voltage of the transistor is prevented and stable electrical characteristics are obtained.

Figure 23D:
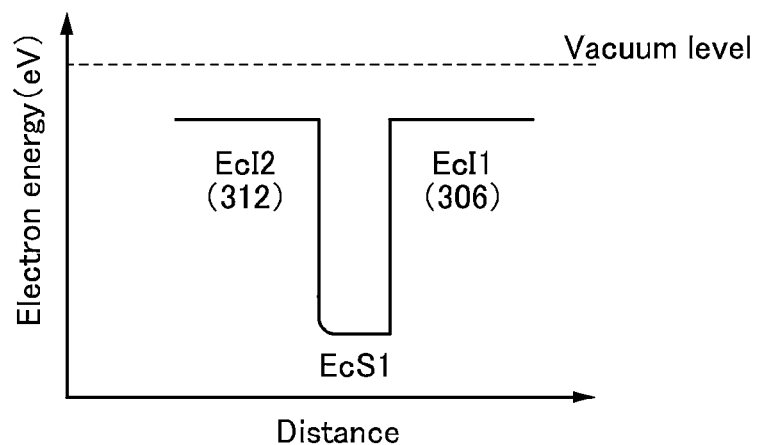

FIG. 23D schematically illustrates a part of the band structure of the oxide stack 390, which is a modification example of the band structure shown in FIG. 23C. Here, the case where a silicon oxide film is provided in contact with the oxide stack 390 will be described. In FIG. 23D, EcI1 denotes the energy of the bottom of the conduction band in the silicon oxide film; EcS1 denotes the energy of the bottom of the conduction band in the oxide semiconductor layer 390a; and EcI2 denotes the energy of the bottom of the conduction band in the silicon oxide film. Further, EcI1 corresponds to the insulating layer 306 in FIG. 23A, and EcI2 corresponds to the insulating layer 312 in FIG. 23A.

In the transistor illustrated in FIG. 23A, an upper portion of the oxide stack 390, that is, the oxide layer 390b is etched in some cases in formation of the conductive layers 310a and 310b. However, a mixed layer of the oxide semiconductor layer 390a and the oxide layer 390b is formed on the top surface of the oxide semiconductor layer 390a in some cases in formation of the oxide layer 390b.

For example, when the oxide semiconductor layer 390a is an In—Ga—Zn oxide whose atomic ratio of In to Ga and Zn is 1:1:1 or an In—Ga—Zn oxide whose atomic ratio of In to Ga and Zn is 3:1:2, and the oxide layer 390b is an In—Ga—Zn oxide whose atomic ratio of In to Ga and Zn is 1:3:2 or an In—Ga—Zn oxide whose atomic ratio of In to Ga and Zn is 1:6:4, the Ga content in the oxide layer 390b is higher than that in the oxide semiconductor layer 390a. Thus, a GaOx layer or a mixed layer whose Ga content is higher than that in the oxide semiconductor layer 390a can be formed on the top surface of the oxide semiconductor layer 390a.

For that reason, even in the case where the oxide layer 390b is etched, the energy of the bottom of the conduction band of EcS1 on the EcI2 side is increased and the band structure shown in FIG. 23D is shown in some cases.

This embodiment can be combined with any of the other embodiments described in this specification, as appropriate.

(Embodiment 7)

In this embodiment, a touch sensor that can be combined with a display device of one embodiment of the present invention and a display module will be described with reference to FIGS. 24A and 24B, FIG. 25, and FIG. 26.

Figure 24A:
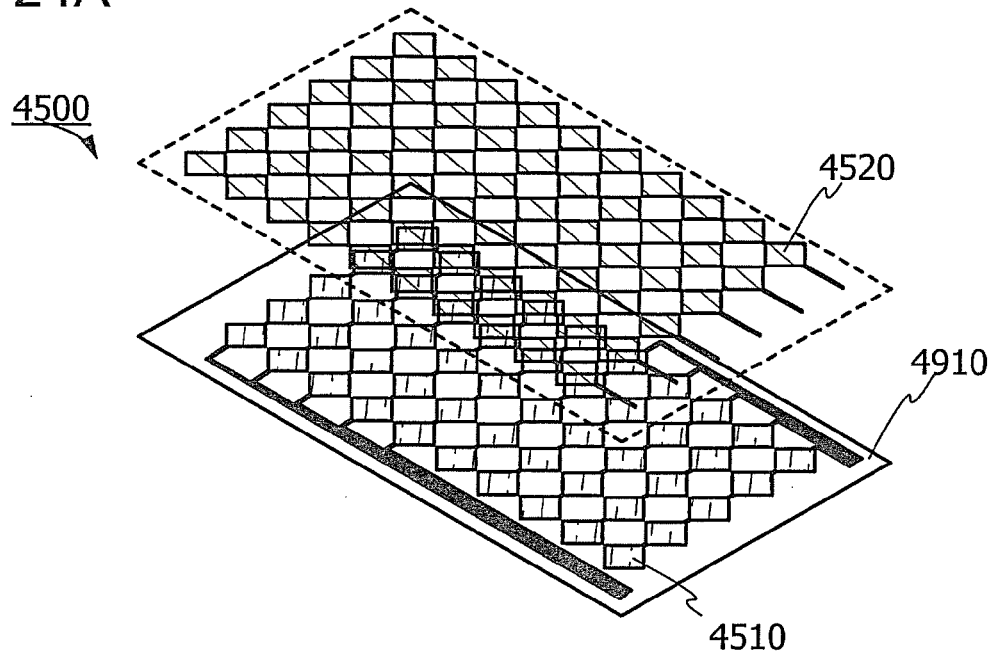
FIGS. 24A and 24B each illustrate a touch sensor.
Figure 24B:
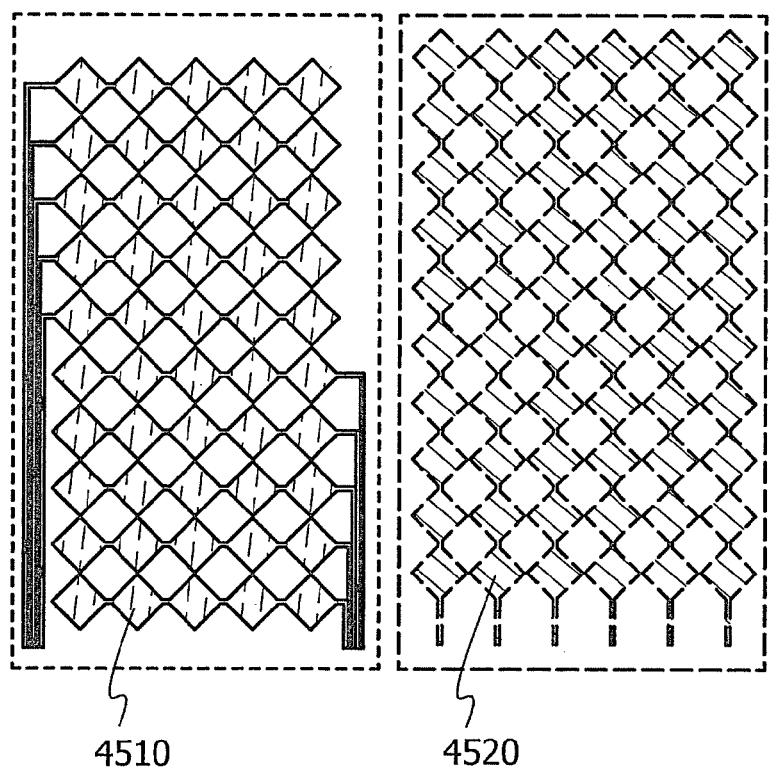
Figure 25:
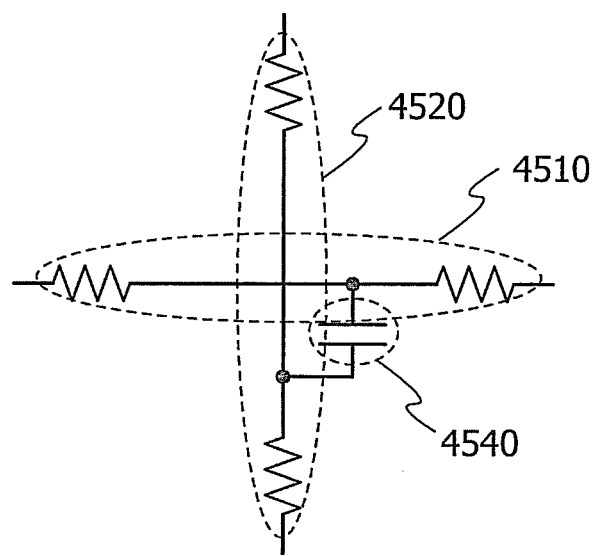
FIG. 25 is a circuit diagram illustrating a touch sensor.

FIG. 24A is an exploded perspective view of a structural example of a touch sensor 4500. FIG. 24B is a plan view of a structural example of an electrode of the touch sensor 4500. FIG. 25 is a cross-sectional view of a structural example of the touch sensor 4500.

The touch sensor 4500 illustrated in FIGS. 24A and 24B includes, over a substrate 4910, a plurality of conductive layers 4510 arranged in the X-axis direction and a plurality of conductive layers 4520 arranged in the Y-axis direction intersecting with the X-axis direction. In FIGS. 24A and 24B, a plan view of the plurality of conductive layers 4510 of the touch sensor 4500 and a plan view of the plurality of conductive layers 4520 of the touch sensor 4500 are separately illustrated.

FIG. 25 is an equivalent circuit diagram of an intersection portion of the conductive layer 4510 and the conductive layer 4520 of the touch sensor 4500 illustrated in FIGS. 24A and 24B. As illustrated in FIG. 25, a capacitor 4540 is formed at the intersection portion of the conductive layer 4510 and the conductive layer 4520.

The plurality of conductive layers 4510 and the plurality of conductive layers 4520 have structures in each of which a plurality of quadrangular conductive films are connected to each other. The plurality of conductive layers 4510 and the plurality of conductive layers 4520 are provided so that the quadrangular conductive films of the plurality of conductive layers 4510 do not overlap with the quadrangular conductive films of the plurality of conductive layers 4520. At the intersection portion of the conductive layer 4510 and the conductive layer 4520, an insulating film is provided between the conductive layer 4510 and the conductive layer 4520 to prevent the conductive layers 4510 and 4520 from being in contact with each other.

Figure 26:
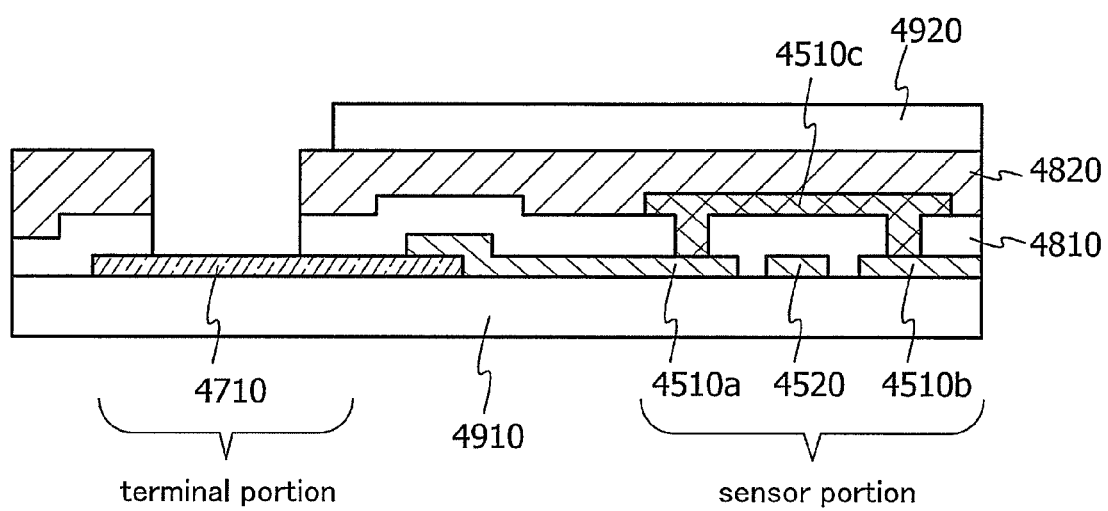
FIG. 26 is a cross-sectional view of a touch sensor.

FIG. 26 is a cross-sectional view illustrating an example of a connection structure of the conductive layers 4510 and the conductive layer 4520 of the touch sensor 4500 in FIGS. 24A and 24B. FIG. 26 illustrates, as an example, a cross-sectional view of a portion where the conductive layers 4510 (conductive layers 4510a, 4510b, and 4510c) intersects with the conductive layer 4520.

As illustrated in FIG. 26, the conductive layers 4510 include the conductive layer 4510a and the conductive layer 4510b in the first layer and the conductive layer 4510c in the second layer over an insulating layer 4810. The conductive layer 4510a and the conductive layer 4510b are connected by the conductive layer 4510c. The conductive layer 4520 is formed using the conductive film in the first layer. An insulating layer 4820 is formed to cover the conductive layers 4510 and 4520 and an electrode 4710. As the insulating layers 4810 and 4820, silicon oxynitride films may be formed, for example. A base film formed using an insulating film may be provided between the substrate 4910, and the conductive layers 4510 and the electrode 4710. As the base film, for example, a silicon oxynitride film can be formed.

The conductive layers 4510 and the conductive layer 4520 are formed using conductive materials that transmit visible light, such as indium tin oxide containing silicon oxide, indium tin oxide, zinc oxide, indium zinc oxide, or zinc oxide to which gallium is added.

The conductive layer 4510a is connected to the electrode 4710. A terminal for connection to an FPC is formed using the electrode 4710. Like the conductive layers 4510, the conductive layer 4520 is connected to the electrode 4710. The electrode 4710 can be formed of a tungsten film, for example.

The insulating layer 4820 is formed to cover the conductive layers 4510, 4520 and the electrode 4710. An opening portion is formed in the insulating layers 4810 and 4820 over the electrode 4710 to connect the electrode 4710 and the FPC electrically. A substrate 4920 is attached to the insulating layer 4820 using an adhesive, an adhesive film, or the like. The substrate 4910 side is bonded to a color filter substrate of a display panel with an adhesive or an adhesive film, so that a touch panel is formed.

Next, a display module that can be formed using a display device of one embodiment of the present invention will be described with reference to FIG. 27.

Figure 27:
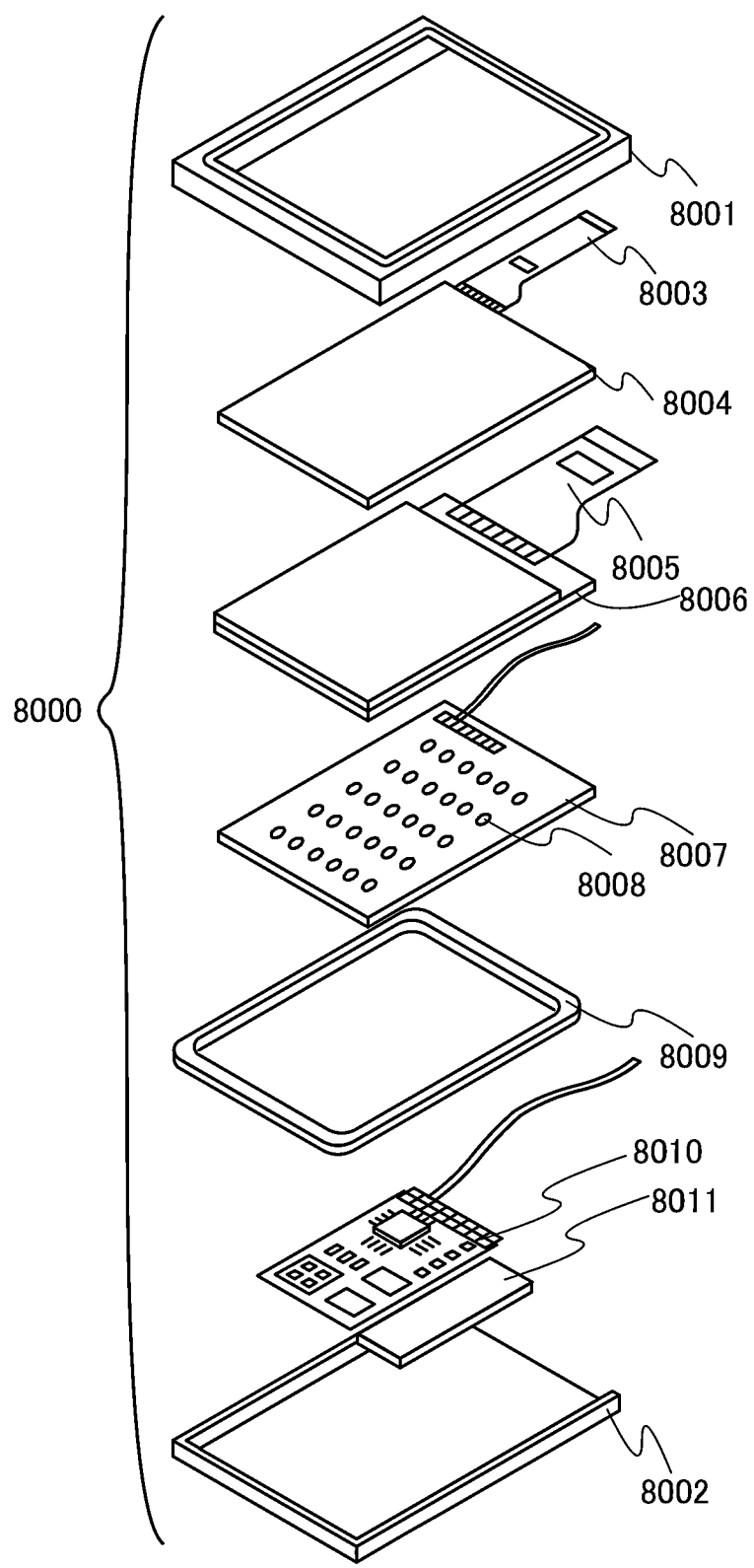
FIG. 27 illustrates a display module using a display device in accordance with one embodiment of the present invention.

In a display module 8000 in FIG. 27, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The shapes and sizes of the upper cover 8001 and the lower cover 8002 can be freely changed depending on the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to make an optical touch panel.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 may be omitted in the case of using a commercial power source.

The display module 8000 can be additionally provided with a member such as a polarizing plate, a retardation plate, or a prism sheet.

The structure and the like in this embodiment can be combined with any structure in the other embodiments as appropriate.

(Embodiment 8)

In this embodiment, examples of electronic devices will be described.

FIGS. 28A to 28H and FIGS. 29A to 29D each illustrate an electronic device. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 28A:
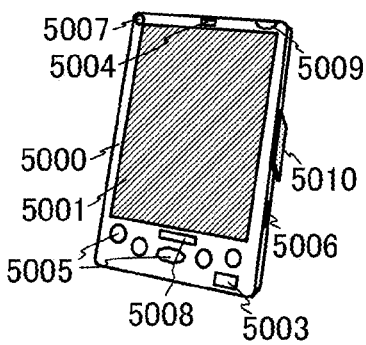
FIGS. 28A to 28H each illustrate an electronic device using a display device in accordance with one embodiment of the present invention.
Figure 28B:
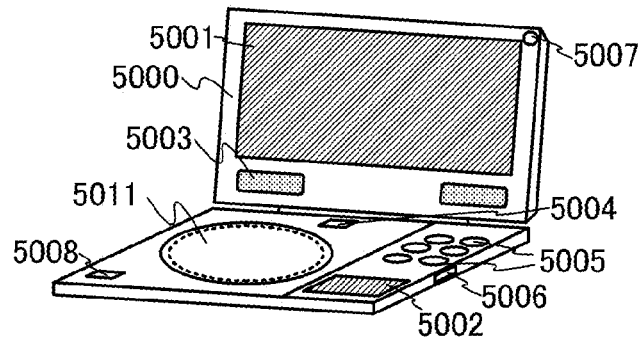
Figure 28C:
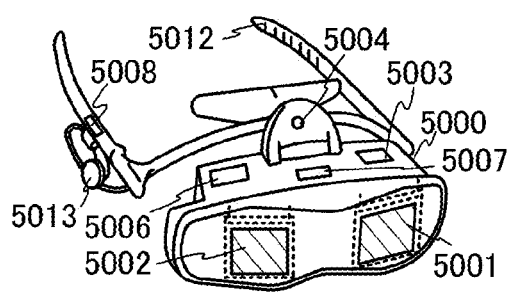
Figure 28D:
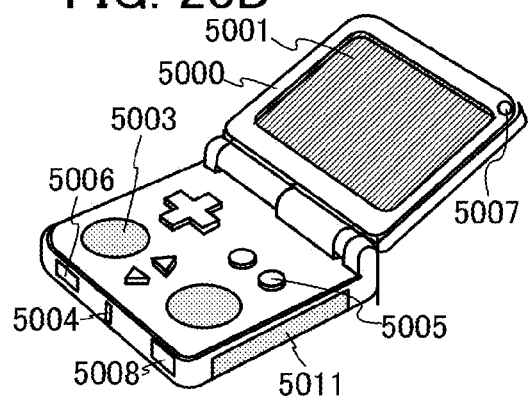
Figure 28E:
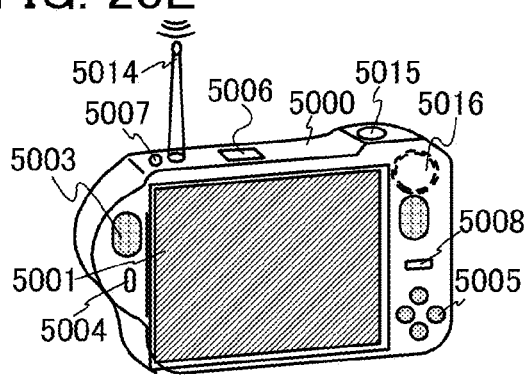
Figure 28F:
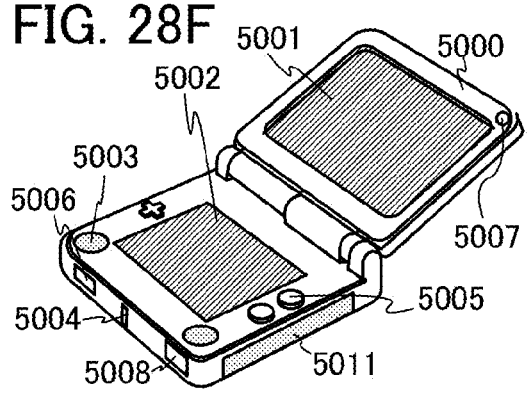
Figure 28G:
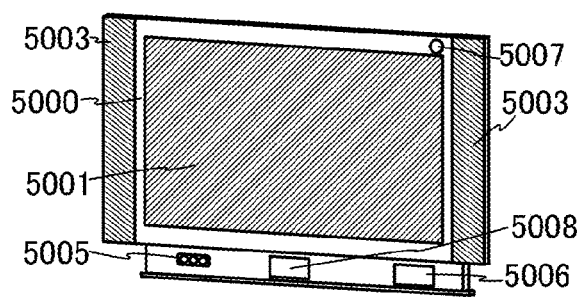
Figure 28H:
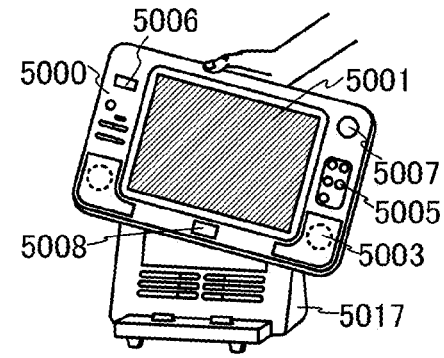
Figure 29A:
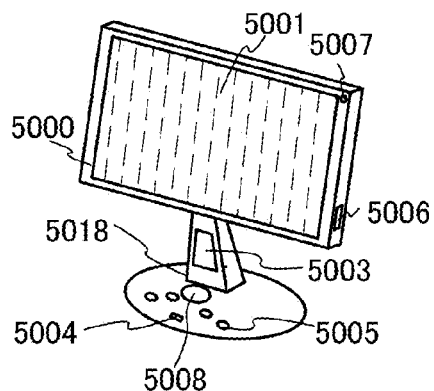
FIGS. 29A to 29H each illustrate an electronic device using a display device in accordance with one embodiment of the present invention.
Figure 29B:
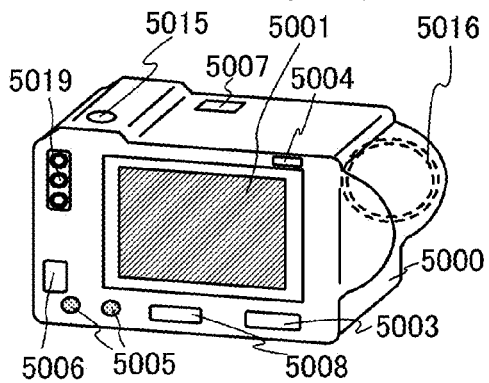
Figure 29C:
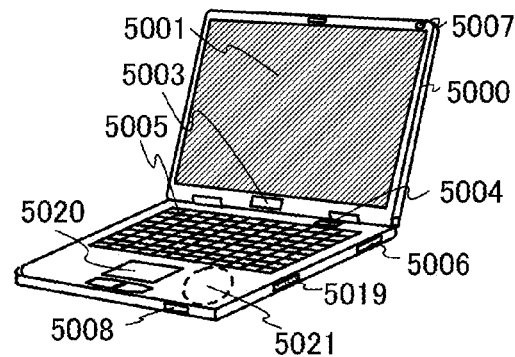
Figure 29D:
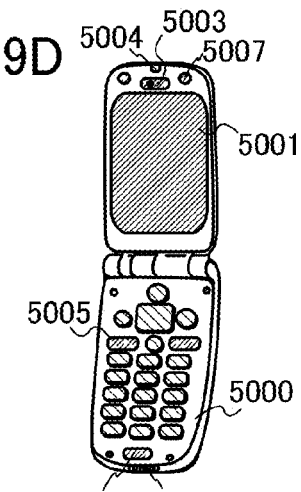

FIG. 28A illustrates a mobile computer which can include a switch 5009, an infrared port 5010, and the like in addition to the above components. FIG. 28B illustrates a portable image reproducing device (e.g., a DVD player) provided with a memory medium, and the image reproducing device can include a second display portion 5002, a memory medium reading portion 5011, and the like in addition to the above components. FIG. 28C illustrates a goggle-type display which can include the second display portion 5002, a support 5012, an earphone 5013, and the like in addition to the above components. FIG. 28D illustrates a portable game machine which can include the recording medium reading portion 5011 and the like in addition to the above objects. FIG. 28E illustrates a digital camera with a television reception function which can include an antenna 5014, a shutter button 5015, an image reception portion 5016, and the like in addition to the above objects. FIG. 28F illustrates a portable game machine which can include the second display portion 5002, the memory medium reading portion 5011, and the like in addition to the above objects. FIG. 28G illustrates a television receiver which can include a tuner, an image processing portion, and the like in addition to the above objects. FIG. 28H illustrates a portable television receiver which can include a charger 5017 capable of transmitting and receiving signals and the like in addition to the above objects. FIG. 29A illustrates a display which can include a support base 5018 and the like in addition to the above objects. FIG. 29B illustrates a camera which can include an external connection port 5019, a shutter button 5015, an image reception portion 5016, and the like in addition to the above components. FIG. 29C illustrates a computer which can include a pointing device 5020, the external connecting port 5019, a reader/writer 5021, and the like in addition to the above objects. FIG. 29D illustrates a mobile phone which can include a transmitter, a receiver, a tuner of one-segment partial reception service for mobile phones and mobile terminals, and the like in addition to the above components.

The electronic devices illustrated in FIGS. 28A to 28H and FIGS. 29A to 29D can have a variety of functions. For example, a function of displaying a variety of information (a still image, a moving image, a text image, and the like) on a display portion, a touch panel function, a function of displaying a calendar, date, time, and the like, a function for controlling a process with a variety of software (programs), a wireless communication function, a function of connecting to a variety of computer networks with a wireless communication function, a function of transmitting and receiving a variety of data with a wireless communication function, a function of reading program or data stored in a memory medium and displaying the program or data on a display portion, and the like can be given. Further, an electronic device including a plurality of display portions can have a function of displaying image information mainly on one display portion while displaying text information on another display portion, a function of displaying a three-dimensional image by displaying images on a plurality of display portions with a parallax taken into account, or the like. Furthermore, an electronic device including an image receiver portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on the display portion, or the like. Note that functions which can be provided for the electronic devices illustrated in FIGS. 28A to 28H and FIGS. 29A to 29D are not limited to the above-described functions, and the electronic devices can have a variety of functions.

The electronic devices described in this embodiment each include the display portion for displaying some sort of information.

Next, applications of a display device are described.

Figure 29E:
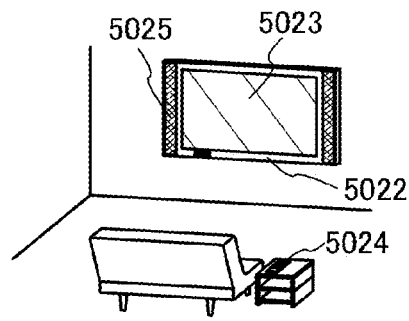

FIG. 29E illustrates an example in which the display device is set up so as to be unified with a building structure. FIG. 29E illustrates a housing 5022, a display portion 5023, a remote controller 5024 as an operation portion, a speaker 5025, and the like. The display device is incorporated in the building as a wall-hanging type, so that the display device can be provided without requiring a wide space.

Figure 29F:
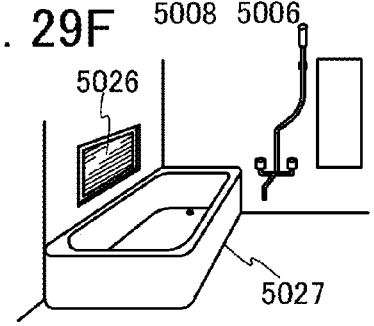

FIG. 29F illustrates another example in which a display device is set up so as to be unified with a building structure. A display module 5026 is incorporated in a prefabricated bath unit 5027, so that a bather can view the display module 5026.

Note that although the wall and the prefabricated bath are given as examples of the building structure in this embodiment, the display device can be provided in a variety of building structures without being limited to the example in this embodiment.

Next, examples in which the display device is set up so as to be unified with moving objects are described.

Figure 29G:
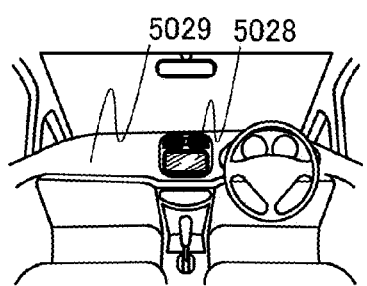

FIG. 29G illustrates an example in which the display device is incorporated in a car. A display module 5028 is attached to a body 5029 of the car and can display information on the operation of the car or information input from the inside or outside of the car on demand. Note that a navigation function may be provided.

Figure 29H:
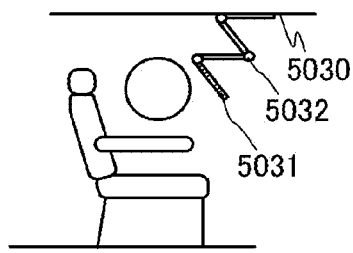

FIG. 29H illustrates an example in which the display device is set up so as to be unified with a passenger airplane. FIG. 29H illustrates a usage pattern in the case where a display module 5031 is provided for a ceiling 5030 above a seat of the passenger airplane. The display module 5031 is unified with the ceiling 5030 by a hinge portion 5032, and a passenger can view the display module 5031 by stretching of the hinge portion 5032. The display module 5031 has a function of displaying information by the operation of the passenger.

Note that although this embodiment gives the body of the vehicle and the body of the plane as non-limiting examples of the moving body, the display device can be provided for a variety of moving bodies such as a two-wheel motor vehicle, a four-wheel vehicle (including a car, bus, and the like), a train (including a monorail, a railway, and the like), and a ship.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Thus, for example, in a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like, it is possible to take out part of the diagram or the text and constitute one embodiment of the invention. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted.

The structure and the like in this embodiment can be combined with any structure in the other embodiments as appropriate.

(Embodiment 9)

This embodiment describes a radiation image detecting device capable of obtaining a radiation image for medical use, as an example of a semiconductor device including the transistor described in any of the above embodiments. A flat-type radiation image detecting device capable of converting radiation into digital data directly is referred to as a flat panel detector (FPD).

Figure 31A:
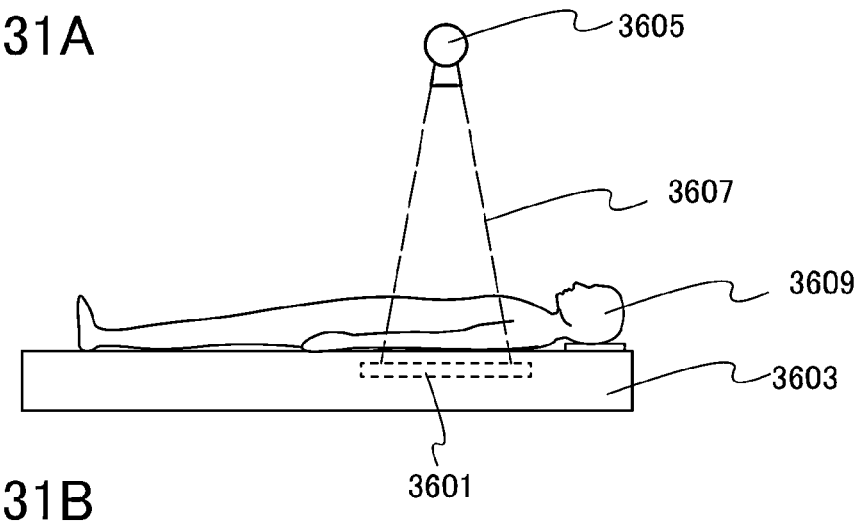
FIGS. 31A and 31B illustrate a radiation image detecting device.

As shown in FIG. 31A, a radiation image detecting device 3601 is provided in a table 3603 used in radiation imaging. Radiation 3607 emitted from a radiation source 3605 passes through a subject 3609 and then reaches the radiation image detecting device 3601. In the radiation image detecting device 3601, the radiation 3607 transmitted through the subject 3609 can be detected by a radiation detecting element; thus, image data can be obtained. Examples of the radiation 3607 which can be detected in the radiation image detecting device 3601 include X-rays and gamma rays.

Figure 31B:
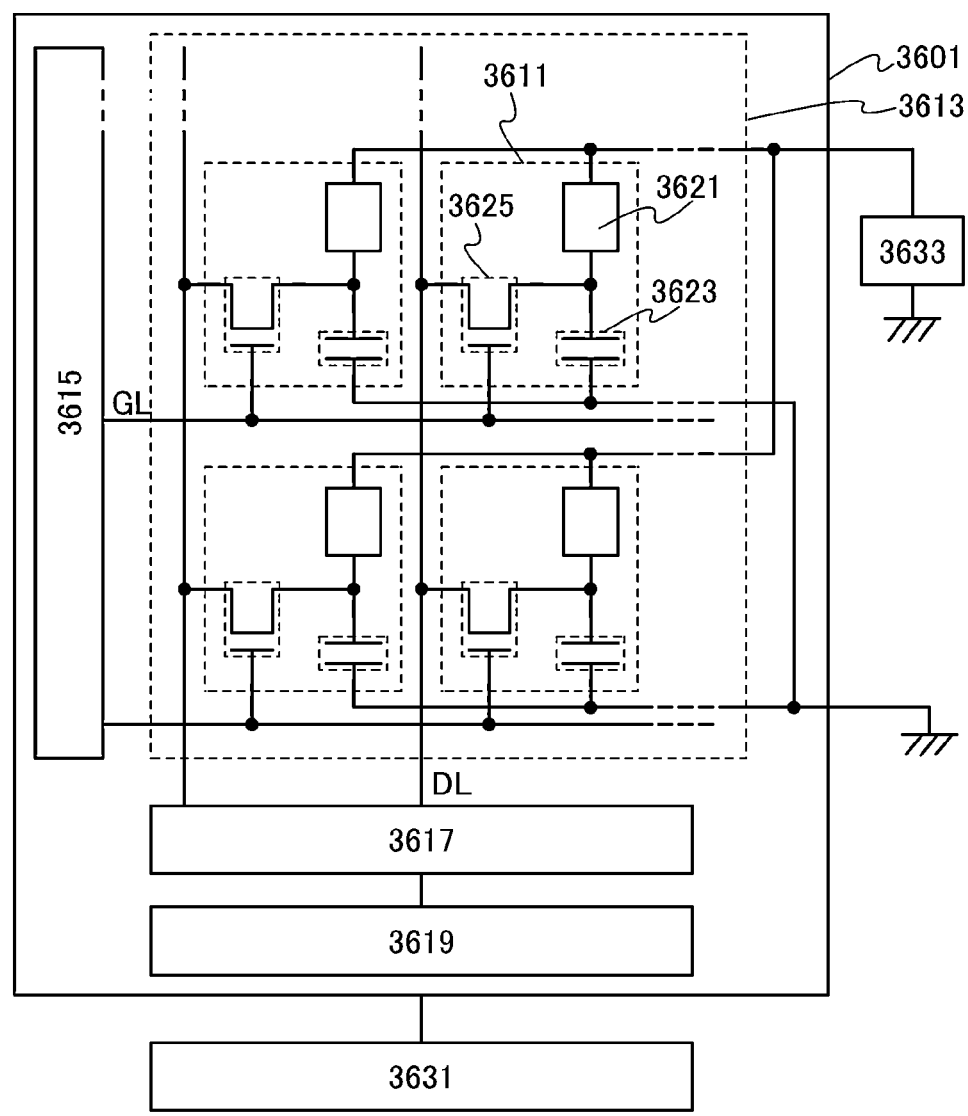

FIG. 31B is a block diagram of the radiation image detecting device 3601. The radiation image detecting device 3601 includes a sensor array 3613 in which pixels 3611 are arranged in a matrix, a gate line driver circuit 3615, a signal detection circuit 3617, and an A/D conversion circuit 3619. Note that the radiation image detecting device 3601 is controlled by a central processing unit (CPU), a read only memory (ROM), a random access memory (RAM), or the like which are not shown. Further, the radiation image detecting device 3601 may include a correction circuit for correcting data output from the A/D conversion circuit 3619, a memory device for storing data output from the A/D conversion circuit 3619, or the like.

Each pixel 3611 includes a radiation detecting element 3621, a capacitor 3623, and a transistor 3625. Energy of the radiation is converted into an electrical charge directly or indirectly in the radiation detecting element 3621, and further, the electrical charge is stored in the capacitor 3623. By switching of the transistor 3625, the electrical charge stored in the capacitor 3623 is read as an electric signal for each pixel 3611. Thus, a radiation image can be obtained in an output device 3631.

The radiation detecting element 3621 includes a pair of electrodes and a conversion layer provided between the pair of electrodes. One of the pair of electrodes is connected to a power supply device 3633. The other of the pair of electrodes is connected to a first electrode of the capacitor 3623 and one of a source electrode and a drain electrode of the transistor 3625. A second electrode of the capacitor 3623 is connected to a common electrode at a ground potential. The other of the source electrode and the drain electrode of the transistor 3625 is connected to the signal detection circuit 3617 through a signal line DL. A gate of the transistor 3625 is connected to the gate line driver circuit 3615 through a scan line GL.

Next, a method for detecting radiation is described. When radiation is incident on the radiation detecting element 3621 with voltage applied from the power supply device 3633 to the first electrode of the radiation detecting element 3621, energy of the radiation is converted into electrical charges in the radiation detecting element 3621. Electrical charges corresponding to the amount of incident radiation are stored in the capacitor 3623. Next, a signal is input to the scan line GL from the gate line driver circuit 3615 to turn on transistors 3625 sequentially. Thus, the electrical charges stored in the capacitor 3623 are output as an analog signal to the signal detection circuit 3617 through the signal line DL. After the analog signal is amplified in the signal detection circuit 3617, the analog signal is converted into a digital signal in the A/D conversion circuit 3619. The digital signal thus generated is output to the output device 3631 of a display device or the like, so that a radiation image is displayed in the output device 3631.

The radiation image detecting device 3601 and the output device 3631 can be connected with a cable. Alternatively, the radiation image detecting device 3601 and the output device 3631 may each be provided with a transmission/reception circuit, so that an image obtained by detection in the radiation image detecting device 3601 can be output to the output device 3631 wirelessly.

Radiation image detecting devices have direct and indirect conversion systems. In the radiation detecting element 3621 of the radiation image detecting device using a direct conversion system, energy of the radiation is directly converted into electrical charges with the use of a photoconductive substance. In the radiation detecting element 3621 of the radiation image detecting device using an indirect conversion system, energy of the radiation is converted to light with the use of a fluorescent member or the like, and the light is converted to electrical charges in a photoelectric conversion element such as a photodiode.

Next, a structure of each radiation detecting element is described with reference to FIGS. 32A and 32B.

Figure 32A:
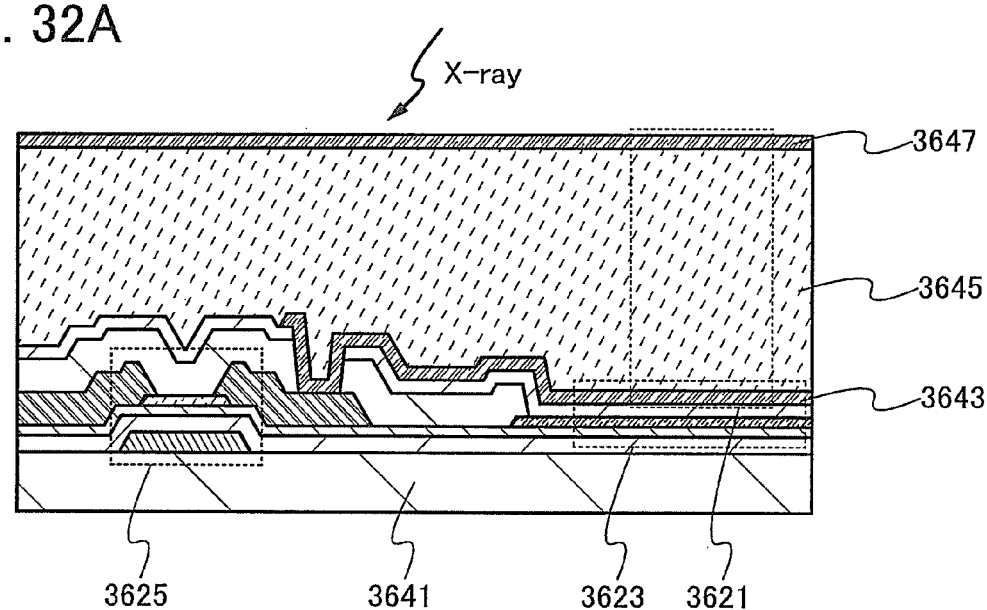
FIGS. 32A and 32B each illustrate a radiation detecting element.

FIG. 32A is a cross-sectional view of a pixel of the radiation image detecting device using a direct conversion system. Here, X-rays are used as the radiation.

The transistor 3625 and the capacitor 3623 whose structures are described in any of the above embodiments and the radiation detecting element 3621 are provided over a substrate 3641. The radiation detecting element 3621 includes a conductive film 3643, a conversion layer 3645, and a conductive film 3647. The conductive film 3643 is connected to one of the source electrode and the drain electrode of the transistor 3625 and serves as the electrode of the radiation detecting element 3621 and the electrode of the capacitor 3623.

The conductive film 3643 can be formed using a material similar to that of the light-transmitting conductive film serving as the pixel electrode described in any of the above embodiments, as appropriate.

The conversion layer 3645 is formed using a material which generates electrical charges by absorbing radiation. Examples of a material which can generate electrical charges by absorbing radiation include amorphous selenium, lead iodide, mercury iodine, gallium arsenide, CdTe, and CdZn.

The conductive film 3647 can be formed using a material similar to those of the gate electrode, the source electrode, and the drain electrode of the transistor 3625 and the conductive film 3643, as appropriate.

When radiation is incident on the radiation detecting element 3621 with voltage applied to the conductive film 3647, electrical charges (electrons and holes) are excited in the conversion layer 3645. The electrical charges are moved to the conductive film 3643 in accordance with the polarity of voltage applied to the conductive film 3647 and stored in the capacitor 3623.

In the radiation detecting element 3621 of the radiation image detecting device using a direct conversion system, since high voltage is applied to the conductive film 3647, electrical charges generated in the conversion layer 3645 can go straighter to the conductive film 3643 of the capacitor, which leads to reduction of the movement of electrical charges to a radiation detecting element in an adjacent pixel. Consequently, the radiation image detecting device can have a high resolution.

Figure 32B:
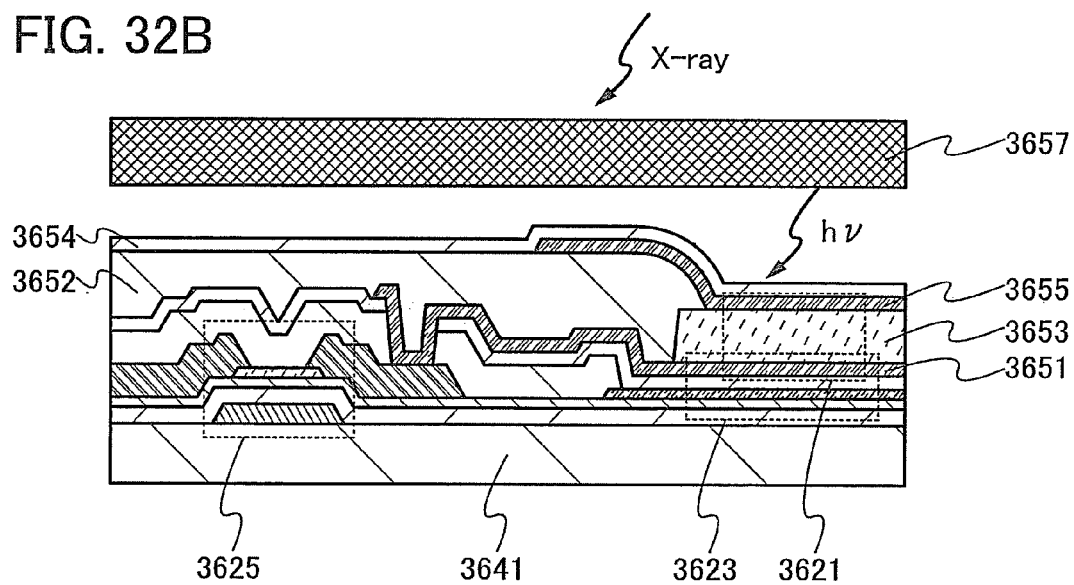

FIG. 32B is a cross-sectional view of a pixel of the radiation image detecting device using an indirect conversion system.

The transistor 3625 and the capacitor 3623 whose structures are described in any of the above embodiments and the radiation detecting element 3621 are provided over the substrate 3641. Further, a phosphor layer 3657 typified by a scintillator or the like is provided over the radiation detecting element 3621.

A photodiode including a conductive film 3651, a conversion layer 3653, and a conductive film 3655 can be used as the radiation detecting element 3621. The conductive film 3651 is connected to one of the source electrode and the drain electrode of the transistor 3625 and serves as the electrode of the radiation detecting element 3621 and the electrode of the capacitor 3623.

The conductive film 3651 can be formed using a material similar to that of the light-transmitting conductive film serving as the pixel electrode described in any of the above embodiments, as appropriate.

The conversion layer 3653 is formed using a material which generates electrical charges by absorbing light. Examples of a material which can generate electrical charges by absorbing light include an inorganic semiconductor material such as silicon and an organic compound such as quinacridone or phthalocyanine. Note that in the conversion layer 3653, a p-n junction or a p-i-n junction is preferably formed. Further, the conversion layer 3653 is preferably formed using amorphous silicon, in which case visible light emitted from the phosphor layer 3657 can be detected with high sensitivity.

The conductive film 3655 can be formed using a material similar to that of the conductive film 3643.

The phosphor layer 3657 is formed using a material which emits visible light by absorbing energy of incident radiation. Examples of a material capable of emitting visible light by absorbing radiation energy include cesium iodide, cesium iodide to which thallium is added, GOS ($Gd_2O_2S$:Tb), and sodium iodide to which thallium is added. Note that when the phosphor layer 3657 includes a columnar crystal grown in a direction connecting a radiation incident surface to a light emission surface, light generated in the phosphor layer 3657 can be inhibited from diffusing into a lateral direction. Consequently, the resolution of the radiation image detecting device can be improved.

Note that an insulating film 3652 is provided over the conductive film 3651 and the conversion layer 3653 to prevent electrical connection between the conductive film 3651 and the conductive film 3655. Further, an insulating film 3654 is provided over the conductive film 3655 and the insulating film 3652; thus, an impurity from the outside can be prevented from diffusing into the conversion layer 3653.

The phosphor layer 3657 emits visible light by absorbing incident radiation. When the visible light is incident on the conversion layer 3653 with voltage (reverse bias) applied to the conductive film 3655, electrical charges (electrons and holes) are excited in the conversion layer 3653. The electrical charges are moved to the conductive film 3651 and stored in the capacitor 3623.

In the radiation image detecting device using an indirect conversion system, the radiation detecting element 3621 detects visible light converted in the phosphor layer 3657. Hence, voltage applied to the conductive film 3655 of the radiation detecting element 3621 can be reduced.

Note that although the description of this embodiment is made using the radiation image detecting device 3601 provided in the table 3603, a detachable radiation image detecting device which is called a cassette can be used as appropriate.

Note that the structure and the like described in this embodiment can be used as appropriate in combination with any of the structures and the like in the other embodiments.

EXAMPLE

In this example, evaluation was performed on breakdown voltages of interlayer films whose structures are made different and each of which are provided between a conductive layer formed in the same step as a gate electrode (the conductive layer is hereinafter referred to as a first conductive layer) and a conductive layer formed in the same step as a source electrode and a drain electrode (the conductive layer is hereinafter referred to as a second conductive layer).

First, a test element group (TEG) pattern for evaluation which was used in this example is described with reference to FIGS. 33A and 33B.

Figure 33A:
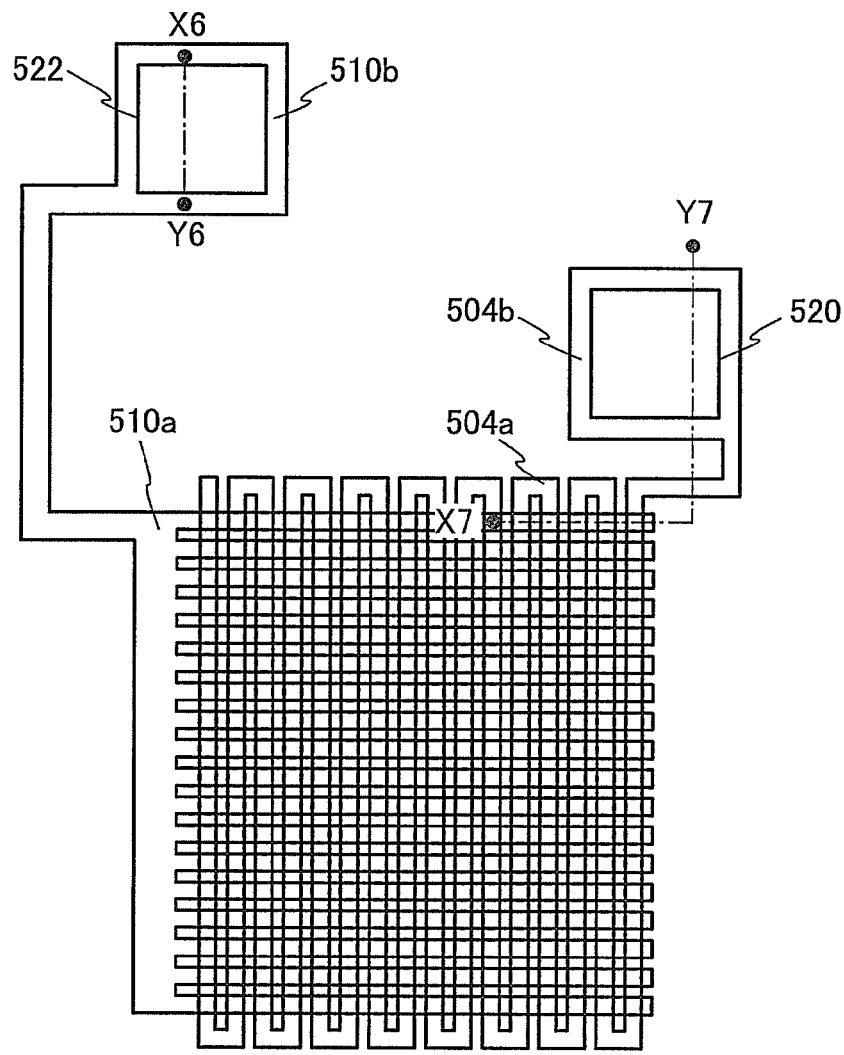
FIGS. 33A and 33B are a top view and a cross-sectional view of a TEG used in Example.
Figure 33B:
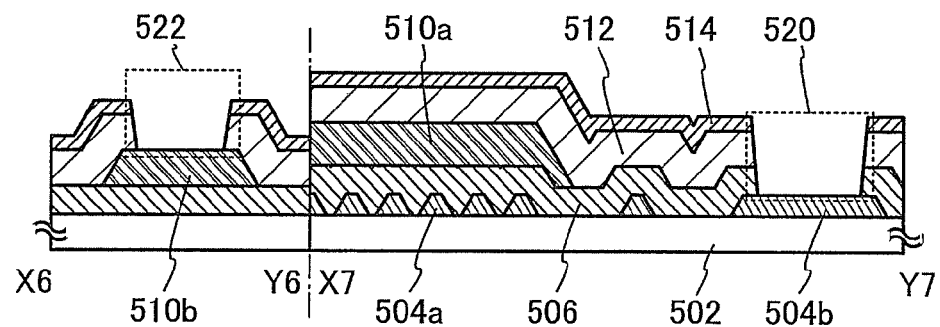

FIG. 33A is a top view of a TEG for evaluation. FIG. 33B is a cross-sectional view corresponding to section planes taken along dashed-dotted lines X6-Y6 and X7-Y7 in FIG. 33A.

The TEG for evaluation of this example includes a first conductive layer 504a formed over a substrate 502, an interlayer film 506 formed over the first conductive layer 504a, a second conductive layer 510a formed over the interlayer film 506, an insulating layer 512 formed over the second conductive layer 510a, and an insulating layer 514 formed over the insulating layer 512.

The TEG for evaluation further includes a first measurement pad 504b connected to the first conductive layer 504a, and a second measurement pad 510b connected to the second conductive layer 510a. The first measurement pad 504b includes an opening portion 520 in which parts of the interlayer film 506 and the insulating layers 512 and 514 over the first measurement pad 504b are removed. The second measurement pad 510b includes an opening portion 522 in which parts of the insulating layers 512 and 514 over the second measurement pad 510b are removed. Voltage is applied to the first measurement pad 504b and the second measurement pad 510b; in this manner, breakdown voltage of the interlayer film 506 between the conductive layers 504a and 510a can be measured.

Note that a region where the first conductive layer 504a intersects with the second conductive layer 510a had a size of 10 μm×10 μm. A picoammeter manufactured by Keithley Instruments, Inc. (Model 6487) was used for a measurement device. As measurement conditions, voltage was increased from 0 V to +500 V in increments of 10 V.

Here, in this example, Sample 1 and Sample 2, which have different materials of the interlayer film 506, are fabricated.

(Sample 1)

The interlayer film 506 of Sample 1 had a stacked-layer structure of two layers including a silicon nitride film and a silicon oxynitride film.

(Sample 2)

The interlayer film 506 of Sample 2 had a stacked-layer structure of four layers including a silicon nitride film, a silicon oxynitride film, an oxide semiconductor film, and an oxide film.

That is, Sample 2 was formed in such a manner that the oxide semiconductor film and the oxide film are further stacked in Sample 1. The formation conditions of the films in Sample 1 and Sample 2 are described below.

(Silicon Nitride Film)

As the silicon nitride film, three layers of silicon nitride films were stacked under different conditions. The formation conditions of a first silicon nitride film were as follows: the electric power (RF)=2000 W; the pressure=100 Pa; $SiH_4$/$N_2$/$NH_3$=200/2000/100 sccm; and the film thickness=50 nm. The formation conditions of a second silicon nitride film were as follows: the electric power (RF)=2000 W; the pressure=100 Pa; $SiH_4$/$N_2$/$NH_3$=200/2000/2000 sccm; and the film thickness=300 nm. The formation conditions of a third silicon nitride film were as follows: the electric power (RF)=2000 W; the pressure=100 Pa; $SiH_4$/$N_2$=200/5000 sccm; and the film thickness=50 nm. Note that all of the first to the third silicon nitride films were formed at a substrate temperature of 350° C. using a PE-CVD apparatus.

(Silicon Oxynitride Film)

The formation conditions of the silicon oxynitride film were as follows: the electric power (RF)=100 W; the pressure=100 Pa; $SiH_4$/$N_2O$=20/3000 sccm; and the film thickness=50 nm. Note that the silicon oxynitride film was formed at a substrate temperature of 350° C. using a PE-CVD apparatus.

(Oxide Semiconductor Film)

The oxide semiconductor film was formed by a sputtering method using a target with a composition where In:Ga:Zn=1:1:1. The formation conditions of the oxide semiconductor film were as follows: the electric power (AC)=5 kW; the pressure=0.6 Pa; Ar/$O_2$=100/100 sccm ($O_2$=50%); the substrate temperature=170° C.; and the film thickness=35 nm.

(Oxide Film)

The oxide film was formed by a sputtering method using a target with a composition where In:Ga:Zn=1:3:2. The formation conditions of the oxide film were as follows: the electric power (AC)=5 kW; the pressure=0.6 Pa; Ar/O$_2$=270/30 sccm (O$_2$=10%); the substrate temperature=170° C.; and the film thickness=20 nm.

Note that before the insulating layer 512 was formed, each of Samples 1 and 2 was subjected to heat treatment at 450° C. under a nitrogen atmosphere for one hour and then subjected to heat treatment at 450° C. under a mixed atmosphere of nitrogen and oxygen for one hour.

Figure 34:
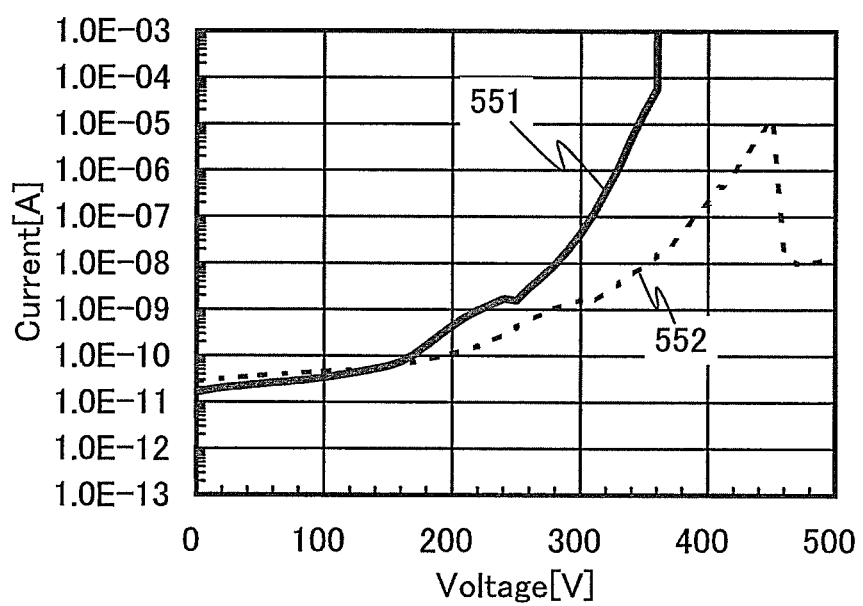
FIG. 34 is a graph illustrating a breakdown voltage of each sample used in Example.

FIG. 34 is a graph showing breakdown voltages of the interlayer films 506 of Sample 1 and Sample 2. Note that in FIG. 34, the horizontal axis indicates voltage and the vertical axis indicates current. In FIG. 34, a solid line 551 represents the measurement result of Sample 1 and a dashed line 552 represents the measurement result of Sample 2.

It is assumed that the interlayer film 506 in each of Samples 1 and 2 was broken when current of higher than or equal to $1.0 \times 10^{-6}$ A flowed, for example. In that case, the interlayer film 506 in Sample 1 is broken at approximately 330 V. Further, the interlayer film 506 in Sample 2 is broken at approximately 420 V.

As described in this example, it was confirmed that the breakdown voltage varied by changing the structure of the interlayer film between the first conductive layer 504*a* and the second conductive layer 510*a* or the distance between the first conductive layer 504*a* and the second conductive layer 510*a*.

Explanation Of Reference

100: display device, 102: pixel portion, 104: driver circuit portion, 104*a*: gate driver, 104*b*: source driver, 106: protection circuit, 107: terminal portion, 108: pixel circuit portion, 110: wiring, 111: pixel circuit, 112: transistor, 114: transistor, 116: wiring, 118: wiring, 120: wiring, 122: wiring, 124: wiring, 126: wiring, 128: transistor, 130: transistor, 131_1: transistor, 131_2: transistor, 131_3: transistor, 132: transistor, 133_1: capacitor, 133_2: capacitor, 134: transistor, 135: light-emitting element, 206: protection circuit, 208: wiring, 212: transistor, 214: transistor, 216: transistor, 218: transistor, 220: transistor group, 222: transistor group, 224: wiring, 226: wiring, 302: substrate, 304*a*: conductive layer, 304*b*: conductive layer, 304*c*: conductive layer, 304*d*: conductive layer, 304*e*: conductive layer, 305: insulating layer, 306: insulating layer, 307: semiconductor layer, 308*a*: semiconductor layer, 308*b*: semiconductor layer, 308*c*: semiconductor layer, 308*d*: semiconductor layer, 309: conductive layer, 310*a*: conductive layer, 310*b*: conductive layer, 310*c*: conductive layer, 310*d*: conductive layer, 310*e*: conductive layer, 310*f*: conductive layer, 310*g*: conductive layer, 311: insulating layer, 312: insulating layer, 313: insulating layer, 314: insulating layer, 315: conductive layer, 316*a*: conductive layer, 316*b*: conductive layer, 316*c*: conductive layer, 318: alignment film, 320: liquid crystal layer, 322: liquid crystal element, 342: substrate, 344: light-shielding layer, 346: coloring layer, 348: insulating layer, 350: conductive layer, 352: alignment film, 360: induced electrostatic breakdown region, 362: guard ring, 362*a*: induced electrostatic breakdown region, 370: insulating layer, 372*a*: opening portion, 372*b*: opening portion, 374*a*: opening portion, 374*b*: opening portion, 374*c*: opening portion, 374*d*: opening portion, 374*e*: opening portion, 380: region, 382: region, 390: oxide stack, 390*a*: oxide semiconductor layer, 390*b*: oxide layer, 392: n-type region, 402: substrate, 404: conductive layer, 405: insulating layer, 406: insulating layer, 410: conductive layer, 412: insulating layer, 414: insulating layer, 416: conductive layer, 474*a*: opening portion, 474*b*: opening portion, 502: substrate, 504*a*: conductive layer, 504*b*: measurement pad, 506: interlayer film, 510*a*: conductive layer, 510*b*: measurement pad, 512: insulating layer, 514: insulating layer, 520: opening portion, 522: opening portion, 551: solid line, 552: dashed line, 3601: radiation image detecting device, 3603: table, 3605: radiation source, 3607: radiation, 3609: subject, 3611: pixel, 3613: sensor array, 3615: gate line driver circuit, 3617: signal detection circuit, 3619: A/D conversion circuit, 3621: radiation detecting element, 3623: capacitor, 3625: transistor, 3631: output device, 3633: power supply device, 3641: substrate, 3643: conductive film, 3645: conversion layer, 3647: conductive film, 3651: conductive film, 3652: insulating film, 3653: conversion layer, 3654: insulating film, 3655: conductive film, 3657: phosphor layer, 4500: touch sensor, 4510: conductive layer, 4510*a*: conductive layer, 4510*b*: conductive layer, 4510*c*: conductive layer, 4520: conductive layer, 4540: capacitor, 4710: electrode, 4810: insulating layer, 4820: insulating layer, 4910: substrate, 4920: substrate, 5000: housing, 5001: display portion, 5002: display portion, 5003: speaker, 5004: LED lamp, 5005: operation keys, 5006: connection terminal, 5007: sensor, 5008: microphone, 5009: switch, 5010: infrared port, 5011: memory medium reading portion, 5012: support, 5013: earphone, 5014: antenna, 5015: shutter button, 5016: image reception portion, 5017: charger, 5018: supporting board, 5019: external connection port, 5020: pointing device, 5021: reader/writer, 5022: housing, 5023: display portion, 5024: remote controller, 5025: speaker, 5026: display module, 5027: prefabricated bath, 5028: display module, 5029: body, 5030: ceiling, 5031: display module, 5032: hinge portion, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, 8011: battery.

This application is based on Japanese Patent Application serial no. 2013-034877 filed with Japan Patent Office on Feb. 25, 2013, and Japanese Patent Application serial no. 2013-154400 filed with Japan Patent Office on Jul. 25, 2013, the entire contents of which are hereby incorporated by reference.

The invention claimed is:

1. A display device comprising:
    a pixel portion comprising a pixel electrode and a transistor; and
    a driver circuit portion comprising a first region and a second region,
    wherein the transistor comprises a first semiconductor layer and an insulating layer on the first semiconductor layer,
    wherein the first region comprises a first wiring and a second wiring intersecting with the first wiring,
    wherein the second region comprises a third wiring and a fourth wiring intersecting with the third wiring,
    wherein the second region further comprises a second semiconductor layer and the insulating layer,
    wherein the first wiring and the third wiring are provided in the same layer as a gate electrode of the transistor,
    wherein the second semiconductor layer is provided in the same layer as the first semiconductor layer,
    wherein the insulating layer is between the first wiring and the second wiring in the first region,
    wherein the insulating layer and the second semiconductor layer are between the third wiring and the fourth wiring in the second region, and
    wherein the first wiring has a comb-like shape.

2. The display device according to claim 1, wherein the first semiconductor layer is an oxide semiconductor layer.

3. The display device according to claim 2, wherein the oxide semiconductor layer comprises indium and zinc.

4. The display device according to claim 2,
wherein the oxide semiconductor layer comprises a crystal, and
wherein a c-axis of the crystal is aligned in a direction parallel to a normal vector of a surface of the oxide semiconductor layer.

5. The display device according to claim 2, wherein the oxide semiconductor layer comprises a nanocrystal.

6. The display device according to claim 1,
wherein the driver circuit portion further comprises a third region,
wherein the third region comprises a fifth wiring and a sixth wiring electrically connected to the fifth wiring through a seventh wiring,
wherein the fifth wiring is provided in the same layer as the gate electrode of the transistor,
wherein the sixth wiring is provided in the same layer as a source electrode and a drain electrode of the transistor, and
wherein the seventh wiring is provided in the same layer as the pixel electrode.

7. An electronic device comprising the display device according to claim 1.

8. A display device comprising:
a pixel portion comprising a pixel electrode and a transistor; and
a driver circuit portion comprising a first region and a second region,
wherein the transistor comprises a first oxide semiconductor layer and an insulating layer on the first oxide semiconductor layer,
wherein the first region comprises a first wiring and a second wiring intersecting with the first wiring,
wherein the second region comprises a third wiring and a fourth wiring intersecting with the third wiring,
wherein the second region further comprises a second oxide semiconductor layer and the insulating layer,
wherein the first wiring and the third wiring are provided in the same layer as a gate electrode of the transistor,
wherein the second wiring and the fourth wiring are provided in the same layer as a source electrode and a drain electrode of the transistor,
wherein the second oxide semiconductor layer is provided in the same layer as the first oxide semiconductor layer,
wherein the insulating layer is between the first wiring and the second wiring in the first region,
wherein the insulating layer and the second oxide semiconductor layer are between the third wiring and the fourth wiring in the second region, and
wherein the first wiring has a comb-like shape.

9. The display device according to claim 8, wherein the first oxide semiconductor layer comprises indium and zinc.

10. The display device according to claim 8,
wherein the first oxide semiconductor layer comprises a crystal, and
wherein a c-axis of the crystal is aligned in a direction parallel to a normal vector of a surface of the first oxide semiconductor layer.

11. The display device according to claim 8,
wherein the driver circuit portion further comprises a third region,
wherein the third region comprises a fifth wiring and a sixth wiring electrically connected to the fifth wiring through a seventh wiring,
wherein the fifth wiring is provided in the same layer as the gate electrode of the transistor,
wherein the sixth wiring is provided in the same layer as the source electrode and the drain electrode, and
wherein the seventh wiring is provided in the same layer as the pixel electrode.

12. An electronic device comprising the display device according to claim 8.

13. The display device according to claim 8, wherein the first oxide semiconductor layer comprises a nanocrystal.

14. A display device comprising:
a pixel portion comprising a pixel electrode and a transistor; and
a driver circuit portion comprising a first region, a second region, and a third region,
wherein the transistor comprises a first semiconductor layer and an insulating layer on the first semiconductor layer,
wherein the first region comprises a first wiring and a second wiring intersecting with the first wiring,
wherein the second region comprises a third wiring and a fourth wiring intersecting with the third wiring,
wherein the second region further comprises a second semiconductor layer and the insulating layer,
wherein the first wiring and the third wiring are provided in the same layer as a gate electrode of the transistor,
wherein the second semiconductor layer is provided in the same layer as the first semiconductor layer,
wherein the insulating layer is between the first wiring and the second wiring in the first region,
wherein the insulating layer and the second semiconductor layer are between the third wiring and the fourth wiring in the second region,
wherein the third region comprises a fifth wiring and a sixth wiring electrically connected to the fifth wiring through a seventh wiring,
wherein the fifth wiring is provided in the same layer as the gate electrode of the transistor,
wherein the sixth wiring is provided in the same layer as a source electrode and a drain electrode of the transistor, and
wherein the seventh wiring is provided in the same layer as the pixel electrode.

15. The display device according to claim 14, wherein the first semiconductor layer is an oxide semiconductor layer.

16. The display device according to claim 15, wherein the oxide semiconductor layer comprises indium and zinc.

17. The display device according to claim 15,
wherein the oxide semiconductor layer comprises a crystal, and
wherein a c-axis of the crystal is aligned in a direction parallel to a normal vector of a surface of the oxide semiconductor layer.

18. The display device according to claim 15, wherein the oxide semiconductor layer comprises a nanocrystal.

19. An electronic device comprising the display device according to claim 14.

20. A display device comprising:
a pixel portion comprising a pixel electrode and a transistor; and
a driver circuit portion comprising a first region, a second region, and a third region,
wherein the transistor comprises a first oxide semiconductor layer and an insulating layer on the first oxide semiconductor layer,
wherein the first region comprises a first wiring and a second wiring intersecting with the first wiring,
wherein the second region comprises a third wiring and a fourth wiring intersecting with the third wiring, wherein the second region further comprises a second oxide semiconductor layer and the insulating layer, wherein the first wiring and the third wiring are provided in the same layer as a gate electrode of the transistor, wherein the second wiring and the fourth wiring are provided in the same layer as a source electrode and a drain electrode of the transistor, wherein the second oxide semiconductor layer is provided in the same layer as the first oxide semiconductor layer, wherein the insulating layer is between the first wiring and the second wiring in the first region, wherein the insulating layer and the second oxide semiconductor layer are between the third wiring and the fourth wiring in the second region, wherein the third region comprises a fifth wiring and a sixth wiring electrically connected to the fifth wiring through a seventh wiring, wherein the fifth wiring is provided in the same layer as the gate electrode of the transistor, wherein the sixth wiring is provided in the same layer as the source electrode and the drain electrode, and wherein the seventh wiring is provided in the same layer as the pixel electrode.

21. The display device according to claim 20, wherein the first oxide semiconductor layer comprises indium and zinc.

22. The display device according to claim 20, wherein the first oxide semiconductor layer comprises a crystal, and wherein a c-axis of the crystal is aligned in a direction parallel to a normal vector of a surface of the first oxide semiconductor layer.

23. An electronic device comprising the display device according to claim 22.

24. The display device according to claim 20, wherein the first oxide semiconductor layer comprises a nanocrystal.

* * * * *